(12) United States Patent
Michinaga et al.

(10) Patent No.: US 9,404,976 B2
(45) Date of Patent: Aug. 2, 2016

(54) ENERGY STORAGE UNIT CONNECTION INFORMATION ACQUIRING APPARATUS

(71) Applicant: GS Yuasa International Ltd., Kyoto-shi (JP)

(72) Inventors: Katsuhisa Michinaga, Kyoto (JP); Takumi Kimura, Kyoto (JP); Shigenori Kikuta, Kyoto (JP); Kazuo Kawarabayashi, Kyoto (JP); Nasa Tomozoe, Kyoto (JP)

(73) Assignee: GS YUASA INTERNATIONAL LTD., Kyoto-shi, Kyoto (JP)

( * ) Notice: Subject to any disclaimer, the term of this patent is extended or adjusted under 35 U.S.C. 154(b) by 369 days.

(21) Appl. No.: 14/161,287

(22) Filed: Jan. 22, 2014

(65) Prior Publication Data

US 2014/0203812 A1 Jul. 24, 2014

(30) Foreign Application Priority Data

Jan. 22, 2013 (JP) .................................. 2013-009596
Jan. 22, 2013 (JP) .................................. 2013-009597
Jan. 9, 2014 (JP) .................................. 2014-002762

(51) Int. Cl.
*H01M 10/46* (2006.01)
*G01R 31/36* (2006.01)
*H01M 10/44* (2006.01)
*H01M 10/48* (2006.01)

(52) U.S. Cl.
CPC ......... *G01R 31/3627* (2013.01); *H01M 10/441* (2013.01); *H01M 10/482* (2013.01)

(58) Field of Classification Search
CPC ..... H02J 7/0008; H02J 7/0013; H02J 7/1423; H02J 7/0019; H02J 7/0021; H02J 7/0026
USPC .............. 320/107, 116, 117, 121, 132
See application file for complete search history.

(56) References Cited

U.S. PATENT DOCUMENTS 6,337,555 B1 * 1/2002 Oh ....................... H01M 10/441
320/107
7,088,065 B2 8/2006 Ishikawa et al.
2004/0159480 A1 8/2004 Ishikawa et al.
(Continued)

FOREIGN PATENT DOCUMENTS

JP 2004-248432 A 9/2004
JP 2005-192299 A 7/2005
(Continued)

*Primary Examiner* — Edward Tso
(74) *Attorney, Agent, or Firm* — McGinn IP Law Group, PLLC

(57) ABSTRACT

An energy storage unit connection information acquiring apparatus that acquires information for connecting a plurality of energy storage units in parallel, each energy storage unit including one or more energy storage elements connected in series, the connection information acquiring apparatus including: a connectable range acquiring unit that acquires a connectable range by determining the connectable range that is a range of energy storage units that can be connected in parallel among the plurality of energy storage units; and a charge/discharge information acquiring unit that acquires information for charging or discharging a connected energy storage unit group such that at least one energy storage unit outside the connectable range can be connected in parallel to the connected energy storage unit group that is composed of the energy storage units in the connectable range that are connected in parallel.

19 Claims, 39 Drawing Sheets

(56) References Cited

U.S. PATENT DOCUMENTS

| | | | |
|---|---|---|---|
| 2008/0247201 A1* | 10/2008 | Perol | B64G 1/443 |
| | | | 136/244 |
| 2008/0278114 A1* | 11/2008 | Maegawa | H01M 10/4207 |
| | | | 320/128 |
| 2008/0315835 A1* | 12/2008 | Okumura | H01M 10/482 |
| | | | 320/116 |
| 2009/0295227 A1* | 12/2009 | Chang | H02J 3/32 |
| | | | 307/46 |
| 2011/0074354 A1 | 3/2011 | Yano | |
| 2011/0148361 A1* | 6/2011 | Yokotani | H01M 10/482 |
| | | | 320/136 |
| 2012/0223677 A1 | 9/2012 | Yamauchi et al. | |

FOREIGN PATENT DOCUMENTS

| | | |
|---|---|---|
| JP | 2009-033936 A | 2/2009 |
| JP | 2010-220280 A | 9/2010 |
| JP | 2010-252566 A | 11/2010 |
| JP | 2011-072153 A | 4/2011 |
| JP | 2012-085461 A | 4/2012 |
| JP | 2012-167978 A | 9/2012 |
| JP | 2012-182911 A | 9/2012 |
| JP | 2012-185991 A | 9/2012 |
| JP | 5017009 B2 | 9/2012 |
| WO | WO2010/103816 A1 | 9/2010 |

* cited by examiner (a)

| | 441 |
|---|---|
| First tolerance value | A |
| Second tolerance value | B |
| Third tolerance value | C |

FIG. 22

| | 442 |
|---|---|
| Connectable range | P |
| Target SOC | Q |
| Amount of charge | R |
| ⋮ | ⋮ |

ENERGY STORAGE UNIT CONNECTION INFORMATION ACQUIRING APPARATUS

CROSS-REFERENCE TO RELATED APPLICATIONS

The present application is based on and claims priority of Japanese Patent Application No. 2013-9596 filed on Jan. 22, 2013 Japanese Patent Application No. 2013-9597 filed on Jan. 22, 2013, and Japanese Patent Application No. 2014-2762 filed on Jan. 9, 2014. The entire disclosure of the above-identified application, including the specification, drawings and claims is incorporated herein by reference in its entirety.

FIELD

The present invention relates to an energy storage unit connection information acquiring apparatus that acquires information for connecting a plurality of energy storage units in parallel, each energy storage unit including one or more energy storage elements connected in series.

BACKGROUND

Energy storage elements such as lithium ion secondary batteries are used as power sources for mobile devices such as notebook computers and mobile phones. In recent years, they have come to be used as power sources for industrial applications such as rail vehicles and industrial machines. In such power sources for industrial applications, a plurality of energy storage units, each including a plurality of energy storage elements connected in series, are connected in parallel so as to achieve a high capacity.

In this case, capacity imbalance occurs among the plurality of energy storage units, and it is therefore important to eliminate the capacity imbalance. For this reason, conventionally, a technique has been proposed for eliminating the capacity imbalance among a plurality of energy storage units connected in parallel by performing control so as to uniform the remaining capacity of the plurality of energy storage units (see, for example, Japanese Unexamined Patent Application Publication No. 2011-72153).

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

It is an object of the present invention to provide an energy storage unit connection information acquiring apparatus that can prevent an excessive amount of cross current from flowing when a plurality of energy storage units that are connected in parallel.

In order to achieve the above object, an energy storage unit connection information acquiring apparatus according to one aspect of the present invention is an energy storage unit connection information acquiring apparatus that acquires information for connecting a plurality of energy storage units in parallel, each energy storage unit including one or more energy storage elements connected in series, the connection information acquiring apparatus including: a connectable range acquiring unit configured to acquire a connectable range by determining the connectable range, the connectable range being a range of energy storage units that can be connected in parallel among the plurality of energy storage units; and a charge/discharge information acquiring unit configured to acquire information for charging or discharging a connected energy storage unit group such that at least one energy storage unit outside the connectable range can be connected in parallel to the connected energy storage unit group, the connected energy storage unit group being composed of the energy storage units in the connectable range that are connected in parallel.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 21 is a diagram showing an example of tolerance value data stored in a memory unit according to Embodiment 2 of the present invention.

FIG. 22 is a diagram showing an example of connection information data stored in the memory unit according to Embodiment 2 of the present invention.

DESCRIPTION OF EMBODIMENTS

Figure 1:
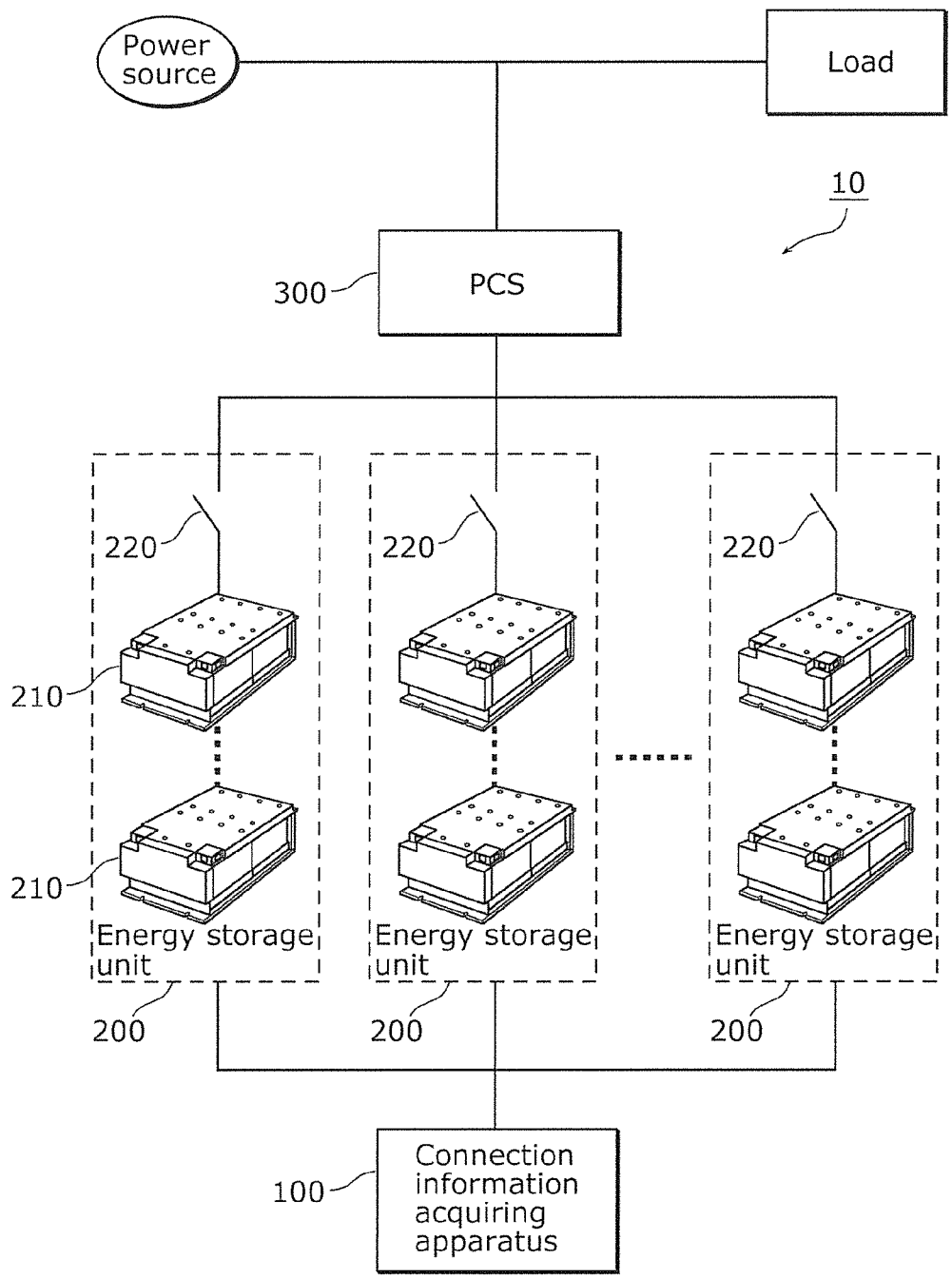
FIG. 1 is a diagram showing a configuration of an energy storage system including a connection information acquiring apparatus according to Embodiment 1 of the present invention.

The conventional technique described above is problematic in that when a plurality of energy storage units are connected in parallel, a current (cross current) flows through the energy storage units, which affects energy storage elements.

That is, when energy storage units having different charged states are connected in parallel, a cross current flows through the energy storage units. If the cross current is large, the energy storage elements included in the energy storage units deteriorate. Also, the above-described conventional technique is designed to eliminate the capacity imbalance among a plurality of energy storage units that have been connected in parallel, and not to prevent a cross current that occurs when a plurality of energy storage units are connected in parallel.

The present invention has been made to solve the problem described above, and it is an object of the present invention to provide an energy storage unit connection information acquiring apparatus that can prevent an excessive amount of cross current from flowing when a plurality of energy storage units are connected in parallel.

In order to achieve the above object, an energy storage unit connection information acquiring apparatus according to one aspect of the present invention is an energy storage unit connection information acquiring apparatus that acquires information for connecting a plurality of energy storage units in parallel, each energy storage unit including one or more energy storage elements connected in series, the connection information acquiring apparatus including: a connectable range acquiring unit configured to acquire a connectable range by determining the connectable range, the connectable range being a range of energy storage units that can be connected in parallel among the plurality of energy storage units; and a charge/discharge information acquiring unit configured to acquire information for charging or discharging a connected energy storage unit group such that at least one energy storage unit outside the connectable range can be connected in parallel to the connected energy storage unit group, the connected energy storage unit group being composed of the energy storage units in the connectable range that are connected in parallel.

With this configuration, the connection information acquiring apparatus acquires information for charging or discharging the connected energy storage unit group such that the energy storage units outside the connectable range can be connected in parallel to the connected energy storage unit group in the acquired connectable range by determining and acquiring the connectable range of energy storage units. With this configuration, after the connected energy storage unit group has been charged or discharged by using the information, the connected energy storage unit group is connected in parallel to the energy storage units outside the connectable range, whereby it is possible to prevent an excessive amount of cross current from flowing when the plurality of energy storage units are connected in parallel.

Also, the charge/discharge information acquiring unit may be configured to: when the energy storage units included in the connected energy storage unit group have a voltage lower than a voltage of the at least one energy storage unit outside the connectable range, acquire information for charging the connected energy storage unit group such that the at least one energy storage unit outside the connectable range can be connected in parallel to the connected energy storage unit group; and when the energy storage units included in the connected energy storage unit group have a voltage higher than the voltage of the at least one energy storage unit outside the connectable range, acquire information for discharging the connected energy storage unit group such that the at least one energy storage unit outside the connectable range can be connected in parallel to the connected energy storage unit group.

With this configuration, the charge/discharge information acquiring unit makes a comparison between the voltage of the connected energy storage unit group and the voltage of the energy storage units outside the connectable range so as to acquire information for charging or discharging the connected energy storage unit group, whereby it is possible to acquire information appropriate to prevent an excessive amount of cross current from flowing.

Also, the connectable range acquiring unit may be configured to acquire, as the connectable range, a range of energy storage units that can be connected in parallel and includes a lowest voltage energy storage unit that is an energy storage unit having a lowest voltage among the plurality of energy storage units, and the charge/discharge information acquiring unit is configured to acquire information for charging the connected energy storage unit group such that the at least one energy storage unit outside the connectable range can be connected in parallel to the connected energy storage unit group.

With this configuration, the connection information acquiring apparatus acquires a range of energy storage units that can be connected in parallel and includes the lowest voltage energy storage unit as the connectable range, and acquires information for charging the connected energy storage unit group, and thus a plurality of energy storage units can be connected in parallel without discharging the energy storage units.

Also, the connectable range acquiring unit may include: a tolerance value determining unit configured to determine whether or not a potential difference between a first highest voltage energy storage unit and the lowest voltage energy storage unit is less than or equal to a first tolerance value, the first highest voltage energy storage unit being an energy storage unit having a highest voltage among the plurality of energy storage units; and a connectable range determining unit configured to, when it is determined that the potential difference between the first highest voltage energy storage unit and the lowest voltage energy storage unit is less than or equal to the first tolerance value, determine the plurality of energy storage units as the connectable range.

That is, in the plurality of energy storage units, the largest cross current flows when the first highest voltage energy storage unit, which is an energy storage unit having the highest voltage and the lowest voltage energy storage unit, which is an energy storage unit having the lowest voltage, are connected. For this reason, if it is determined that the potential difference between the first highest voltage energy storage unit and the lowest voltage energy storage unit in the plurality of energy storage units is less than or equal to the first tolerance value, the connectable range acquiring unit determines the plurality of energy storage units as the connectable range. The connectable range acquiring unit can thereby acquire the connectable range with ease.

Also, the tolerance value determining unit may be configured to, when it determines that the potential difference between the first highest voltage energy storage unit and the lowest voltage energy storage unit is greater than the first tolerance value, determine whether or not a potential difference between a second highest voltage energy storage unit and the lowest voltage energy storage unit is less than or equal to the first tolerance value, the second highest voltage energy storage unit being an energy storage unit having the highest voltage in a first low voltage energy storage unit group, and the first low voltage energy storage unit group being composed of energy storage units other than the first highest voltage energy storage unit in the plurality of energy storage units, the connectable range determining unit may be configured to, when it is determined that the potential difference between the second highest voltage energy storage unit and the lowest voltage energy storage unit is less than or equal to the first tolerance value, determine the first low voltage energy storage unit group as the connectable range, and the tolerance value determining unit may be configured to, when it determines that the potential difference between the second highest voltage energy storage unit and the lowest voltage energy storage unit is greater than the first tolerance value, update the first low voltage energy storage unit group by defining a second low voltage energy storage unit group as the first low voltage energy storage unit group, update the second highest voltage energy storage unit with an energy storage unit having the highest voltage in the first low voltage energy storage unit group, and determine whether or not the potential difference between the second highest voltage energy storage unit and the lowest voltage energy storage unit is less than or equal to the first tolerance value, the second low voltage energy storage unit group being composed of energy storage units other than the second highest voltage energy storage unit in the first low voltage energy storage unit group.

That is, in the first low voltage energy storage unit group, the largest cross current flows when the second highest voltage energy storage unit, which is an energy storage unit having the highest voltage, and the lowest voltage energy storage unit, which is an energy storage unit having the lowest voltage, are connected. For this reason, the connectable range acquiring unit can acquire the connectable range by determining the first low voltage energy storage unit group as the connectable range if it is determined that the potential difference between the second highest voltage energy storage unit and the lowest voltage energy storage unit is less than or equal to the first tolerance value. Also, if it is determined that the potential difference is greater than the first tolerance value, the connectable range acquiring unit updates the first low voltage energy storage unit group and the second highest voltage energy storage unit with an energy storage unit group and an energy storage unit that are next subjected to determination, and then makes a determination in the same manner as described above. The connectable range acquiring unit can thereby determine and acquire the connectable range with ease.

Also, the charge/discharge information acquiring unit may be configured to acquire information for charging the connected energy storage unit group such that the voltage of the connected energy storage unit group falls within a voltage range allowed for parallel connection of an outlying lowest voltage energy storage unit to the connected energy storage unit group, the outlying lowest voltage energy storage unit being an energy storage unit having the lowest voltage among the at least one energy storage unit outside the connectable range.

With this configuration, the charge/discharge information acquiring unit acquires information for charging the connected energy storage unit group such that the voltage of the connected energy storage unit group falls within the voltage range allowed for parallel connection of the outlying lowest voltage energy storage unit to the connected energy storage unit group. Accordingly, by connecting the outlying lowest voltage energy storage unit in parallel to the connected energy storage unit group after the connected energy storage unit group has been charged by using the information, it is possible to prevent an excessive amount of cross current from flowing when the connection is made.

Also, the charge/discharge information acquiring unit may include: a target SOC calculation unit configured to acquire a state of charge (SOC) of the connected energy storage unit group and an SOC of the outlying lowest voltage energy storage unit, and calculate a target SOC such that the target SOC is less than or equal to the SOC of the outlying lowest voltage energy storage unit and is greater than or equal to a lowest value for the SOC allowed for parallel connection of the outlying lowest voltage energy storage unit to the connected energy storage unit group, the target SOC being a target value for the SOC of the connected energy storage unit group; and a charge amount calculation unit configured to calculate an amount of charge for charging the connected energy storage unit group such that the SOC of the connected energy storage unit group matches the target SOC.

With this configuration, the charge/discharge information acquiring unit sets the target value for the SOC of the connected energy storage unit group to a lower value, and it is thereby possible to prevent the amount of charge for charging the connected energy storage unit group from taking an excessively great value. Accordingly, the occurrence of a need to discharge the connected energy storage unit group caused by the connected energy storage unit group being overcharged can be prevented.

Also, the connectable range acquiring unit may be further configured to, when the voltage of the connected energy storage unit group after being charged is higher than a voltage at which connection to the outlying lowest voltage energy storage unit can be made, acquire information indicating that the outlying lowest voltage energy storage unit cannot be connected to the connected energy storage unit group.

Here, if the voltage of the connected energy storage unit group after being charged is too high, it is necessary to discharge the connected energy storage unit group. However, depending on the user, it may not be possible to discharge the connected energy storage unit group. In this case, the connectable range acquiring unit can perform processing such as alerting the user not to connect the outlying lowest voltage energy storage unit to the connected energy storage unit group by acquiring information indicating that the outlying lowest voltage energy storage unit cannot be connected to the connected energy storage unit group.

Also, the connectable range acquiring unit may be further configured to acquire, as the connectable range, a range of energy storage units that can be connected in parallel and includes the connected energy storage unit group after being charged or discharged among the plurality of energy storage units.

With this configuration, the connectable range acquiring unit acquires the connectable range again after the connected energy storage unit group has been charged or discharged, and it is therefore possible to further acquire information for preventing an excessive amount of cross current from flowing when a plurality of energy storage units are connected in parallel.

Also, the connectable range acquiring unit may be further configured to: determine whether or not a potential difference between two energy storage units out of the plurality of energy storage units is less than or equal to a second tolerance value, the second tolerance value being the potential difference between the two energy storage units when a current flowing from one of the two energy storage units into the other energy storage unit is allowable on an assumption that the two energy storage units are connected in parallel; and when it determines that the potential difference between the two energy storage units is less than or equal to the second tolerance value, determine that the two energy storage units can be connected in parallel.

Here, in the case where the energy storage units are lithium ion secondary batteries or the like, generally, the tolerance value for the cross current flowing into the energy storage units is smaller than the tolerance value for the cross current flowing out of the energy storage units. Accordingly, in the case where two energy storage units are connected in parallel, it is preferable to compare the potential difference between the two energy storage units with the second tolerance value that is the potential difference when the magnitude of a current flowing into one of the energy storage units is allowable. Accordingly, the connectable range acquiring unit can more accurately determine whether or not the two energy storage units can be connected in parallel by determining whether or not the potential difference is less than or equal to the second tolerance value.

Also, the connection information acquiring apparatus may further include a determiner unit configured to determine a magnitude relationship between a voltage of a first connected energy storage unit group and a voltage of an unconnected energy storage unit group, the first connected energy storage unit group being composed of energy storage units that are connected in parallel among a plurality of energy storage units included in the connected energy storage unit group, and the unconnected energy storage unit group being composed of energy storage units that are not included in the first connected energy storage unit group, and the connectable range acquiring unit may be configured to acquire the connectable range by acquiring information for connecting in parallel the first connected energy storage unit group and the energy storage units included in the unconnected energy storage unit group based on a result of determination performed by the determiner unit.

With this configuration, the connection information acquiring apparatus can acquire information for preventing an excessive amount of cross current from flowing when the first connected energy storage unit group and the energy storage units included in the unconnected energy storage unit group are connected in parallel by determining the magnitude relationship between the voltage of the unconnected energy storage unit group and the voltage of the first connected energy storage unit group. Accordingly, it is possible to, by using the information, prevent an excessive amount of cross current from flowing when the plurality of energy storage units are connected in parallel.

Also, the connectable range acquiring unit may be configured to, when the determiner unit determines that the voltage of the unconnected energy storage unit group is higher than the voltage of the first connected energy storage unit group, acquire a range of energy storage units that can be connected in parallel and includes the first connected energy storage unit group as the connectable range.

With this configuration, when it is determined that the voltage of the unconnected energy storage unit group is higher than the voltage of the first connected energy storage unit group, the connection information acquiring apparatus acquires the connectable range in which parallel connection is possible without performing charge or discharge. Accordingly, by connecting the plurality of energy storage units in the connectable range in parallel, it is possible to prevent an excessive amount of cross current from flowing through the energy storage units.

Also, the charge/discharge information acquiring unit may be configured to acquire information for charging a second connected energy storage unit group such that at least one energy storage unit outside the connectable range can be connected in parallel to the second connected energy storage unit group, the second connected energy storage unit group being composed of energy storage units in the connectable range that are connected in parallel, and being defined as the connected energy storage unit group.

With this configuration, because the connection information acquiring apparatus acquires information for charging the second connected energy storage unit group such that another energy storage unit can be connected in parallel to the second connected energy storage unit group, by charging the second connected energy storage unit group by using the information, it is possible to prevent an excessive amount of cross current from flowing when the plurality of energy storage units are connected in parallel.

Also, the connectable range acquiring unit may be further configured to acquire, as the connectable range, a range of energy storage units that can be connected in parallel and includes the second connected energy storage unit group after being charged among the plurality of energy storage units.

With this configuration, the connectable range acquiring unit acquires the connectable range again after the second connected energy storage unit group has been charged, and it is therefore possible to further acquire information for preventing an excessive amount of cross current from flowing when a plurality of energy storage units are connected in parallel.

Also, the connectable range acquiring unit may be configured to: when the determiner unit determines that the voltage of the unconnected energy storage unit group is lower than the voltage of the first connected energy storage unit group, determine whether or not a potential difference between a first lowest voltage energy storage unit and the first connected energy storage unit group is less than or equal to a first tolerance value, the first lowest voltage energy storage unit being an energy storage unit having a lowest voltage among the plurality of energy storage units; and when it determines that the potential difference between the first lowest voltage energy storage unit and the first connected energy storage unit group is less than or equal to the first tolerance value, acquire information indicating that the plurality of energy storage units can be connected in parallel.

That is, in the case where the voltage of the unconnected energy storage unit group is lower than the voltage of the first connected energy storage unit group, the largest current flows when the first connected energy storage unit group and the first lowest voltage energy storage unit, which is an energy storage unit having the lowest voltage among the plurality of energy storage units, are connected. For this reason, if it is determined that the potential difference between the first lowest voltage energy storage unit and the first connected energy storage unit group is less than or equal to the first tolerance value, the connectable range acquiring unit can acquire the connectable range by acquiring information indicating that the energy storage units can be connected in parallel.

Also, the connectable range acquiring unit may be further configured to, when it determines that the potential difference between the first lowest voltage energy storage unit and the first connected energy storage unit group is greater than the first tolerance value, acquire information indicating that the energy storage units included in the unconnected energy storage unit group cannot be connected to the first connected energy storage unit group.

In the case where the potential difference between the first lowest voltage energy storage unit and the first connected energy storage unit group is greater than the first tolerance value, if the first connected energy storage unit group and the energy storage units included in the unconnected energy storage unit group are connected in parallel without performing charge or discharge, an excessive amount of cross current flows between the energy storage units when they are connected in parallel. For this reason, the connectable range acquiring unit can perform processing such as alerting the user not to connect the first connected energy storage unit group and the energy storage units included in the unconnected energy storage unit group by acquiring information indicating that they cannot be connected in parallel.

Also, the connectable range acquiring unit may be configured to: when the determiner unit determines that the voltage of the first connected energy storage unit group is between a voltage of a second lowest voltage energy storage unit having a lowest voltage and a voltage of a highest voltage energy storage unit having a highest voltage that are included in the unconnected energy storage unit group, determine whether or not a potential difference between the second lowest voltage energy storage unit and the highest voltage energy storage unit in the plurality of energy storage unit is less than or equal to a second tolerance value; and when it determines that the potential difference between the second lowest voltage energy storage unit and the highest voltage energy storage unit is less than or equal to the second tolerance value, acquire information indicating that the plurality of energy storage units can be connected in parallel.

That is, in the case where the voltage of the first connected energy storage unit group is between the voltage of the second lowest voltage energy storage unit having the lowest voltage and the voltage of the highest voltage energy storage unit having the highest voltage that are included in the unconnected energy storage unit group, the largest current flows when the second lowest voltage energy storage unit and the highest voltage energy storage unit are connected. For this reason, the connectable range acquiring unit can acquire the connectable range by, if it is determined that the potential difference between the second lowest voltage energy storage unit and the highest voltage energy storage unit is less than or equal to the second tolerance value, acquiring information indicating that the energy storage units can be connected in parallel.

Also, the connectable range acquiring unit may be further configured to, when it determines that the potential difference between the second lowest voltage energy storage unit and the highest voltage energy storage unit is greater than the second tolerance value, acquire information indicating that the energy storage units included in the unconnected energy storage unit group cannot be connected to the first connected energy storage unit group.

In the case where the potential difference between the second lowest voltage energy storage unit and the highest voltage energy storage unit is greater than the second tolerance value, if the first connected energy storage unit group and the energy storage units included in the unconnected energy storage unit group are connected in parallel without performing charge or discharge, an excessive amount of cross current flows between the energy storage units when they are connected in parallel. For this reason, the connectable range acquiring unit can perform processing such as alerting the user not to connect the first connected energy storage unit group and the energy storage units included in the unconnected energy storage unit group by acquiring information indicating that they cannot be connected in parallel.

Also, in order to achieve the above object, an energy storage unit connection information acquiring apparatus according to another aspect of the present invention is an energy storage unit connection information acquiring apparatus that acquires information for connecting a plurality of energy storage units in parallel, each energy storage unit including one or more energy storage elements connected in series, the connection information acquiring apparatus including: a connectable range acquiring unit configured to acquire a connectable range by determining the connectable range, the connectable range being a range of energy storage units that can be connected in parallel among the plurality of energy storage units; and a charge/discharge information acquiring unit configured to acquire information for charging or discharging a connected energy storage unit group such that at least one energy storage unit outside the connectable range can be connected in parallel to the connected energy storage unit group, the connected energy storage unit group being composed of the energy storage units in the connectable range that are connected in parallel, wherein the connectable range acquiring unit is configured to acquire, as the connectable range, a range of energy storage units in which a potential difference between the plurality of energy storage units is less than or equal to a tolerance value, the charge/discharge information acquiring unit is configured to acquire information for charging or discharging the connected energy storage unit group such that a voltage of the connected energy storage unit group falls within a voltage range allowed for parallel connection of the at least one energy storage unit outside the connectable range to the connected energy storage unit group, and the connectable range acquiring unit is further configured to acquire, as the connectable range, a range of energy storage units that can be connected in parallel and includes the connected energy storage unit group after being charged or discharged among the plurality of energy storage units.

With this configuration, the connection information acquiring apparatus acquires a connectable range of energy storage units in which the potential difference is less than or equal to the tolerance value, and acquires information for charging or discharging the connected energy storage unit group such that the voltage of the connected energy storage unit group falls within a range in which parallel connection is possible. With this configuration, after the connected energy storage unit group has been charged or discharged by using the information, the connected energy storage unit group is connected in parallel to the energy storage units outside the connectable range, whereby it is possible to prevent an excessive amount of cross current from flowing when a plurality of energy storage units are connected in parallel. Also, the connection information acquiring apparatus acquires the connectable range again after the connected energy storage unit group has been charged or discharged, and it is therefore possible to further acquire information for preventing an excessive amount of cross current from flowing when a plurality of energy storage units are connected in parallel.

Note that the present invention can be implemented not only as an energy storage unit connection information acquiring apparatus as described above, but also as an energy storage system including a plurality of energy storage units and a connection information acquiring apparatus configured to acquire information for connecting the plurality of energy storage units in parallel. Also, the present invention can be implemented as a connection information acquiring method including characteristic processing performed by the connection information acquiring apparatus in the form of steps. The present invention can also be implemented as an integrated circuit including a characteristic processing unit included in the connection information acquiring apparatus. The present invention can also be implemented as a program that causes a computer to execute the characteristic processing of the connection information acquiring method, or as a computer-readable non-transitory recording medium such as a CD-ROM (Compact Disc-Read Only Memory) in which the above program is recorded. Needless to say, such a program can be distributed via recording media such as CD-ROMs or transmission media such as the Internet.

Hereinafter, an energy storage unit connection information acquiring apparatus and an energy storage system including the connection information acquiring apparatus according to an embodiment of the present invention will be described with reference to the drawings. Note that each embodiment described below shows a specific example of a preferred embodiment of the present invention. The numerical values, shapes, materials, structural elements, the arrangement and connection of the structural elements, steps, the processing order of the steps, etc. shown in the following embodiments are merely examples, and therefore do not limit the scope of the claims. Also, among the structural elements in the following embodiments, structural elements not recited in any one of the independent claims that indicate the broadest concepts of the invention are described as arbitrary structural elements that constitute more preferable embodiments.

Embodiment 1

A configuration of an energy storage system 10 will be described first.

FIG. 1 is a diagram showing a configuration of an energy storage system 10 including a connection information acquiring apparatus 100 according to Embodiment 1 of the present invention.

As shown in the diagram, the energy storage system 10 includes a connection information acquiring apparatus 100, a plurality of energy storage units 200 that are disposed so as to be capable of being connected in parallel, and a PCS 300.

The connection information acquiring apparatus 100 is a circuit board on which a circuit that acquires information for connecting the energy storage units 200 in parallel is mounted. To be specific, the connection information acquiring apparatus 100 is connected to the plurality of energy storage units 200, and acquires information for connecting the plurality of energy storage units 200 in parallel by acquiring information from the plurality of energy storage units 200. A functional configuration of the connection information acquiring apparatus 100 will be described later in detail.

The energy storage units 200 are battery units that are capable of charging or discharging electric power. The number of energy storage units 200 can be any number such as 50 or 70. Also, each of the energy storage units 200 includes one or more energy storage elements 210 that are connected in series, and a breaker 220.

The energy storage elements 210 are secondary batteries such as lithium ion secondary batteries. For example, the energy storage elements 210 are battery assemblies in each of which seven rectangular lithium ion secondary batteries are arranged in series. The number of lithium ion secondary batteries included in each energy storage elements 210 is not limited. Also, the energy storage elements 210 may be other secondary batteries rather than lithium ion secondary batteries, such as lead acid batteries. Alternatively, the energy storage elements 210 may be capacitors rather than secondary batteries.

The breakers 220 are molded case circuit breakers (MCCB) for connecting a plurality of energy storage units 200 in parallel. When a breaker 220 is turned on, an energy storage unit 200 corresponding to the breaker 220 is connected to the PCS 300 and other energy storage units 200.

The PCS 300 is a power conditioner that connects an external electric power system and the plurality of energy storage units 200. In other words, the PCS 300 is a DC-AC converting apparatus that converts electric power to be transmitted to the energy storage units 200 from alternating current to direct current, and converts electric power transmitted from the energy storage units 200 from direct current to alternating current.

Next is a detailed description of a functional configuration of the connection information acquiring apparatus 100.

Figure 2:
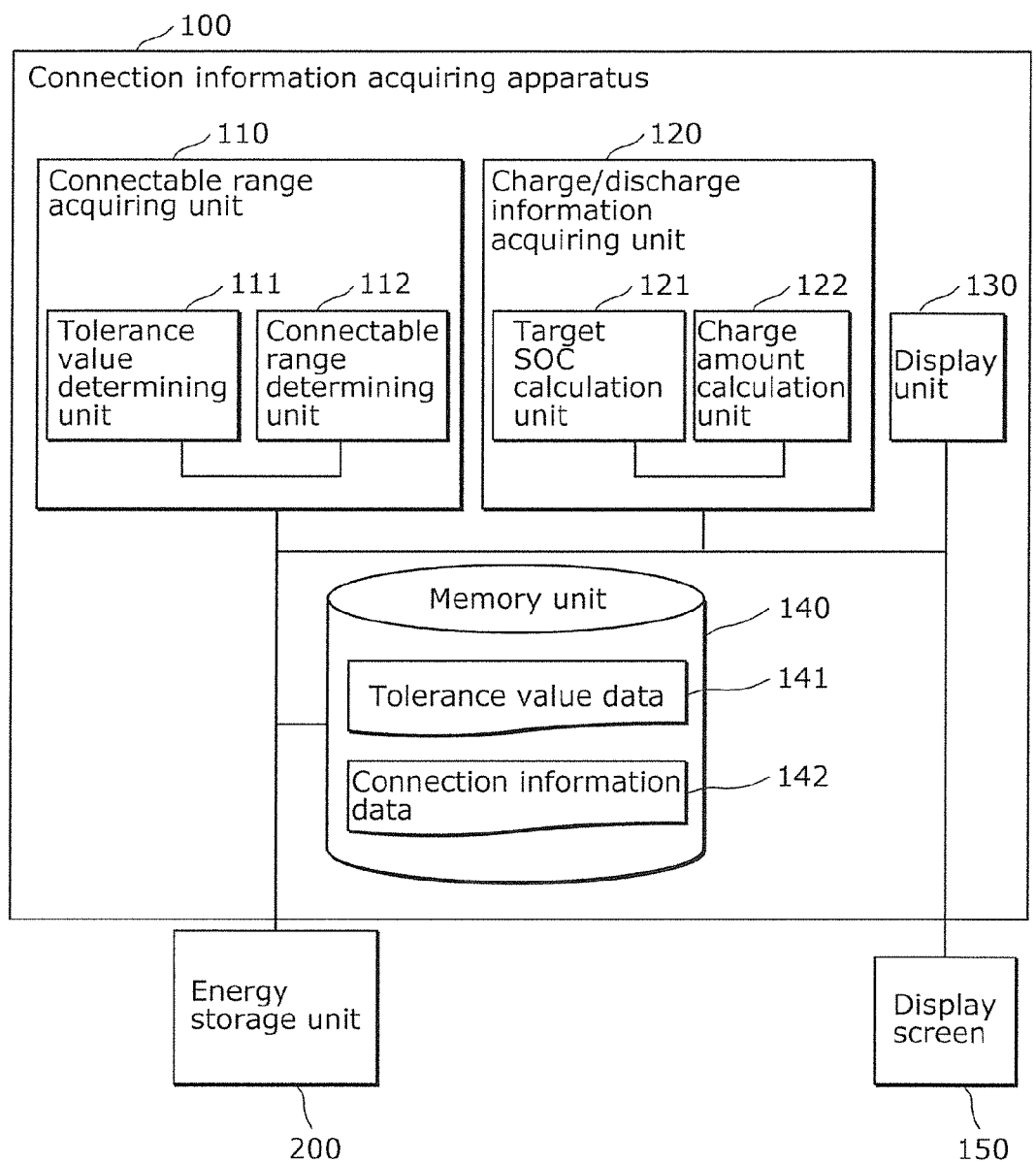
FIG. 2 is a block diagram showing a functional configuration of the connection information acquiring apparatus according to Embodiment 1 of the present invention.
Figure 3:
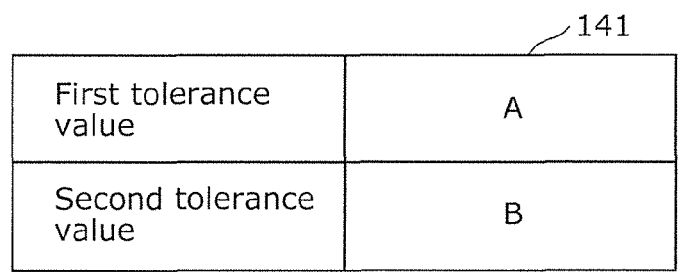
FIG. 3 is a diagram showing an example of tolerance value data stored in a memory unit according to Embodiment 1 of the present invention.
Figure 4:
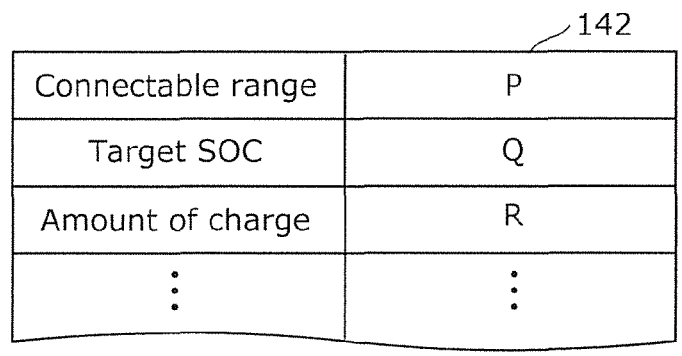
FIG. 4 is a diagram showing an example of connection information data stored in the memory unit according to Embodiment 1 of the present invention.

FIG. 2 is a block diagram showing a functional configuration of the connection information acquiring apparatus 100 according to Embodiment 1 of the present invention. FIG. 3 is a diagram showing an example of tolerance value data 141 stored in a memory unit 140 according to Embodiment 1 of the present invention. FIG. 4 is a diagram showing an example of connection information data 142 stored in the memory unit 140 according to Embodiment 1 of the present invention.

The connection information acquiring apparatus 100 is an apparatus that acquires information for connecting energy storage units 200 in parallel. As shown in the diagram, the connection information acquiring apparatus 100 includes a connectable range acquiring unit 110, a charge/discharge information acquiring unit 120, a display unit 130, and a memory unit 140. The memory unit 140 stores therein tolerance value data 141 and connection information data 142.

The connectable range acquiring unit 110 acquires a connectable range that is a range of energy storage units 200 that can be connected in parallel among a plurality of energy storage units 200. That is, the connectable range acquiring unit 110 acquires, as the connectable range, a range of energy storage units 200 in which a current flowing through the energy storage units 200 when the energy storage units 200 are connected in parallel has a value less than or equal to a tolerance value.

Here, in the present embodiment, the connectable range acquiring unit 110 acquires a range of energy storage units 200 that can be connected in parallel and includes a lowest voltage energy storage unit that is an energy storage unit 200 having the lowest voltage among the plurality of energy storage units 200, as the connectable range.

Also, when a connected energy storage unit group in which the energy storage units 200 in the connectable range are connected in parallel has been charged or discharged, the connectable range acquiring unit 110 acquires, as the connectable range, a range of energy storage units 200 that can be connected in parallel and includes the connected energy storage unit group after being charged or discharged in the plurality of energy storage units 200. In the present embodiment, the connectable range acquiring unit 110 acquires, as the connectable range, a range of energy storage units 200 that can be connected in parallel and includes the connected energy storage unit group after being charged in the plurality of energy storage units 200.

Then, the connectable range acquiring unit 110 writes the acquired connectable range into the connection information data 142 shown in FIG. 4, and outputs the acquired connectable range to the display unit 130. The connectable range acquiring unit 110 includes a tolerance value determining unit 111 and a connectable range determining unit 112.

The tolerance value determining unit 111 determines whether or not a current flowing from a first highest voltage energy storage unit has a value less than or equal to a first tolerance value, on the assumption that the energy storage units 200 included in a first low voltage energy storage unit group are connected in parallel by assuming that the energy storage units 200 included in the first low voltage energy storage unit group have a voltage equal to the voltage of the lowest voltage energy storage unit, and that the first low voltage energy storage unit group and the first highest voltage energy storage unit are connected in parallel. As used herein, the first highest voltage energy storage unit refers to an energy storage unit 200 having the highest voltage among the plurality of energy storage units 200, and the first low voltage energy storage unit group refers to a group of energy storage units 200 of the plurality of energy storage units 200 other than the first highest voltage energy storage unit.

Also, as used herein, the first tolerance value refers to the tolerance value of a cross current (discharge current) flowing out of the energy storage units 200. The first tolerance value is stored in the tolerance value data 141 as shown in FIG. 3, and the tolerance value determining unit 111 determines whether or not the current flowing from the first highest voltage energy storage unit has a value less than or equal to the first tolerance value by acquiring the first tolerance value from the tolerance value data 141.

If the tolerance value determining unit 111 determines that the current flowing from the first highest voltage energy storage unit has a value greater than the first tolerance value, it then determines whether or not a current flowing a second highest voltage energy storage unit has a value less than or equal to the first tolerance value on the assumption that the energy storage units 200 included in a second low voltage energy storage unit group are connected in parallel by assuming that the energy storage units 200 included in the second low voltage energy storage unit group have a voltage equal to the voltage of the lowest voltage energy storage unit, and that the second low voltage energy storage unit group and the second highest voltage energy storage unit are connected in parallel. As used herein, the second highest voltage energy storage unit refers to an energy storage unit 200 having the highest voltage in the first low voltage energy storage unit group, and the second low voltage energy storage unit group refers to a group of energy storage units 200 in the first low voltage energy storage unit group other than the second highest voltage energy storage unit.

If the tolerance value determining unit 111 determines that the current flowing from the second highest voltage energy storage unit has a value greater than the first tolerance value, it then updates the first low voltage energy storage unit group by defining the second low voltage energy storage unit group as the first low voltage energy storage unit group, and also updates the second highest voltage energy storage unit with an energy storage unit 200 having the highest voltage in the first low voltage energy storage unit group, and then determines whether or not the current flowing from the second highest voltage energy storage unit has a value less than or equal to the first tolerance value.

Also, the tolerance value determining unit 111 determines whether or not a current flowing from one of two energy storage units out of a plurality of energy storage units 200 to the other energy storage unit has a value less than or equal to a second tolerance value on the assumption that the two energy storage units are connected in parallel. In the present embodiment, for example, the tolerance value determining unit 111 determines whether or not a current flowing into a lowest voltage energy storage unit has a value less than or equal to the second tolerance value on the assumption that the lowest voltage energy storage unit and a next lowest voltage energy storage unit having the next lowest voltage after the lowest voltage energy storage unit are connected in parallel.

As used herein, the second tolerance value refers to the tolerance value of a cross current (charge current) flowing into the energy storage units 200. The second tolerance value is also stored in the tolerance value data 141 as shown in FIG. 3, and the tolerance value determining unit 111 determines whether or not the current flowing into the lowest voltage energy storage unit has a value less than or equal to the second tolerance value by acquiring the second tolerance value from the tolerance value data 141.

If the tolerance value determining unit 111 determines that the current flowing from the first highest voltage energy storage unit has a value less than or equal to the first tolerance value, the connectable range determining unit 112 determines a plurality of energy storage units 200 being composed of the first highest voltage energy storage unit and the first low voltage energy storage unit group, as the connectable range.

If the tolerance value determining unit 111 determines that the current flowing from the second highest voltage energy storage unit has a value less than or equal to the first tolerance value, the connectable range determining unit 112 determines the first low voltage energy storage unit group as the connectable range.

If the current flowing into the other energy storage unit described above has a value less than or equal to the second tolerance value, the connectable range determining unit 112 determines that the two energy storage units can be connected in parallel. In the present embodiment, for example, if the tolerance value determining unit 111 determines that the current flowing into the lowest voltage energy storage unit has a value less than or equal to the second tolerance value, the connectable range determining unit 112 determines that the lowest voltage energy storage unit and the next lowest voltage energy storage unit can be connected.

If the connected energy storage unit group after being charged has a voltage higher than a voltage at which connection to an outlying lowest voltage energy storage unit can be made, the connectable range determining unit 112 acquires information indicating that the connected energy storage unit group cannot be connected to the outlying lowest voltage energy storage unit. As used herein, the outlying lowest voltage energy storage unit refers to an energy storage unit having the lowest voltage in the energy storage units 200 that are outside the connectable range.

The charge/discharge information acquiring unit 120 acquires information for charging or discharging the connected energy storage unit group such that the energy storage units 200 outside the connectable range can be connected in parallel to the connected energy storage unit group in which the energy units 200 in the connectable range are connected in parallel. To be specific, the charge/discharge information acquiring unit 120 acquires information for charging or discharging the connected energy storage unit group such that the voltage of the connected energy storage unit group falls within a voltage range allowed for parallel connection of the connected energy storage unit group to the energy storage units 200 outside the connectable range.

To be more specific, the charge/discharge information acquiring unit 120 determines whether the voltage of the energy storage units 200 included in the connected energy storage unit group is higher or lower than the voltage of the energy storage units 200 outside the connectable range. In the present embodiment, the voltage of the energy storage units 200 included in the connected energy storage unit group is lower than the voltage of the energy storage units 200 outside the connectable range. If the charge/discharge information acquiring unit 120 determines that the voltage of the energy storage units 200 included in the connected energy storage unit group is lower than the voltage of the energy storage units 200 outside the connectable range, then it acquires information for charging the connected energy storage unit group such that the energy storage units 200 outside the connectable range can be connected in parallel to the connected energy storage unit group.

To be specific, the charge/discharge information acquiring unit 120 checks that the energy storage units 200 in the connectable range are connected in parallel and form the connected energy storage unit group. Then, the charge/discharge information acquiring unit 120 acquires information (target SOC, the amount of charge, and the like, which are described later) for charging the connected energy storage unit group such that the voltage of the connected energy storage unit group falls within a voltage range allowed for parallel connection of the outlying lowest voltage energy storage unit to the connected energy storage unit group. Also, the charge/discharge information acquiring unit 120 outputs the acquired information for charging the connected energy storage unit group to the display unit 130. The charge/discharge information acquiring unit 120 includes a target SOC calculation unit 121 and a charge amount calculation unit 122.

The target SOC calculation unit 121 determines whether or not the energy storage units 200 in the connectable range are connected in parallel. If it determines that the energy storage units 200 are connected in parallel, the target SOC calculation unit 121 acquires a state of charge (SOC) of the connected energy storage unit group and a SOC of the outlying lowest voltage energy storage unit. Then, the target SOC calculation unit 121 calculates a target SOC that is the target value for the SOC of the connected energy storage unit group such that the target SOC is less than or equal to the SOC of the outlying lowest voltage energy storage unit and is greater than or equal to the lowest value for the SOC allowed for parallel connection of the outlying lowest voltage energy storage unit to the connected energy storage unit group. Then, the target SOC calculation unit 121 writes the calculated target SOC into the connection information data 142 as shown in FIG. 4.

The charge amount calculation unit 122 calculates the amount of charge for charging the connected energy storage unit group such that the SOC of the connected energy storage unit group matches the target SOC. To be specific, the charge amount calculation unit 122 reads out the target SOC from the connection information data 142 stored in the memory unit 140, and then calculates the amount of charge. Then, the charge amount calculation unit 122 writes the calculated amount of charge into the connection information data 142 as shown in FIG. 4.

The display unit 130 causes a display screen 150 to display information for connecting a plurality of energy storage units 200 in parallel. Here, the display screen 150 is, for example, a cathode-ray tube (CRT), a liquid crystal display (LCD), a touch panel, or the like.

To be specific, the display unit 130 causes the display screen 150 to display the connectable range acquired by the connectable range acquiring unit 110 as the information for connecting in parallel the energy storage units 200 in the connectable range. Also, the display unit 130 causes the display screen 150 to display information for charging the connected energy storage unit group as the information for connecting in parallel the energy storage units 200 outside the connectable range to the connected energy storage unit group. For example, the display unit 130 causes the display screen 150 to display a message for prompting the user to perform charging.

In the tolerance value data 141, first tolerance values (discharge current tolerance values) and second tolerance values (charge current tolerance values) are stored in advance according to the type of energy storage units 200. The data stored in the connection information data 142 is not limited to the above-described data. For example, respective voltage values of the energy storage units 200, and the SOC of the connected energy storage unit group and the SOC of the outlying lowest voltage energy storage unit that are acquired by the target SOC calculation unit 121 may be stored. Alternatively, respective resistance values of the energy storage units 200 may be stored in advance. By using the data as described above, the connectable range acquiring unit 110 acquires the connectable range, and the charge/discharge information acquiring unit 120 acquires the information for charging or discharging the energy storage units 200.

Next is a description of processing for acquiring information for connecting energy storage units 200 in parallel performed by the connection information acquiring apparatus 100.

Figure 5:
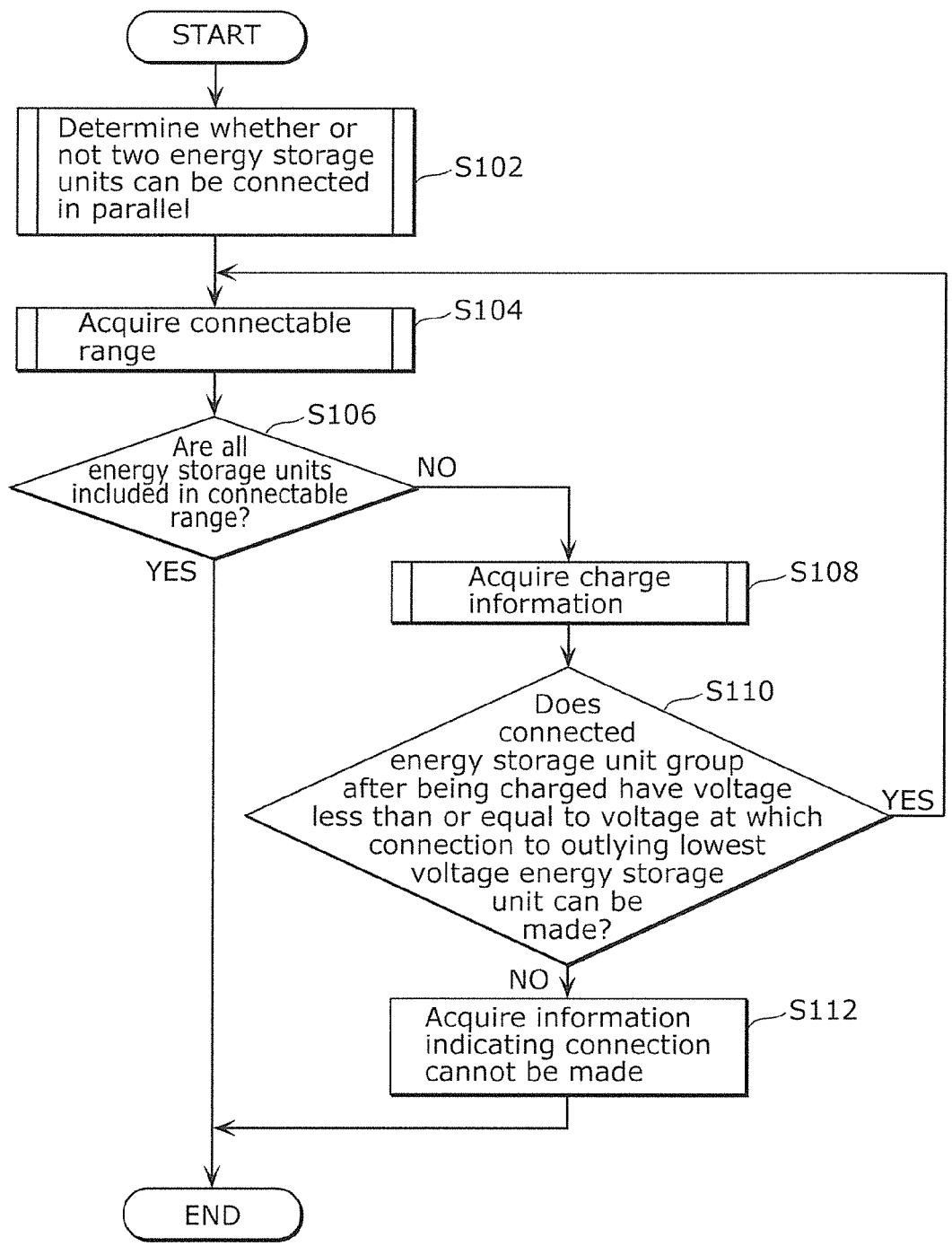
FIG. 5 is a flowchart illustrating an example of processing for acquiring information for connecting energy storage units in parallel performed by the connection information acquiring apparatus according to Embodiment 1 of the present invention.
Figure 6:
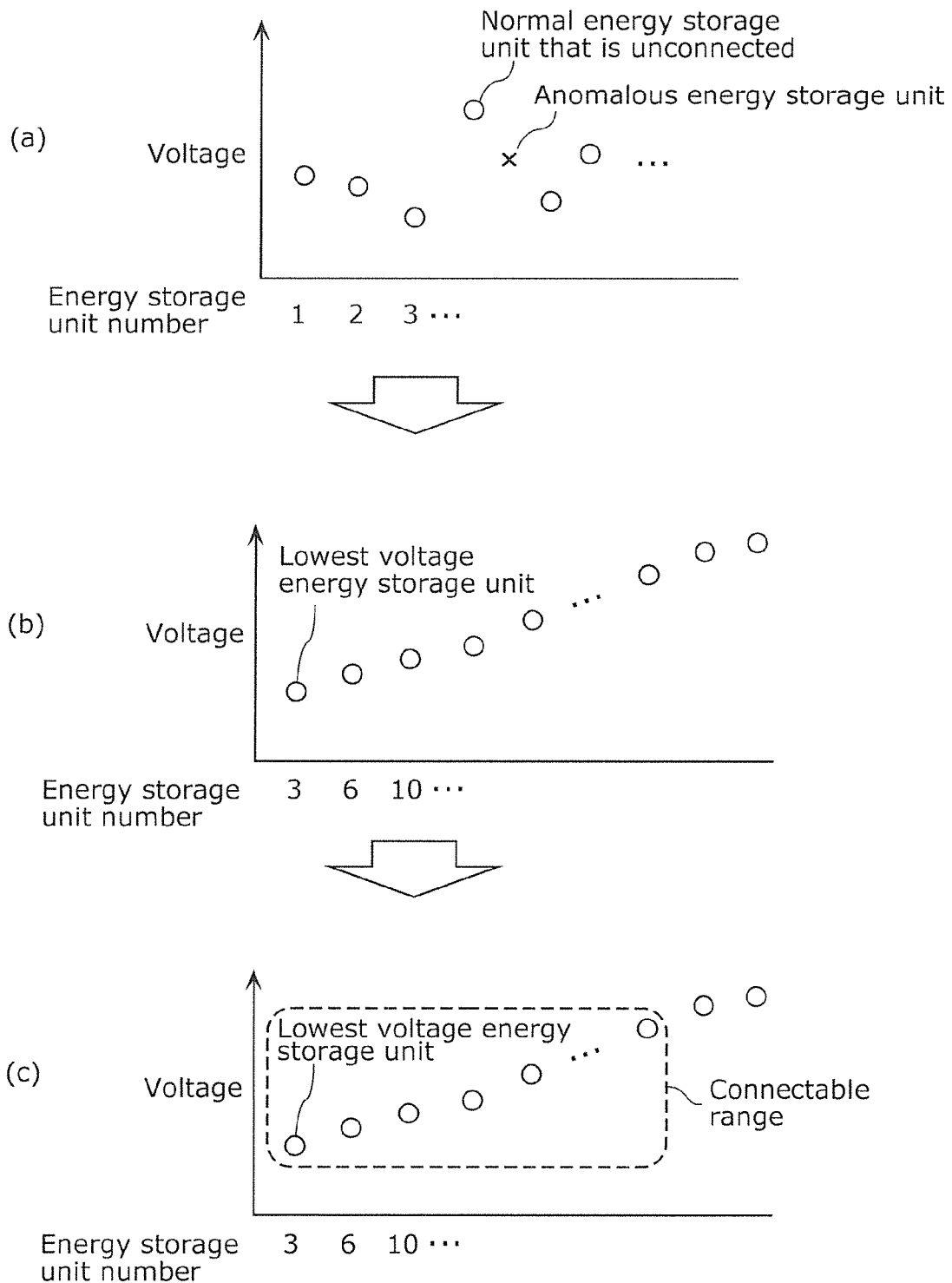
FIGS. 6a-c are diagrams illustrating the processing for acquiring information for connecting energy storage units in parallel performed by the connection information acquiring apparatus according to Embodiment 1 of the present invention.
Figure 7:
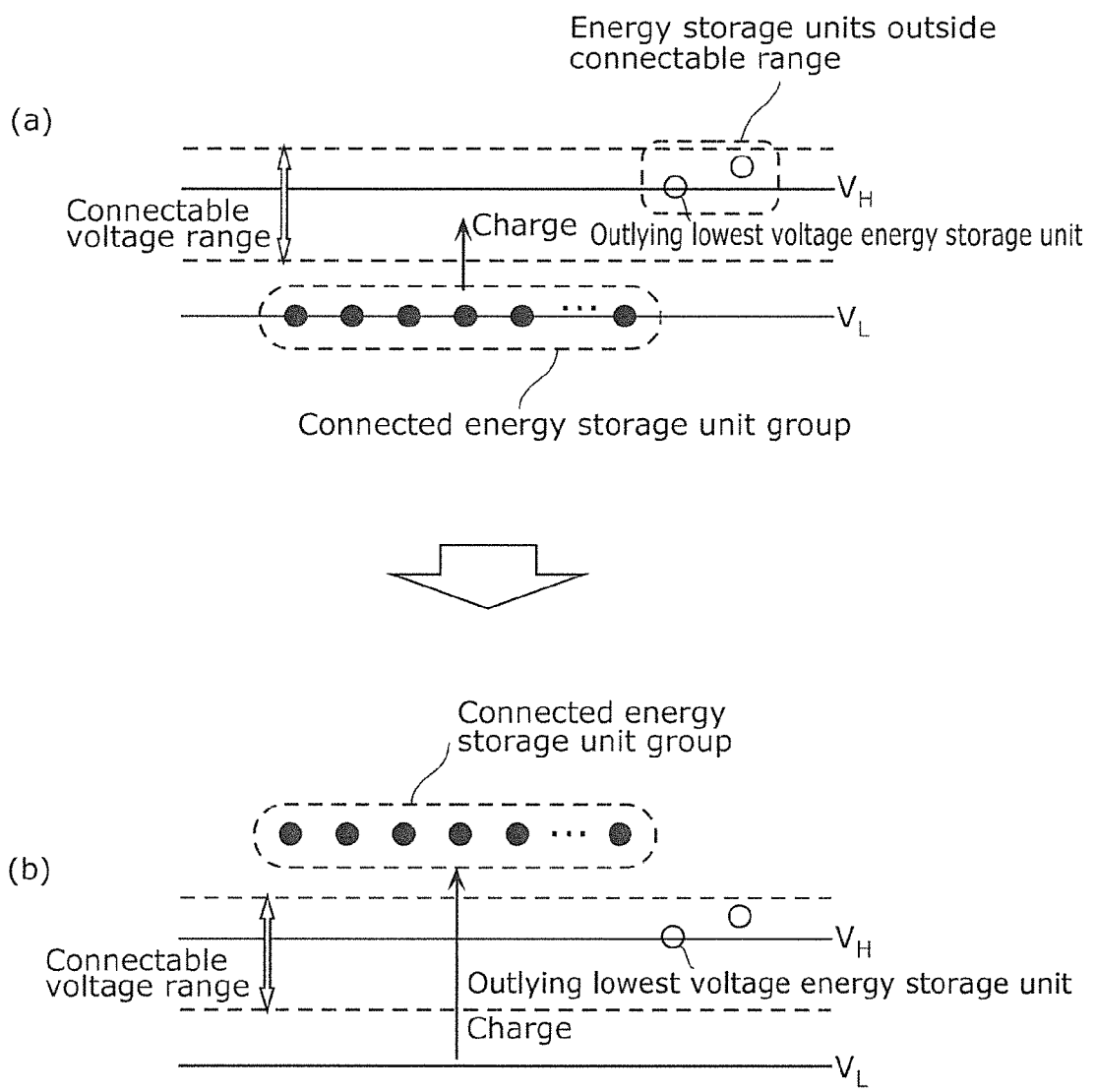
FIGS. 7a-b are diagrams illustrating the processing for acquiring information for connecting energy storage units in parallel performed by the connection information acquiring apparatus according to Embodiment 1 of the present invention.

FIG. 5 is a flowchart illustrating an example of processing for acquiring information for connecting energy storage units 200 in parallel performed by the connection information acquiring apparatus 100 according to Embodiment 1 of the present invention. FIGS. 6 and 7 are diagrams illustrating the processing for acquiring information for connecting energy storage units 200 in parallel performed by the connection information acquiring apparatus 100 according to Embodiment 1 of the present invention.

As shown in FIG. 5, first, the connectable range acquiring unit 110 determines whether or not two energy storage units 200 out of a plurality of energy storage units 200 can be connected in parallel (S102). The processing for determining whether or not two energy storage units 200 can be connected in parallel performed by the connectable range acquiring unit 110 will be described later in detail.

Then, the connectable range acquiring unit 110 acquires a connectable range that is a range of energy storage units 200 that can be connected in parallel and includes a lowest voltage energy storage unit (S104).

To be specific, the connectable range acquiring unit 110 first detects, as shown in (a) of FIG. 6, an energy storage unit 200 in which an anomaly has occurred (anomalous energy storage unit in the diagram), and then, as shown in (b) of FIG. 6, removes the anomalous energy storage unit and orders the energy storage units 200 by increasing voltage. Then, as shown in (c) of FIG. 6, the connectable range acquiring unit 110 acquires a connectable range that is a range of energy storage units 200 that can be connected in parallel, the energy storage units 200 being selected in the order of increasing voltage starting from the lowest voltage energy storage unit. As used herein, the connectable range refers to a range of energy storage units 200 that can be connected in parallel without charging the energy storage units 200. The processing for acquiring the connectable range performed by the connectable range acquiring unit 110 will be described later in detail.

Returning to FIG. 5, next, the connectable range acquiring unit 110 determines whether or not all energy storage units 200 are included in the connectable range (S106). If the connectable range acquiring unit 110 determines that all energy storage units 200 are included in the connectable range (YES in S106), the processing ends.

If, on the other hand, the connectable range acquiring unit 110 determines that not all energy storage units 200 are included in the connectable range (NO in S106), the charge/discharge information acquiring unit 120 acquires information for charging the connected energy storage unit group in which the energy storage units 200 in the connectable range are connected in parallel (S108).

To be specific, as shown in (a) of FIG. 7, the charge/discharge information acquiring unit 120 acquires information for charging the connected energy storage unit group such that the energy storage units 200 outside the connectable range can be connected in parallel to the connected energy storage unit group. That is, the charge/discharge information acquiring unit 120 acquires information for charging the connected energy storage unit group such that the voltage of the connected energy storage unit group falls within a connectable voltage range allowed for parallel connection of the outlying lowest voltage energy storage unit to the connected energy storage unit group. The processing for acquiring information for charging the energy storage units 200 performed by the charge/discharge information acquiring unit 120 will be described later in detail.

Returning to FIG. 5, next, when the connected energy storage unit group has been charged, the connectable range acquiring unit 110 determines whether or not the connected energy storage unit group after being charged has a voltage less than or equal to a voltage at which connection to the outlying lowest voltage energy storage unit can be made (S110).

If the connectable range acquiring unit 110 determines that the connected energy storage unit group after being charged has a voltage greater than the voltage at which connection to the outlying lowest voltage energy storage unit can be made (NO in S110), then it acquires information indicating that the outlying lowest voltage energy storage unit cannot be connected to the connected energy storage unit group (S112).

To be specific, as shown in (b) of FIG. 7, if the connected energy storage unit group after being charged has a voltage greater than the connectable voltage range in which connection to the outlying lowest voltage energy storage unit can be made, the connectable range determining unit 112 determines that the outlying lowest voltage energy storage unit cannot be connected to the connected energy storage unit group, and acquires information indicating that the connection cannot be made (hereinafter, referred to simply as "unconnectable information"). This is because the energy storage units 200 are configured, taking into consideration the influence on the load, so as to be incapable of discharging electricity from the energy storage units 200 to the load while the energy storage units 200 are connected in parallel. Then, the connectable range determining unit 112 outputs the unconnectable information to the display unit 130, and the display unit 130 causes the display screen 150 to display a message indicating that connection cannot be made. The processing thereby ends.

Returning to FIG. 5, if the connectable range acquiring unit 110 determines that the connected energy storage unit group after being charged has a voltage less than or equal to the voltage at which connection to the outlying lowest voltage energy storage unit can be made (YES in S110), then it acquires, as the connectable range, a range of energy storage units 200 that can be connected in parallel and includes the connected energy storage unit group after being charged among the plurality of energy storage units 200 (S104). In this way, the above processing (S104 to S112) is repeatedly performed.

The processing for acquiring information for connecting energy storage units 200 in parallel performed by the connection information acquiring apparatus 100 thereby ends.

Next is a description of the processing for determining whether or not two energy storage units 200 can be connected in parallel performed by the connectable range acquiring unit 110 (S102 in FIG. 5). The two energy storage units 200 can be any energy storage units 200 as long as they are two energy storage units 200 that are first connected in parallel, but in the following, as an example, processing for determining whether or not a lowest voltage energy storage unit and a next lowest voltage energy storage unit can be connected performed by the connectable range acquiring unit 110 will be described.

Figure 8:
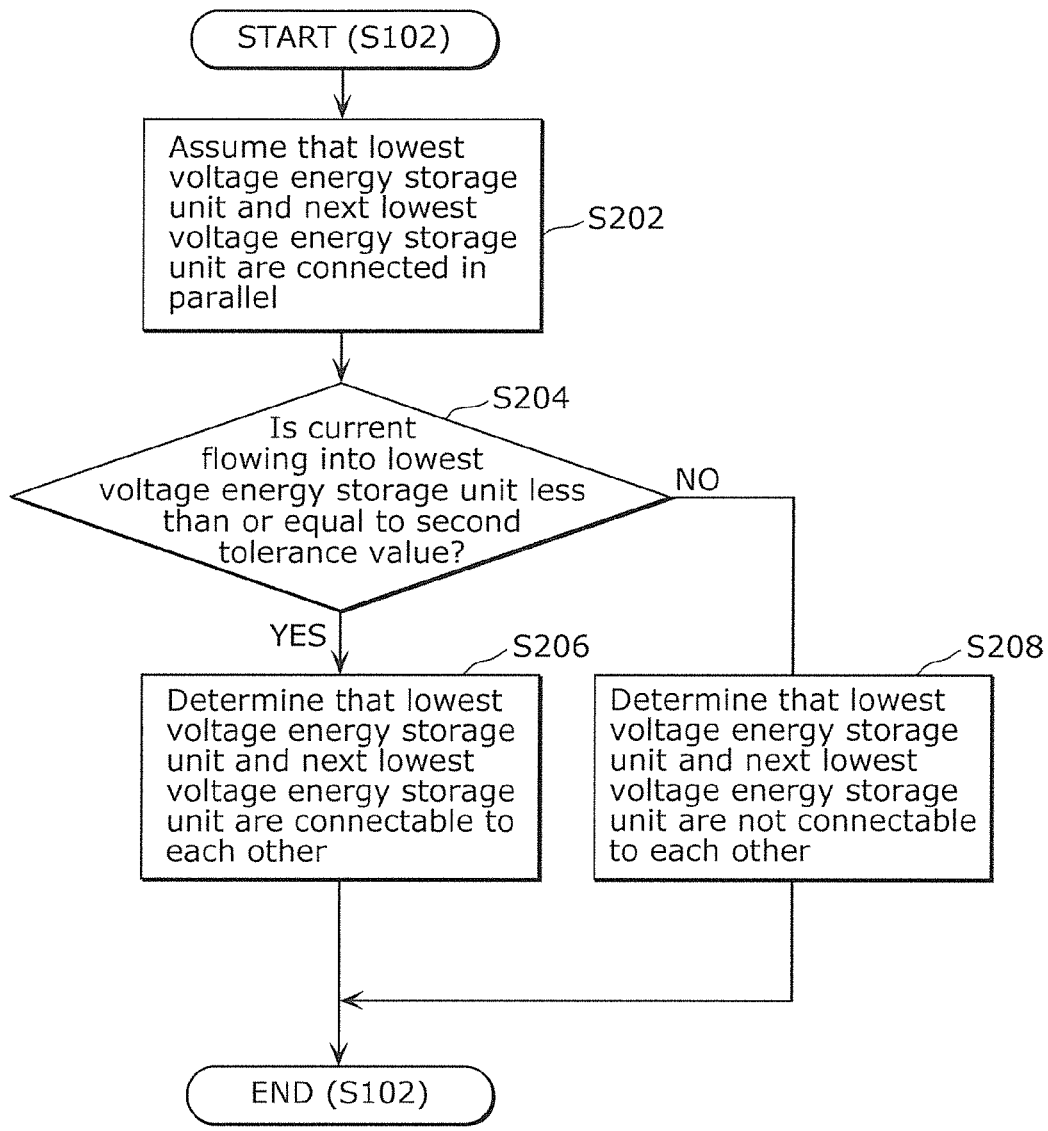
FIG. 8 is a flowchart illustrating an example of processing for determining whether or not a lowest voltage energy storage unit and a next lowest voltage energy storage unit can be connected performed by a connectable range acquiring unit according to Embodiment 1 of the present invention.
Figure 9:
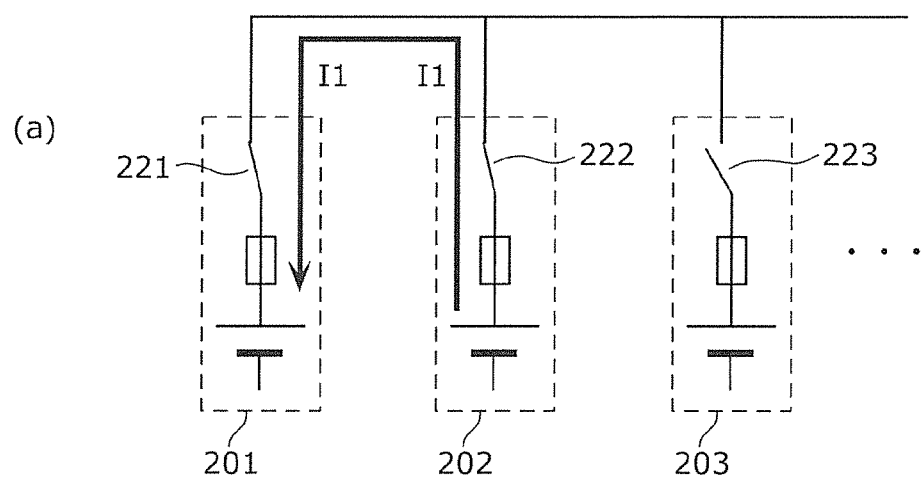
FIGS. 9a-b are diagrams illustrating the processing for determining whether or not a lowest voltage energy storage unit and a next lowest voltage energy storage unit can be connected performed by the connectable range acquiring unit according to Embodiment 1 of the present invention.
Figure 9:
Figure 9:
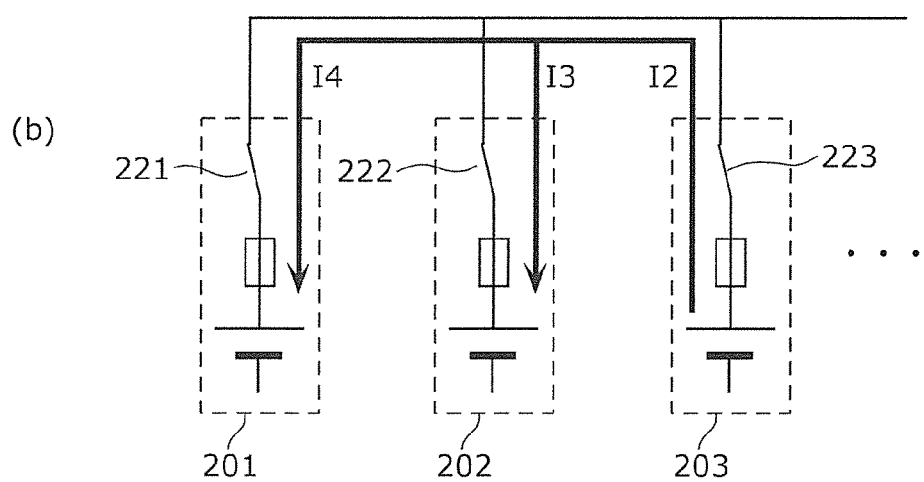

FIG. 8 is a flowchart illustrating an example of processing for determining whether or not a lowest voltage energy storage unit and a next lowest voltage energy storage unit can be connected performed by the connectable range acquiring unit 110 according to Embodiment 1 of the present invention. FIG. 9 is a diagram illustrating the processing for determining whether or not a lowest voltage energy storage unit and a next lowest voltage energy storage unit can be connected performed by the connectable range acquiring unit 110 according to Embodiment 1 of the present invention.

As shown in FIG. 8, first, the tolerance value determining unit 111 makes an assumption that a lowest voltage energy storage unit and a next lowest voltage energy storage unit having the next lowest voltage after the lowest voltage energy storage unit are connected in parallel (S202), and then determines whether or not a current flowing into the lowest voltage energy storage unit has a value less than or equal to a second tolerance value (S204).

Here, as shown in (a) of FIG. 9, in the case where an energy storage unit 201 that is the lowest voltage energy storage unit and an energy storage unit 202 that is the next lowest voltage energy storage unit are connected as a result of a breaker 221 and a breaker 222 being turned on, a cross current I1 flows from the energy storage unit 202 into the energy storage unit 201. In the case where the energy storage elements 210 in an energy storage unit 200 are lithium ion secondary batteries, generally, the tolerance value for the cross current (charge current) flowing into the energy storage unit 200 (second tolerance value) is smaller than the tolerance value for the cross current (discharge current) flowing out of the energy storage unit 200 (first tolerance value). That is, the tolerance value for the cross current I1 flowing into the energy storage unit 201 (second tolerance value) is smaller than the tolerance value for the cross current I1 flowing out of the energy storage unit 202 (first tolerance value). Accordingly, in the case of determining whether or not two energy storage units can be connected, it is preferable to compare the cross current I1 with the second tolerance value having a smaller value to determine whether or not the energy storage units can be connected.

As shown in (b) of FIG. 9, in the case where three energy storage units 201, 202 and 203 are connected as a result of breakers 221, 222 and 223 being turned on, a cross current I2 flows from the energy storage unit 203 into the energy storage units 201 and 202. In this case, the cross current I2 flowing out of the energy storage unit 203 is equal to a total (I3+I4) of cross currents respectively flowing into the energy storage units 201 and 202. Accordingly, it is preferable to compare the cross current (discharge current) I2 having a greater value with the first tolerance value, which is the tolerance value for discharge current, so as to determine whether or not the energy storage units can be connected. That is, in the case of determining whether or not three or more energy storage units can be connected, it is preferable to compare the discharge current with the first tolerance value to determine whether or not the energy storage units can be connected.

Returning to FIG. 8, if the tolerance value determining unit 111 determines that the current flowing into the lowest voltage energy storage unit has a value less than or equal to the second tolerance value (YES in S204), the connectable range determining unit 112 determines that the lowest voltage energy storage unit and the next lowest voltage energy storage unit are connectable to each other (S206).

If, on the other hand, the tolerance value determining unit 111 determines that the current flowing into the lowest voltage energy storage unit has a value greater than the second tolerance value (NO in S204), the connectable range determining unit 112 determines that the lowest voltage energy storage unit and the next lowest voltage energy storage unit are not connectable to each other (S208).

The processing for determining whether or not two energy storage units 200 can be connected in parallel performed by the connectable range acquiring unit 110 (S102 in FIG. 5) thereby ends.

Next is a description of the processing for acquiring a connectable range performed by the connectable range acquiring unit 110 (S104 in FIG. 5).

Figure 10:
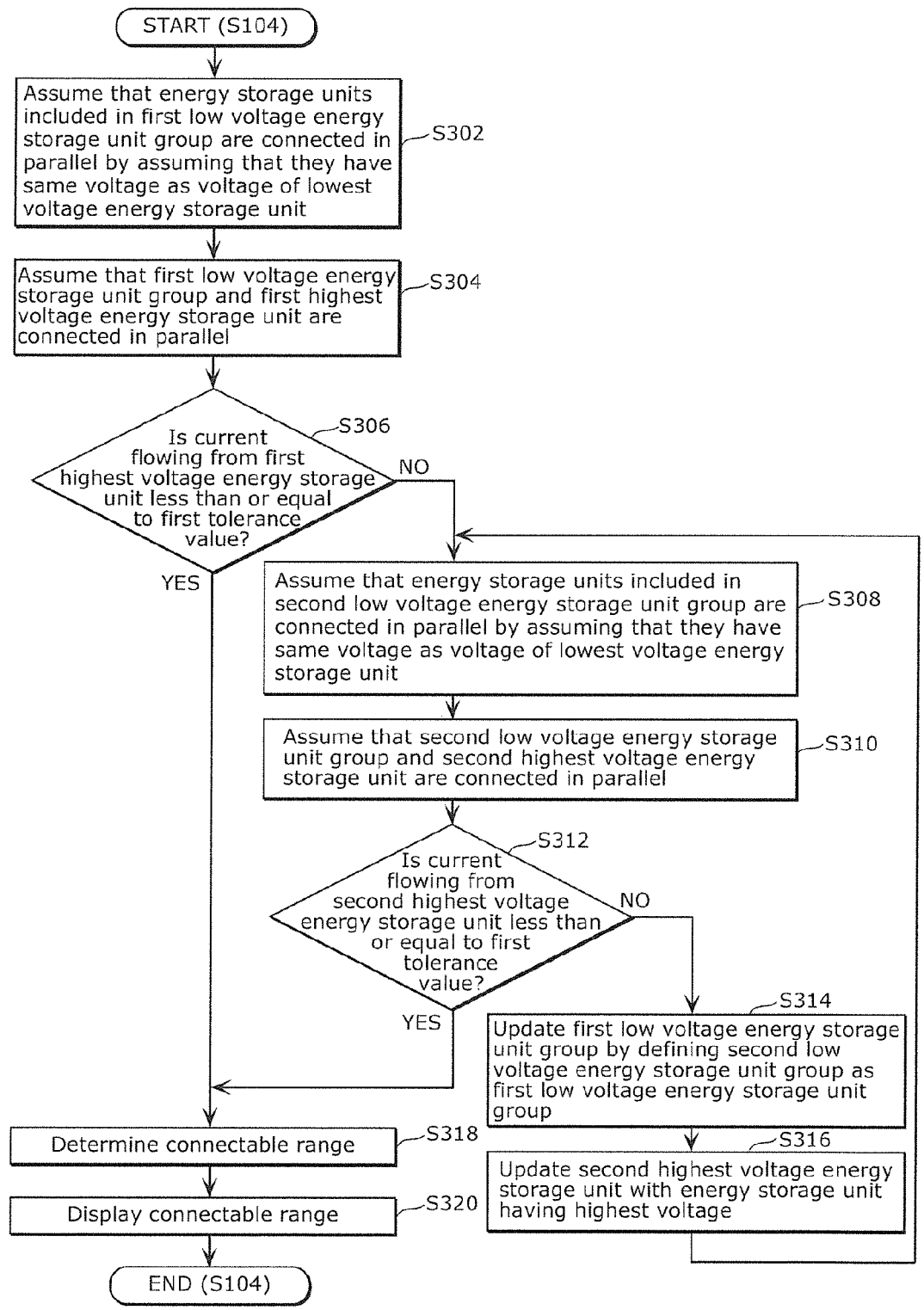
FIG. 10 is a flowchart illustrating an example of processing for acquiring a connectable range performed by the connectable range acquiring unit according to Embodiment 1 of the present invention.
Figure 11:
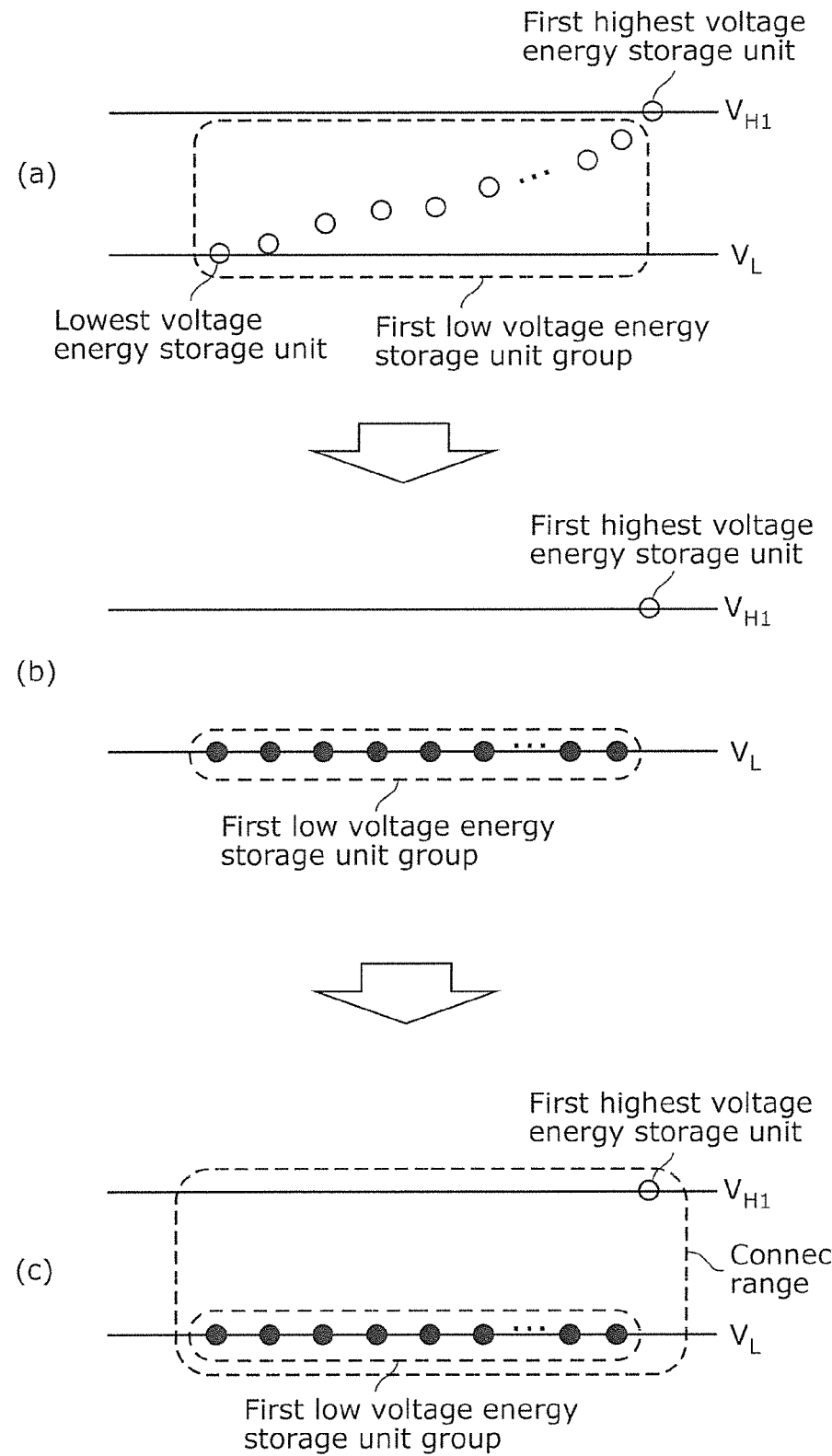
FIGS. 11a-c are diagrams illustrating the processing for acquiring a connectable range performed by the connectable range acquiring unit according to Embodiment 1 of the present invention.
Figure 12:
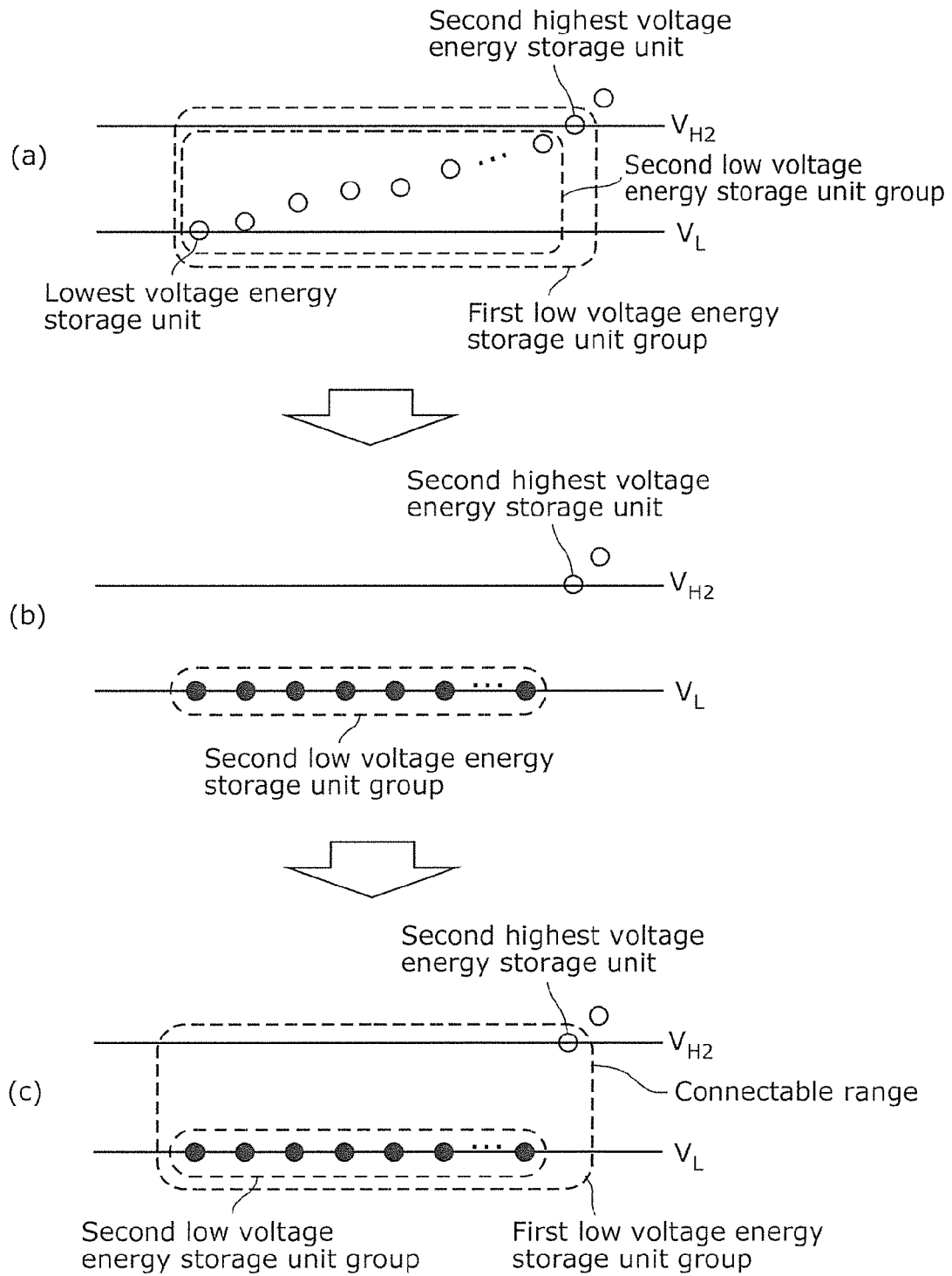
FIGS. 12a-c are diagrams illustrating the processing for acquiring a connectable range performed by the connectable range acquiring unit according to Embodiment 1 of the present invention.

FIG. 10 is a flowchart illustrating an example of processing for acquiring a connectable range performed by the connectable range acquiring unit 110 according to Embodiment 1 of the present invention. FIGS. 11 and 12 are diagrams illustrating the processing for acquiring a connectable range performed by the connectable range acquiring unit 110 according to Embodiment 1 of the present invention.

As shown in FIG. 10, first, the tolerance value determining unit 111 makes an assumption that the energy storage units 200 included in a first low voltage energy storage unit group are connected in parallel by assuming that they have the same voltage as the voltage of a lowest voltage energy storage unit (S302).

To be specific, as shown in (a) of FIG. 11, an energy storage unit having the highest voltage among a plurality of energy storage units 200 is defined as a first highest voltage energy storage unit, and the energy storage units 200 in the plurality of energy storage units 200 other than the first highest voltage energy storage unit are defined as a first low voltage energy storage unit group. Also, an energy storage unit having the lowest voltage among the plurality of energy storage units 200 is defined as a lowest voltage energy storage unit. Then, as shown in (b) of FIG. 11, the tolerance value determining unit 111 makes an assumption that all energy storage units 200 included in the first low voltage energy storage unit group are connected in parallel by assuming that they have a voltage $V_L$ that is the voltage of the lowest voltage energy storage unit.

Returning to FIG. 10, furthermore, the tolerance value determining unit 111 makes an assumption that the first low voltage energy storage unit group and the first highest voltage energy storage unit are connected in parallel (S304).

Then, the tolerance value determining unit 111 determines whether or not the current flowing from the first highest voltage energy storage unit (discharge current) has a value less than or equal to the first tolerance value (S306). The reason that it is preferable to compare the discharge current with the first tolerance value is as described above with reference to (b) of FIG. 9.

Also, the tolerance value determining unit 111 calculates the discharge current (cross current) by using, for example, the following Equation 1:

$$\text{Discharge current } I_A = (V_H - V_L) / \{(N+1)/N \times R\} \times k \quad \text{(Equation 1)},$$

where $V_H$ represents the voltage of the first highest voltage energy storage unit, $V_L$ represents the voltage of the lowest voltage energy storage unit, N represents the number of energy storage units 200 included in the first low voltage energy storage unit group, R represents the DC resistance of the energy storage units 200, and k represents a safety factor.

In Equation 1 given above, it is assumed that the energy storage units 200 are composed of an electromotive force and a resistance of batteries, all energy storage units 200 have a resistance of the same value, and the interconnect resistance is zero. Also, the discharge current $I_A$ increases as the value of R gets smaller, and therefore, in terms of safety, it is preferable that R is, for example, the DC resistance of energy storage units in a brand-new condition at 45° C., which take the smallest DC resistance value. Also, the present inventors have found that the actually measured values are greater than the calculated values by 20%, and therefore k is preferably, for example, 1.2.

Also, because the interconnect resistance is assumed to be zero, when all energy storage units 200 include the same number of batteries (cells), the discharge current $I_A$ can be calculated by using the battery resistance of the batteries as R, the average cell voltage of the batteries included in the first highest voltage energy storage unit as $V_H$, and the average cell voltage of the batteries included in the lowest voltage energy storage unit as $V_L$.

Next, if the tolerance value determining unit 111 determines that the current flowing from the first highest voltage energy storage unit (discharge current $I_A$ described above) has a value less than or equal to the first tolerance value (YES in S306), the connectable range determining unit 112 determines a plurality of energy storage units 200 being composed of the first highest voltage energy storage unit and the first low voltage energy storage unit group, as the connectable range (S318).

To be specific, as shown in (c) of FIG. 11, the connectable range determining unit 112 determines that the first highest voltage energy storage unit can be connected to the first low voltage energy storage unit group, and then designates a range including the first highest voltage energy storage unit and the first low voltage energy storage unit group as the connectable range.

Returning to FIG. 10, if the tolerance value determining unit 111 determines that the current flowing from the first highest voltage energy storage unit (discharge current $I_A$ described above) has a value greater than the first tolerance value (NO in S306), the tolerance value determining unit 111 makes an assumption that the energy storage units 200 included in a second low voltage energy storage unit group are connected in parallel by assuming that they have the same voltage as the voltage of the lowest voltage energy storage unit (S308).

To be specific, as shown in (a) of FIG. 12, an energy storage unit having the highest voltage in the first low voltage energy storage unit group is defined as a second highest voltage energy storage unit, and the energy storage units in the first low voltage energy storage unit group other than the second highest voltage energy storage unit are defined as a second low voltage energy storage unit group. Also, as shown in (b) of FIG. 12, the tolerance value determining unit 111 makes an assumption that all energy storage units 200 included in the second low voltage energy storage unit group are connected in parallel by assuming that they have a voltage $V_L$ that is the voltage of the lowest voltage energy storage unit.

Returning to FIG. 10, furthermore, the tolerance value determining unit 111 makes an assumption that the second low voltage energy storage unit group and the second highest voltage energy storage unit are connected in parallel (S310).

Then, the tolerance value determining unit 111 determines whether or not the current flowing from the second highest voltage energy storage unit has a value less than or equal to the first tolerance value (S312). The tolerance value determining unit 111 can calculate the current flowing from the second highest voltage energy storage unit by using the same method (Equation 1 given above) as the calculation of the current flowing from the first highest voltage energy storage unit (discharge current $I_A$ described above).

If the tolerance value determining unit 111 determines that the current flowing from the second highest voltage energy storage unit has a value greater than the first tolerance value (NO in S312), then it updates the first low voltage energy storage unit group by defining the second low voltage energy storage unit group as the first low voltage energy storage unit group (S314). That is, the tolerance value determining unit 111 defines again the first low voltage energy storage unit group by defining a group of energy storage units obtained by removing the second highest voltage energy storage unit from the first low voltage energy storage unit group as the first low voltage energy storage unit group.

Also, the tolerance value determining unit 111 updates the second highest voltage energy storage unit with an energy storage unit 200 having the highest voltage in the first low voltage energy storage unit group (S316). That is, the tolerance value determining unit 111 defines again the second highest voltage energy storage unit by defining an energy storage unit 200 having the highest voltage in the first low voltage energy storage unit group as the second highest voltage energy storage unit.

Then, the tolerance value determining unit 111 defines again the second highest voltage energy storage unit by defining an energy storage unit having the highest voltage in the updated first low voltage energy storage unit group as the second highest voltage energy storage unit, and also defines again the second low voltage energy storage unit group by defining the energy storage units in the first low voltage energy storage unit group other than the second highest voltage energy storage unit as the second low voltage energy storage unit group. Then, the tolerance value determining unit 111 makes an assumption that the energy storage units 200 included in the second low voltage energy storage unit group are connected in parallel by assuming that they have the same voltage as the voltage of the lowest voltage energy storage unit (S308), and that the second low voltage energy storage unit group and the second highest voltage energy storage unit are connected in parallel (S310), and then determines whether or not the current flowing from the second highest voltage energy storage unit has a value less than or equal to the first tolerance value (S312). In this way, the above processing (S308 to S316) is repeatedly performed.

Then, if the tolerance value determining unit 111 determines that the current flowing from the second highest voltage energy storage unit has a value less than or equal to the first tolerance value (YES in S312), the connectable range determining unit 112 designates the first low voltage energy storage unit group as the connectable range (S318).

To be specific, as shown in (c) of FIG. 12, the connectable range determining unit 112 determines that the second highest voltage energy storage unit can be connected to the second low voltage energy storage unit group, and then designates the first low voltage energy storage unit group being composed of the second highest voltage energy storage unit and the second low voltage energy storage unit group, as the connectable range. Then, the connectable range determining unit 112 outputs the determined connectable range to the display unit 130.

Returning to FIG. 10, next, the display unit 130 causes the display screen 150 to display the connectable range as information for connecting the energy storage units 200 in the connectable range in parallel (S320). For example, the display unit 130 causes the display screen 150 to display guidance, such as sequentially displaying energy storage units 200 to be connected, so that the user can connect the energy storage units 200 in the connectable range. An energy storage unit 200 to be connected can be connected in parallel to another energy storage unit 200 by the user turning on the breaker 220 of the energy storage unit 200 to be connected in accordance with the guidance.

The processing for acquiring a connectable range performed by the connectable range acquiring unit 110 (S104 in FIG. 5) thereby ends.

Next is a description of the processing for acquiring information for charging energy storage units 200 performed by the charge/discharge information acquiring unit 120 (S108 in FIG. 5).

Figure 13:
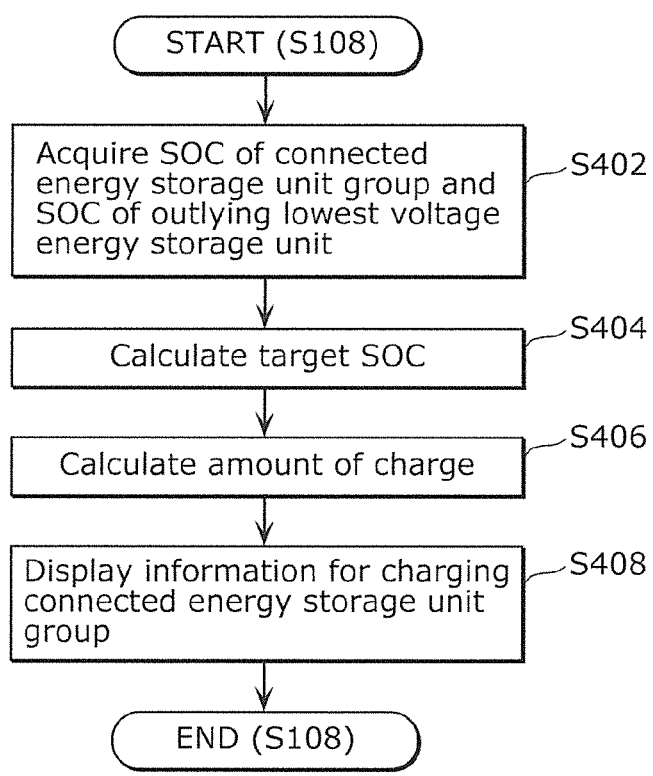
FIG. 13 is a flowchart illustrating an example of processing for acquiring information for charging energy storage units performed by a charge/discharge information acquiring unit according to Embodiment 1 of the present invention.
Figure 14:
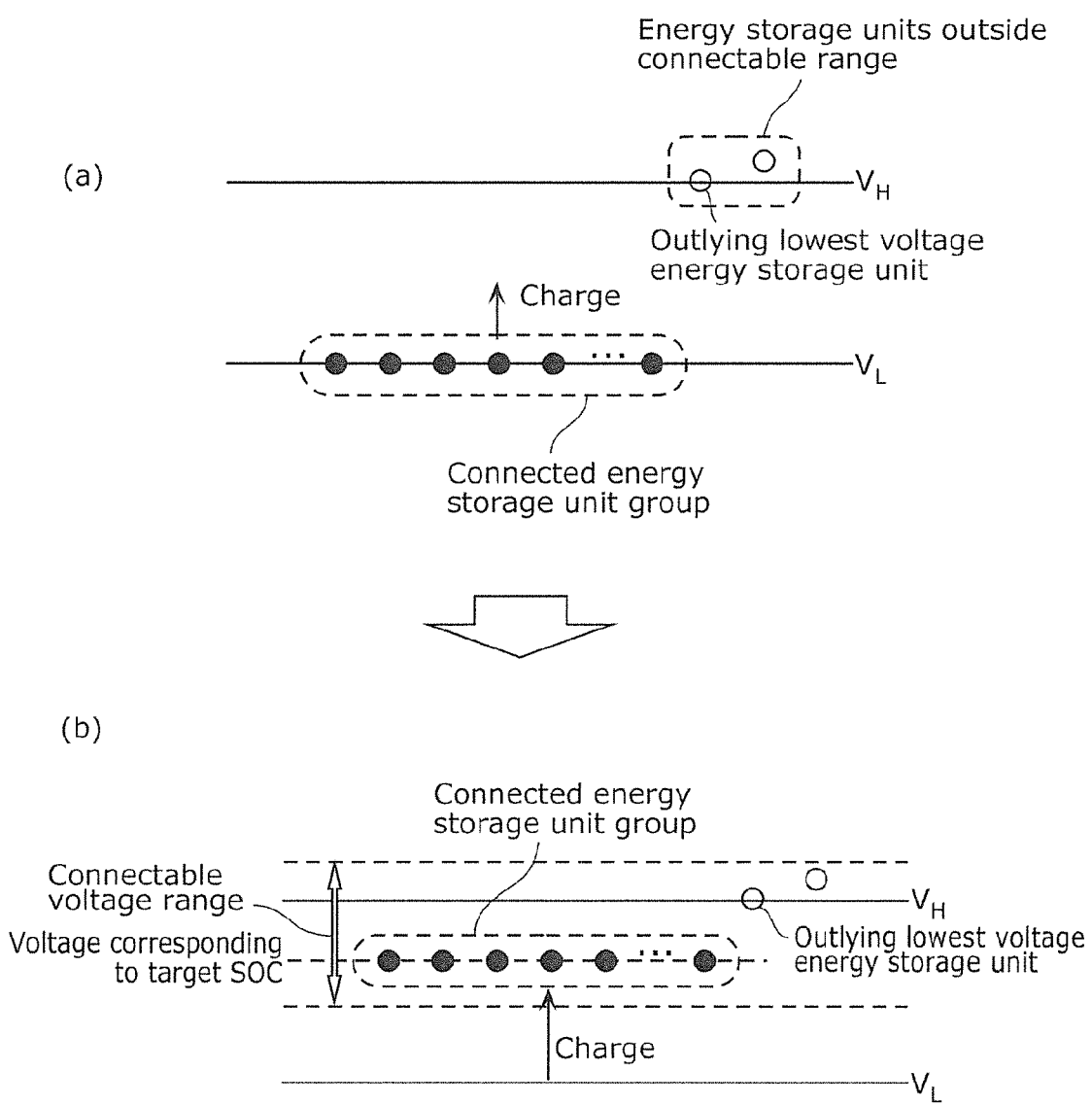
FIGS. 14a-b are diagrams illustrating the processing for acquiring information for charging energy storage units performed by the charge/discharge information acquiring unit according to Embodiment 1 of the present invention.

FIG. 13 is a flowchart illustrating an example of processing for acquiring information for charging energy storage units 200 performed by the charge/discharge information acquiring unit 120 according to Embodiment 1 of the present invention. FIG. 14 is a diagram illustrating the processing for acquiring information for charging energy storage units 200 performed by the charge/discharge information acquiring unit 120 according to Embodiment 1 of the present invention.

As shown in FIG. 13, first, the target SOC calculation unit 121 determines whether or not the energy storage units 200 in the connectable range are connected in parallel. If it determines that the energy storage units 200 are connected in parallel, the target SOC calculation unit 121 then acquires the SOC of the connected energy storage unit group and the SOC of the outlying lowest voltage energy storage unit (S402).

It is assumed here that a connected energy storage unit group has been formed by the user turning on the breakers 220 of the energy storage units 200 in the connectable range so as to connect in parallel the energy storage units 200 in the connectable range. Then, the target SOC calculation unit 121 determines whether or not the breakers 220 of the energy storage units 200 in the connectable range have been turned on. If the target SOC calculation unit 121 determines that the breakers 220 have been turned on, then it acquires the SOC of the connected energy storage unit group and the SOC of the outlying lowest voltage energy storage unit. The target SOC calculation unit 121 determines whether or not the breakers 220 have been turned on by acquiring information indicating whether or not the breakers 220 have been turned on from the energy storage units 200 or from input of the user.

Then, the target SOC calculation unit 121 calculates a target SOC that is the target value for the SOC of the connected energy storage unit group (S404). Here, if the SOC of the connected energy storage unit group is excessively higher than the SOC of the outlying lowest voltage energy storage unit, the outlying lowest voltage energy storage unit cannot be connected in parallel to the connected energy storage unit group. This is because the energy storage units 200 are configured, taking into consideration the influence on the load, so as to be incapable of discharging electricity from the energy storage units 200 to the load while the energy storage units 200 are connected in parallel. For this reason, it is preferable that the SOC of the connected energy storage unit group is less than or equal to the SOC of the outlying lowest voltage energy storage unit.

Accordingly, as shown in FIG. 14, the target SOC calculation unit 121 calculates the target SOC such that the target SOC is less than or equal to the SOC of the outlying lowest voltage energy storage unit and is greater than or equal to the lowest value for the SOC allowed for parallel connection of the outlying lowest voltage energy storage unit to the connected energy storage unit group.

To be specific, the target SOC calculation unit 121 calculates the target SOC by using, for example, the following Equation 2:

$$\text{Target SOC} = \text{SOC}(L) + \{\text{SOC}(H) - \text{SOC}(L)\} \times d \quad \text{(Equation 2)},$$

where SOC (L) represents the SOC of the connected energy storage unit group, SOC (H) represents the SOC of the outlying lowest voltage energy storage unit, and d represents a charge amount reduction factor. Note that d is the value determined, taking into consideration changes and errors of the actual capacity of batteries that are caused by deterioration, so as to prevent the connected energy storage unit group from being overcharged, and can be a constant set to an installation-specific optimal value ranging from 0.5 to 1.0.

Returning to FIG. 13, next, the charge amount calculation unit 122 calculates the amount of charge for charging the connected energy storage unit group such that the SOC of the connected energy storage unit group matches the target SOC (S406). Then, the charge amount calculation unit 122 outputs information for charging the connected energy storage unit group to the display unit 130 based on the calculated amount of charge.

Then, the display unit 130 causes the display screen 150 to display the information for charging the connected energy storage unit group (S408). That is, the display unit 130 causes the display screen 150 to display, as the information for connecting the energy storage units 200 outside the connectable range in parallel to the connected energy storage unit group, a message for prompting the user to perform charging. For example, the display unit 130 causes the display screen 150 to display a message informing a start of charging, a message informing a stop of charging, or a message instructing the user to wait for the voltage to settle after charging is stopped. The user performs charging of the energy storage units 200 included in the connected energy storage unit group in accordance with the guidance.

The processing for acquiring information for charging energy storage units 200 performed by the charge/discharge information acquiring unit 120 (S108 in FIG. 5) thereby ends.

As described above, with the connection information acquiring apparatus 100 according to Embodiment 1 of the present invention, a connectable range of energy storage units 200 is determined and acquired, and then information is acquired, the information being for charging or discharging a connected energy storage unit group in the acquired connectable range such that energy storage units 200 outside the connectable range can be connected in parallel to the connected energy storage unit group. With this configuration, by connecting the connected energy storage unit group in parallel to the energy storage units 200 outside the connectable range after the connected energy storage unit group has been charged or discharged by using the acquired information, it is possible to prevent an excessive amount of cross current from flowing when a plurality of energy storage units 200 are connected in parallel.

Also, the charge/discharge information acquiring unit 120 makes a comparison between the voltage of the connected energy storage unit group and the voltage of the energy storage units 200 outside the connectable range so as to acquire information for charging or discharging the connected energy storage unit group, whereby it is possible to acquire information appropriate to prevent an excessive amount of cross current from flowing.

Also, the connection information acquiring apparatus 100 acquires, as the connectable range, a range of energy storage units 200 that can be connected in parallel and includes a lowest voltage energy storage unit, and acquires information for charging the connected energy storage unit group, whereby a plurality of energy storage units 200 can be connected in parallel without discharging the energy storage units 200.

Also, when the energy storage units 200 included in the first low voltage energy storage unit group are connected in parallel by assuming that they have the same voltage as the voltage of the lowest voltage energy storage unit, and then the first low voltage energy storage unit group and the first highest voltage energy storage unit are connected in parallel, a cross current flowing between the first low voltage energy storage unit group and the first highest voltage energy storage unit takes the greatest value. Also, the current flowing from the first highest voltage energy storage unit takes a greater value than the current flowing from each of the energy storage units 200 included in the first low voltage energy storage unit group. Accordingly, the connectable range acquiring unit 110 can acquire the connectable range by, if it determines that the current flowing from the first highest voltage energy storage unit has a value less than or equal to the first tolerance value, designating the energy storage units 200 included in the first highest voltage energy storage unit as the connectable range.

Also, when the energy storage units 200 included in the second low voltage energy storage unit group are connected in parallel by assuming that they have the same voltage as the voltage of the lowest voltage energy storage unit, and then the second low voltage energy storage unit group and the second highest voltage energy storage unit are connected in parallel, a cross current flowing between the second low voltage energy storage unit group and the second highest voltage energy storage unit takes the greatest value. Also, the current flowing from the second highest voltage energy storage unit takes a greater value than the current flowing from each of the energy storage units 200 included in the second low voltage energy storage unit group. Accordingly, the connectable range acquiring unit 110 can acquire the connectable range by, if it determines that the current flowing from the second highest voltage energy storage unit has a value less than or equal to the first tolerance value, designating the first low voltage energy storage unit group as the connectable range. Also, if the connectable range acquiring unit 110 determines that the current flowing from the second highest voltage energy storage unit has a value greater than the first tolerance value, then it updates the first low voltage energy storage unit group and the second highest voltage energy storage unit with an energy storage unit group and an energy storage unit that are next subjected to determination, and then makes a determination in the same manner as described above. The connectable range acquiring unit 110 can thereby determine and acquire the connectable range.

Also, the charge/discharge information acquiring unit 120 acquires information for charging the connected energy storage unit group such that the voltage of the connected energy storage unit group falls within a voltage range allowed for parallel connection of the connected energy storage unit group to the outlying lowest voltage energy storage unit. With this configuration, by connecting the outlying lowest voltage energy storage unit in parallel to the connected energy storage unit group after the connected energy storage unit group has been charged by using the acquired information, it is possible to prevent an excessive amount of cross current from flowing when the energy storage units are connected.

Also, the charge/discharge information acquiring unit 120 sets the target value for the SOC of the connected energy storage unit group to a lower value, and it is thereby possible to prevent the amount of charge for charging the connected energy storage unit group from taking an excessively great value. Accordingly, the occurrence of a need to discharge the connected energy storage unit group caused by the connected energy storage unit group being overcharged can be prevented.

Also, if the voltage of the connected energy storage unit group after being charged is too high, it is necessary to discharge the connected energy storage unit group. However, depending on the user, it may not be possible to discharge the connected energy storage unit group. In this case, the connectable range acquiring unit 110 can perform processing such as alerting the user not to connect the outlying lowest voltage energy storage unit to the connected energy storage unit group by acquiring information indicating that the outlying lowest voltage energy storage unit cannot be connected to the connected energy storage unit group.

Also, the connectable range acquiring unit 110 acquires the connectable range again after the connected energy storage unit group has been charged or discharged, and it is thereby possible to further acquire information for preventing an excessive amount of cross current from flowing when a plurality of energy storage units 200 are connected in parallel.

Also, in the case where the energy storage units 200 are lithium ion secondary batteries, generally, the tolerance value for the cross current flowing into the energy storage units 200 is smaller than the tolerance value for the cross current flowing out of the energy storage units 200. For this reason, when two energy storage units 200 are connected in parallel, it is preferable to compare the current flowing into the energy storage units 200 with a tolerance value. Accordingly, the connectable range acquiring unit 110 can more accurately determine whether or not the two energy storage units 200 can be connected in parallel by determining whether or not the current flowing into the other energy storage unit 200 has a value less than or equal to the second tolerance value.

Variation 1 of Embodiment 1

Variation 1 of Embodiment 1 will be described next. In Embodiment 1 described above, a configuration is used in which the energy storage units 200 cannot discharge electricity to the load while they are connected in parallel. However, in the present variation, a configuration is used in which the energy storage units 200 are capable of discharging electricity when they are connected in parallel by installing a dummy load.

Figure 15:
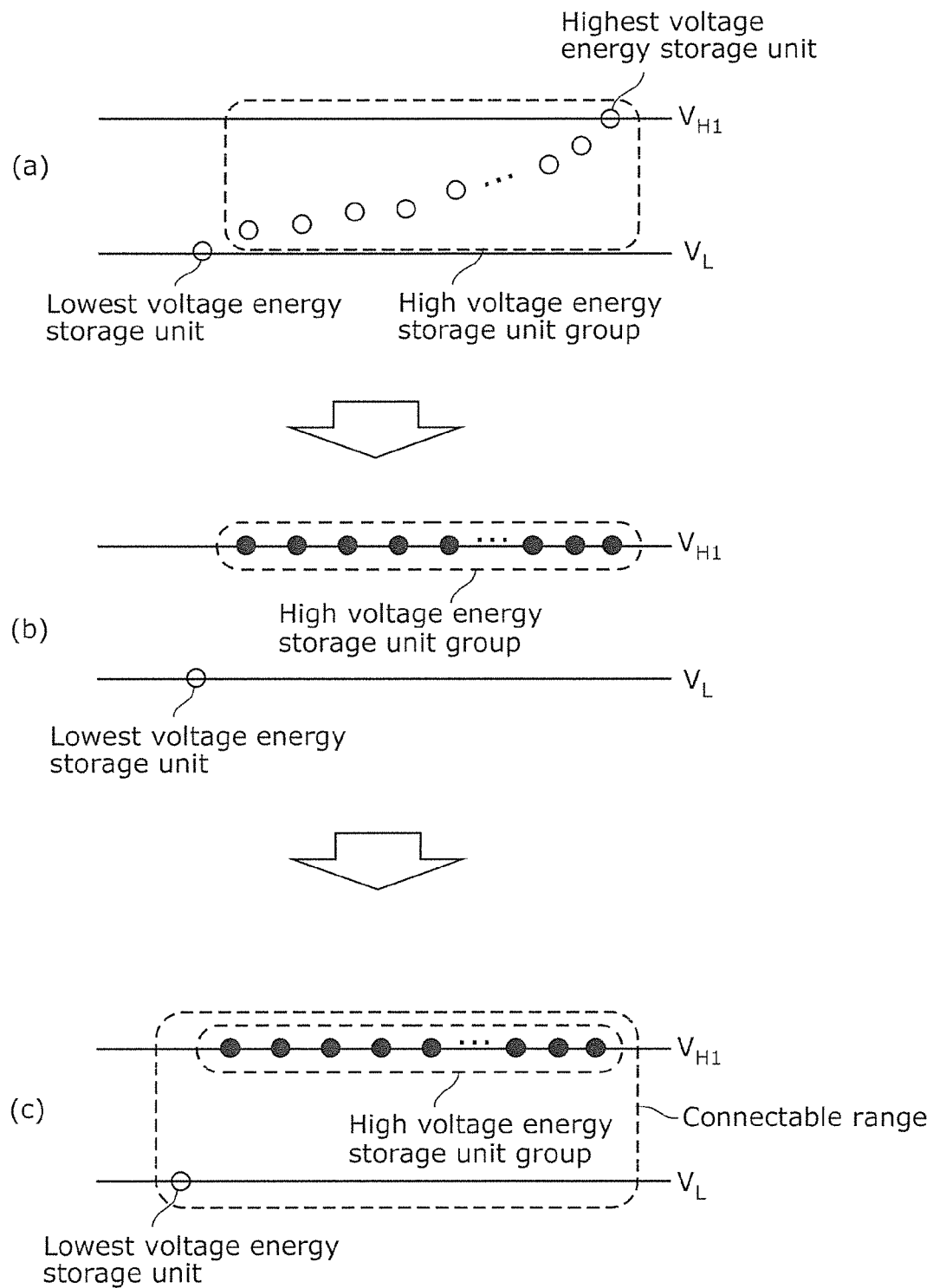
FIGS. 15a-c are diagrams illustrating processing for connecting energy storage units in parallel performed by a connection information acquiring apparatus according to Variation 1 of Embodiment 1 of the present invention.

FIG. 15 is a diagram illustrating processing for connecting energy storage units 200 in parallel performed by a connection information acquiring apparatus 100 according to Variation 1 of Embodiment 1 of the present invention.

As shown in the diagram, in the present variation, the connectable range acquiring unit 110 acquires a connectable range that is a range of energy storage units 200 that can be connected in parallel and includes a highest voltage energy storage unit that is an energy storage unit 200 having the highest voltage among a plurality of energy storage units 200.

That is, the tolerance value determining unit 111 determines whether or not the current flowing into the lowest voltage energy storage unit has a value less than or equal to the second tolerance value on the assumption that the energy storage units 200 included in a high voltage energy storage unit group are connected in parallel by assuming that the energy storage units 200 included in the high voltage energy storage unit group have a voltage equal to the voltage of a highest voltage energy storage unit, and that the high voltage energy storage unit group and the lowest voltage energy storage unit are connected in parallel. As used herein, the highest voltage energy storage unit refers to an energy storage unit 200 having the highest voltage among a plurality of energy storage units 200, and the high voltage energy storage unit group refers to a group of energy storage units 200 in the plurality of energy storage units 200 other than the lowest voltage energy storage unit.

If the tolerance value determining unit 111 determines that the current flowing into the lowest voltage energy storage unit has a value less than or equal to the second tolerance value, the connectable range determining unit 112 designates a plurality of energy storage units 200 being composed of the lowest voltage energy storage unit and the high voltage energy storage unit group, as the connectable range.

If the tolerance value determining unit 111 determines that the current flowing into the lowest voltage energy storage unit has a value greater than the second tolerance value, the connectable range determining unit 112 designates a plurality of energy storage units 200 excluding the lowest voltage energy storage unit as the connectable range by performing the same processing as in Embodiment 1 described above.

Also, in the present variation, the voltage of the energy storage units 200 included in the connected energy storage unit group is higher the voltage of the energy storage units 200 outside the connectable range. For this reason, the charge/discharge information acquiring unit 120 determines that the voltage of the energy storage units 200 included in the connected energy storage unit group in which the energy storage units 200 in the connectable range are connected in parallel is higher than the voltage of the energy storage units 200 outside the connectable range.

If the charge/discharge information acquiring unit 120 determines that the voltage of the energy storage units 200 included in the connected energy storage unit group is higher than the voltage of the energy storage units 200 outside the connectable range, then it acquires information for discharging the connected energy storage unit group such that the energy storage units 200 outside the connectable range can be connected in parallel to the connected energy storage unit group in which the energy storage units 200 in the connectable range are connected in parallel. That is, the charge/discharge information acquiring unit 120 acquires information for discharging the connected energy storage unit group such that the voltage of the connected energy storage unit group falls within a voltage range allowed for parallel connection of the energy storage units 200 outside the connectable range to the connected energy storage unit group.

Also, when the connected energy storage unit group has been discharged, the connectable range acquiring unit 110 acquires, as the connectable range, a range of energy storage units 200 that can be connected in parallel and includes the discharged connected energy storage unit group of the plurality of energy storage units 200.

As described above, with the connection information acquiring apparatus 100 according to the present variation, information for connecting a plurality of energy storage units 200 in parallel can be acquired, and the same effects as those of Embodiment 1 described above can be obtained.

Variation 2 of Embodiment 1

Variation 2 of Embodiment 1 will be described next. In the present variation, as in Variation 1 described above, the configuration is used in which the energy storage units 200 are capable of discharging electricity when the energy storage units 200 are connected in parallel. Also, in the present variation, it is assumed that the connectable range acquiring unit 110 acquires, as the connectable range, a range of energy storage units 200 that can be connected in parallel and does not include the lowest voltage energy storage unit and the highest voltage energy storage unit.

In this case, the charge/discharge information acquiring unit 120 acquires information for charging or discharging a connected energy storage unit group in order to connect the energy storage units 200 outside the connectable range in parallel to the connected energy storage unit group in which the energy storage units 200 in the connectable range are connected in parallel.

That is, in order to connect the energy storage units 200 outside the connectable range having a voltage higher than the voltage of the connected energy storage unit group in parallel to the connected energy storage unit group, as in Embodiment 1 described above, the charge/discharge information acquiring unit 120 acquires information for charging the connected energy storage unit group. Also, in order to connect the energy storage units 200 outside the connectable range having a voltage lower than the voltage of the connected energy storage unit group in parallel to the connected energy storage unit group, as in Variation 1 described above, the charge/discharge information acquiring unit 120 acquires information for discharging the connected energy storage unit group.

Then, when the connected energy storage unit group has been charged or discharged, the connectable range acquiring unit 110 acquires, as the connectable range, a range of energy storage units 200 that can be connected in parallel and includes the charged or discharged connected energy storage unit group among the plurality of energy storage units 200.

As described above, with the connection information acquiring apparatus 100 according to the present variation, information for connecting a plurality of energy storage units 200 in parallel can be acquired, and the same effects as those of Embodiment 1 described above can be obtained.

Variation 3 of Embodiment 1

Variation 3 of Embodiment 1 will be described next. In Embodiment 1 described above, a configuration is used in which the connectable range acquiring unit 110 acquires a connectable range by determining whether or not the current flowing through the energy storage units 200 has a less than or equal to a tolerance value. However, in the present variation, a configuration is used in which the connectable range acquiring unit 110 acquires a connectable range by determining whether the potential difference between energy storage units 200 is less than or equal to a tolerance value.

Figure 16:
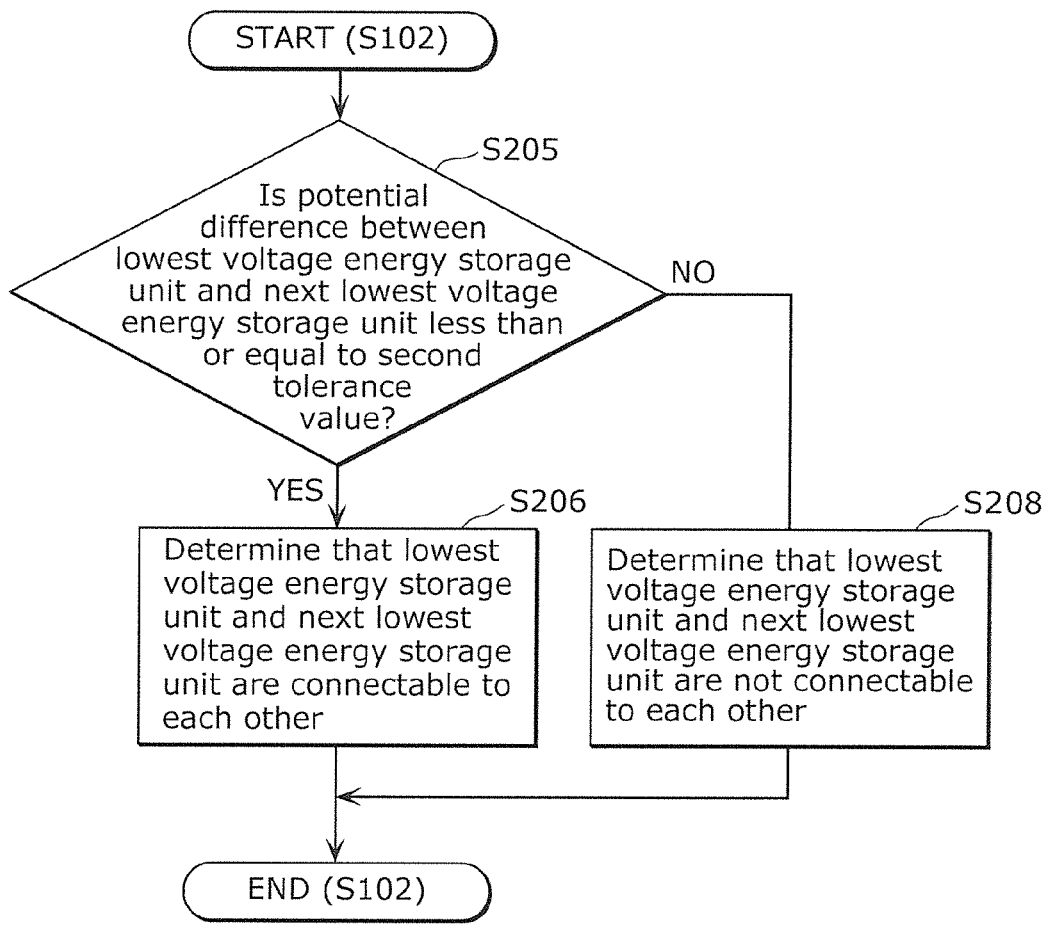
FIG. 16 is a flowchart illustrating an example of processing for determining whether or not a lowest voltage energy storage unit and a next lowest voltage energy storage unit can be connected performed by a connectable range acquiring unit according to Variation 3 of Embodiment 1 of the present invention.
Figure 17:
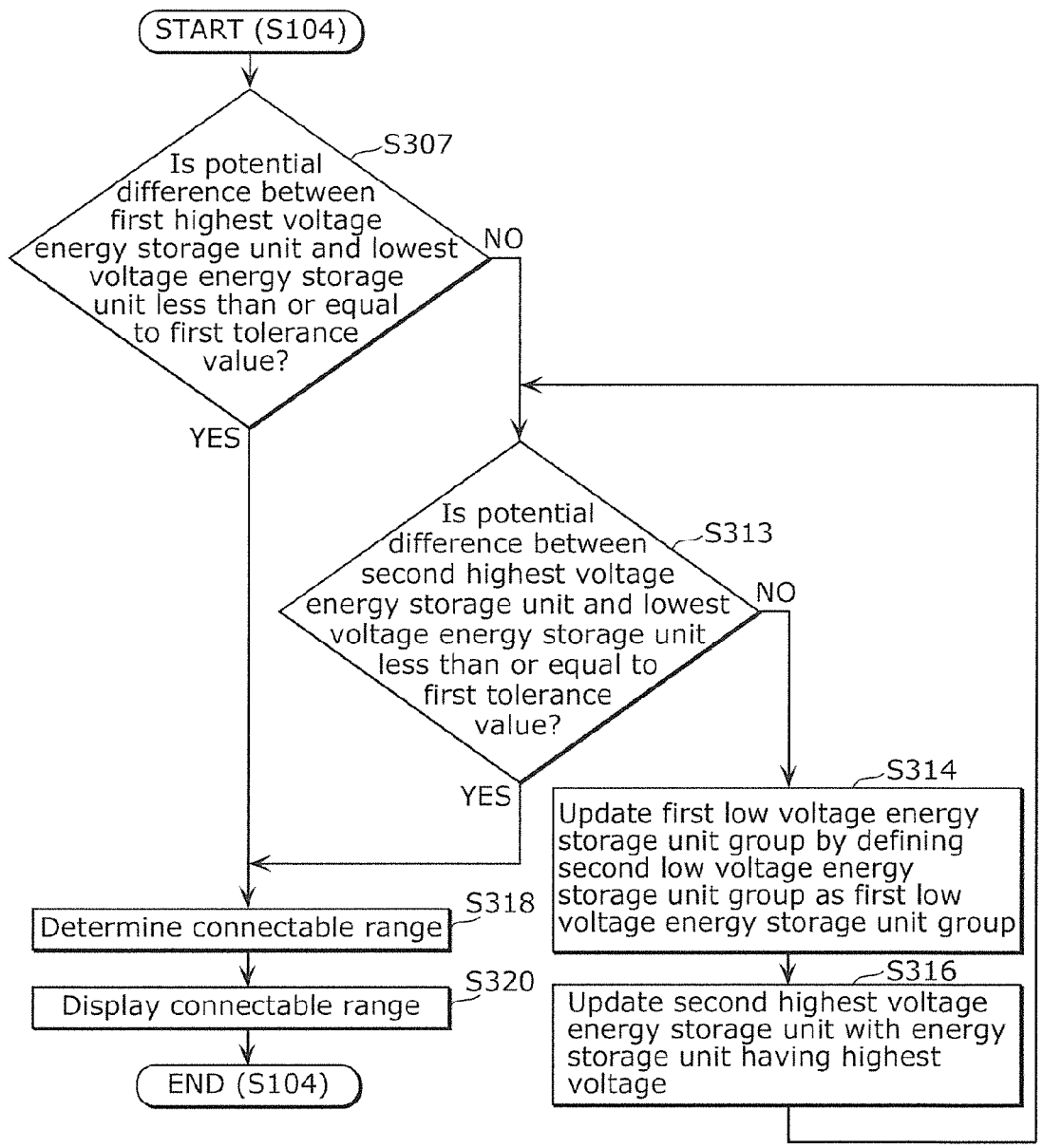
FIG. 17 is a flowchart illustrating an example of processing for acquiring a connectable range performed by the connectable range acquiring unit according to Variation 3 of Embodiment 1 of the present invention.

In the present variation, instead of the processing of Embodiment 1 shown in FIGS. 8 and 10, processing shown in FIGS. 16 and 17 is performed. FIG. 16 is a flowchart illustrating an example of processing for determining whether or not a lowest voltage energy storage unit and a next lowest voltage energy storage unit can be connected (S102 in FIG. 5) performed by a connectable range acquiring unit 110 according to Variation 3 of Embodiment 1 of the present invention. FIG. 17 is a flowchart illustrating an example of processing for acquiring a connectable range (S104 in FIG. 5) performed by the connectable range acquiring unit 110 according to Variation 3 of Embodiment 1 of the present invention.

As shown in these diagrams, the connectable range acquiring unit 110 acquires, as the connectable range, a range of energy storage units 200 that can be connected in parallel in which the potential difference between a plurality of energy storage units 200 is less than or equal to a tolerance value. The following description is given focusing on processing that is different from the processing of Embodiment 1 shown in FIGS. 8 and 10.

First, as shown in FIG. 16, the tolerance value determining unit 111 determines whether or not the potential difference between a lowest voltage energy storage unit and a next lowest voltage energy storage unit having the next lowest voltage after the lowest voltage energy storage unit is less than or equal to a second tolerance value (S205). The second tolerance value as used in the present variation refers to the potential difference between a lowest voltage energy storage unit and a next lowest voltage energy storage unit on the assumption that these energy storage units are connected in parallel, the potential difference being a potential difference at which the current flowing from the next lowest voltage energy storage unit to the lowest voltage energy storage unit is allowable.

The second tolerance value is stored in the tolerance value data 141 as shown in FIG. 3, and the tolerance value determining unit 111 determines whether or not the potential difference between the lowest voltage energy storage unit and the next lowest voltage energy storage unit is less than or equal to the second tolerance value by acquiring the second tolerance value from the tolerance value data 141.

Then, if the tolerance value determining unit 111 determines that the potential difference between the lowest voltage energy storage unit and the next lowest voltage energy storage unit is less than or equal to the second tolerance value (YES in S205), the connectable range determining unit 112 determines that the lowest voltage energy storage unit and the next lowest voltage energy storage unit are connectable to each other (S206).

If, on the other hand, the tolerance value determining unit 111 determines that the potential difference between the lowest voltage energy storage unit and the next lowest voltage energy storage unit is greater than the second tolerance value (NO in S205), the connectable range determining unit 112 determines that the lowest voltage energy storage unit and the next lowest voltage energy storage unit are not connectable to each other (S208).

In this way, the connectable range acquiring unit 110 determines whether or not the potential difference between two energy storage units 200 out of a plurality of energy storage units 200 is less than or equal to a second tolerance value, the second tolerance value being the potential difference between the two energy storage units 200 when the current flowing from one of the two energy storage units 200 to the other energy storage unit is allowable on the assumption that the two energy storage units 200 are connected in parallel.

Then, if it is determined that the potential difference between the two energy storage units 200 is less than or equal to the second tolerance value, the connectable range acquiring unit 110 determines that the two energy storage units 200 can be connected in parallel.

Also, as shown in FIG. 17, first, the tolerance value determining unit 111 determines whether or not the potential difference between a first highest voltage energy storage unit having the highest voltage among a plurality of energy storage units 200 and a lowest voltage energy storage unit having the lowest voltage among the plurality of energy storage units 200 is less than or equal to a first tolerance value (S307).

The first tolerance value as used in the present variation refers to the tolerance value for the potential difference between two energy storage units 200. The first tolerance value is stored in the tolerance value data 141 as shown in FIG. 3, and the tolerance value determining unit 111 determines whether or not the potential difference between the first highest voltage energy storage unit and the lowest voltage energy storage unit is less than or equal to the first tolerance value by acquiring the first tolerance value from the tolerance value data 141.

Then, if the tolerance value determining unit 111 determines that the potential difference between the first highest voltage energy storage unit and the lowest voltage energy storage unit is less than or equal to the first tolerance value (YES in S307), the connectable range determining unit 112 determines the plurality of energy storage units 200 as the connectable range (S318).

If, on the other hand, the tolerance value determining unit 111 determines that the potential difference between the first highest voltage energy storage unit and the lowest voltage energy storage unit is greater than the first tolerance value (NO in S307), the tolerance value determining unit 111 determines whether or not the potential difference between a second highest voltage energy storage unit having the highest voltage among a first low voltage energy storage unit group and the lowest voltage energy storage unit is less than or equal to the first tolerance value (S313). As used herein, the first low voltage energy storage unit group refers to a group of energy storage units 200 in the plurality of energy storage units 200 other than the first highest voltage energy storage unit.

Then, if the tolerance value determining unit 111 determines that the potential difference between the second highest voltage energy storage unit and the lowest voltage energy storage unit is less than or equal to the first tolerance value (YES in S313), the connectable range determining unit 112 designates the first low voltage energy storage unit group as the connectable range (S318).

If, on the other hand, the tolerance value determining unit 111 determines that the potential difference between the second highest voltage energy storage unit and the lowest voltage energy storage unit is greater than the first tolerance value (NO in S313), the tolerance value determining unit 111 updates the first low voltage energy storage unit group by defining the second low voltage energy storage unit group as the first low voltage energy storage unit group, the second low voltage energy storage unit group being composed of the energy storage units in the first low voltage energy storage unit group other than the second highest voltage energy storage unit (S314). Also, the tolerance value determining unit 111 updates the second highest voltage energy storage unit with an energy storage unit having the highest voltage in the first low voltage energy storage unit group (S316).

Then, the tolerance value determining unit 111 determines again whether or not the potential difference between the updated second highest voltage energy storage unit and the lowest voltage energy storage unit is less than or equal to the first tolerance value (S313).

As described above, with the connection information acquiring apparatus 100 according to the present variation, the same effects as those of Embodiment 1 described above can be obtained. That is, the largest cross current flows when the first highest voltage energy storage unit, which is the energy storage unit 200 having the highest voltage, and the lowest voltage energy storage unit, which is the energy storage unit 200 having the lowest voltage, among the plurality of energy storage units 200 are connected. For this reason, if the connectable range acquiring unit 110 determines that the potential difference between the first highest voltage energy storage unit and the lowest voltage energy storage unit in the plurality of energy storage units 200 is than or equal to the first tolerance value, the connectable range acquiring unit 110 determines the plurality of energy storage units 200 as the connectable range. The connectable range acquiring unit 110 can thereby acquire the connectable range with ease.

Also, the largest current flows when the second highest voltage energy storage unit, which is the energy storage unit 200 having the highest voltage, and the lowest voltage energy storage unit, which is the energy storage unit 200 having the lowest voltage, in the first low voltage energy storage unit group are connected. For this reason, the connectable range acquiring unit 110 can acquire the connectable range by designating, if it determines that the potential difference between the second highest voltage energy storage unit and the lowest voltage energy storage unit is less than or equal to the first tolerance value, the first low voltage energy storage unit group as the connectable range. Also, if the connectable range acquiring unit 110 determines that the potential difference is greater than the first tolerance value, the connectable range acquiring unit 110 updates the first low voltage energy storage unit group and the second highest voltage energy storage unit with an energy storage unit group and an energy storage unit that are next subjected to determination, and then makes a determination in the same manner as described above. The connectable range acquiring unit 110 can thereby determine and acquire the connectable range with ease.

Also, in the case where the energy storage units 200 are lithium ion secondary batteries, generally, the tolerance value for the cross current flowing into the energy storage units 200 is smaller than the tolerance value for the cross current flowing out of the energy storage units 200. Accordingly, in the case where two energy storage units 200 are connected in parallel, it is preferable that to compare the potential difference between the two energy storage units 200 with a second tolerance value, the second tolerance value being the potential difference when the magnitude of the current flowing into one of the energy storage units 200 is allowable. Accordingly, the connectable range acquiring unit 110 can more accurately determine whether or not the two energy storage units 200 can be connected in parallel by determining whether or not the potential difference is less than or equal to the second tolerance value.

In the foregoing, the connection information acquiring apparatuses 100 and the energy storage systems 10 according to Embodiment 1 of the present invention and variations thereof have been described, but the present invention is not limited to the embodiment and the variations thereof. That is, the embodiment and the variations thereof disclosed herein should be considered as illustrative in all aspects and not restrictive. The scope of the present invention is indicated by the appended claims rather than by the foregoing description. All variations and modifications falling within the equivalency range of the appended claims are intended to be embraced therein.

For example, in Embodiment 1 given above, the connectable range acquiring unit 110 acquires the connectable range by sorting energy storage units 200 in the order of increasing voltage. However, sorting energy storage units 200 in the order of increasing voltage is not a requirement, and the connectable range acquiring unit 110 may be configured to acquire the connectable range without sorting energy storage units 200.

Also, in Embodiment 1 and variations thereof given above, in order to connect energy storage units 200 in parallel, the user turns on the breakers 220 included in the energy storage units 200 to be connected, or the energy storage units 200 to be charged are charged. However, a configuration is possible in which a plurality of energy storage units 200 are connected in parallel by the connection information acquiring apparatus 100 automatically turning on the breakers 220 included in the energy storage units 200 or charging the energy storage units 200 to be charged.

Also, in Embodiment 1 and variations thereof given above, the connection information acquiring apparatus 100 includes a connectable range acquiring unit 110, a charge/discharge information acquiring unit 120, a display unit 130, and a memory unit 140, the connectable range acquiring unit 110 includes a tolerance value determining unit 111 and a connectable range determining unit 112, and the charge/discharge information acquiring unit 120 includes a target SOC calculation unit 121 and a charge amount calculation unit 122. However, as shown in FIG. 18, it is sufficient that the connection information acquiring apparatus includes at least a connectable range acquiring unit and a charge/discharge information acquiring unit.

Figure 18:
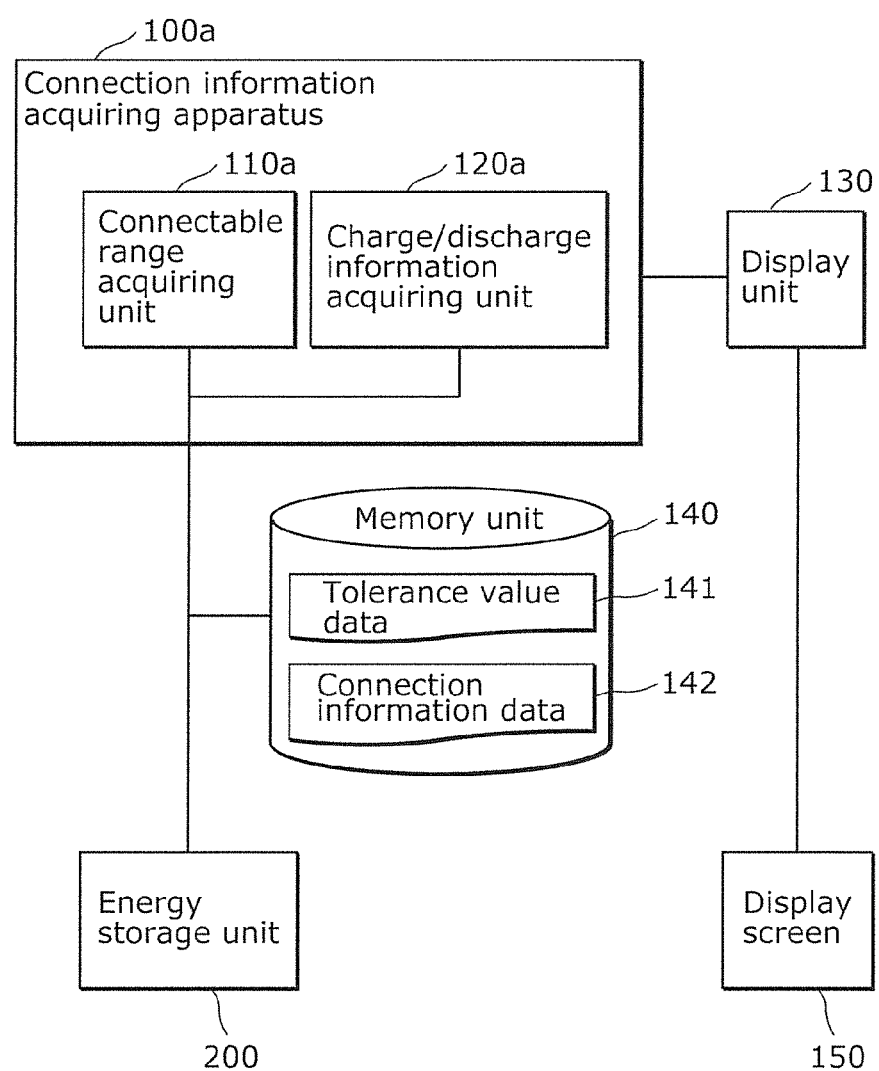
FIG. 18 is a block diagram showing a minimum configuration of the connection information acquiring apparatus according to Embodiment 1 of the present invention.

FIG. 18 is a block diagram showing a minimum configuration of the connection information acquiring apparatus according to Embodiment 1 of the present invention. As shown in the diagram, the connection information acquiring apparatus 100a includes a connectable range acquiring unit 110a and a charge/discharge information acquiring unit 120a that have the same functions as those of Embodiment 1 described above, and acquires information for connecting energy storage units 200 in parallel by exchanging information with a display unit 130 and a memory unit 140 that are provided outside the connectable range acquiring unit 110a. Also, it is sufficient that the connectable range acquiring unit 110a can acquire the connectable range, and thus does not need to include a tolerance value determining unit 111 and a connectable range determining unit 112 as in Embodiment 1 described above. Likewise, it is sufficient that the charge/discharge information acquiring unit 120a can acquire information for charging the connected energy storage unit group, and thus does not need to include a target SOC calculation unit 121 and a charge amount calculation unit 122 as in Embodiment 1 described above.

Figure 19:
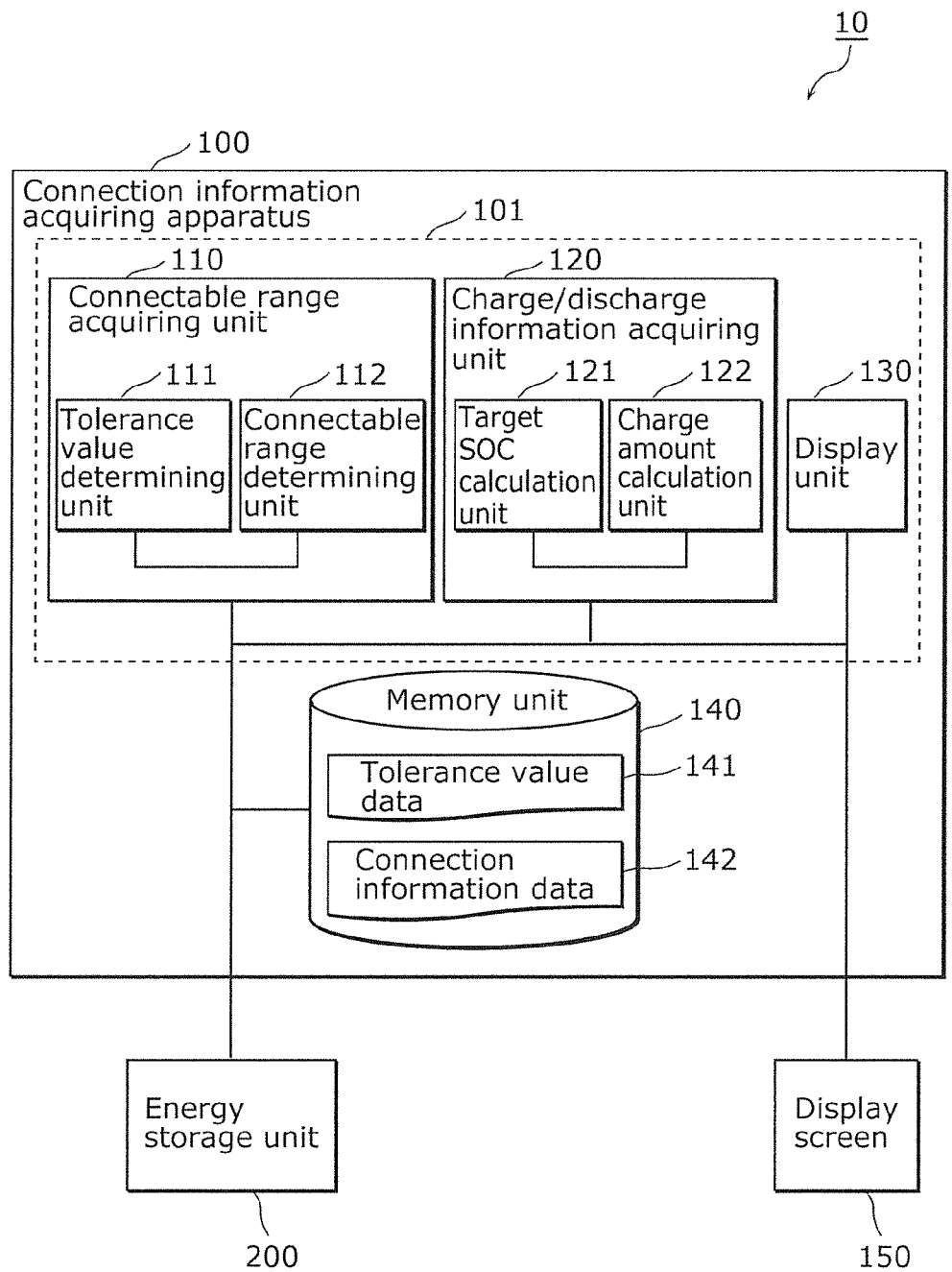
FIG. 19 is a block diagram showing a configuration that implements the connection information acquiring apparatus according to Embodiment 1 of the present invention with the use of an integrated circuit.

The processing units provided in the connection information acquiring apparatus 100 according to Embodiment 1 of the present invention are typically implemented as an LSI (Large Scale Integration) that is an integrated circuit. That is, as shown in FIG. 19, the present invention is implemented as an integrated circuit 101 including a connectable range acquiring unit 110, a charge/discharge information acquiring unit 120, and the like. FIG. 19 is a block diagram showing a configuration that implements the connection information acquiring apparatus 100 according to Embodiment 1 of the present invention with the use of an integrated circuit.

Embodiment 2

An energy storage system according to the present embodiment includes, instead of the connection information acquiring apparatus 100 of Embodiment 1, a connection information acquiring apparatus 400. Other constituent elements of the energy storage system according to the present embodiment are the same as those of the energy storage system 10 of Embodiment 1 shown in FIG. 1, and thus a description thereof is omitted here.

The connection information acquiring apparatus 400 is a circuit board on which a circuit for acquiring information for connecting energy storage units 200 in parallel is mounted. To be specific, the connection information acquiring apparatus 400 is connected to a plurality of energy storage units 200, and acquires information for connecting a plurality of energy storage units 200 in parallel by acquiring information from the plurality of energy storage units 200. To be more specific, the connection information acquiring apparatus 400 acquires information connecting an energy storage unit 200 in parallel to a plurality of energy storage units 200 that are connected in parallel. A functional configuration of the connection information acquiring apparatus 400 will be described later in detail.

Next is a detailed description of a functional configuration of the connection information acquiring apparatus 400.

Figure 20:
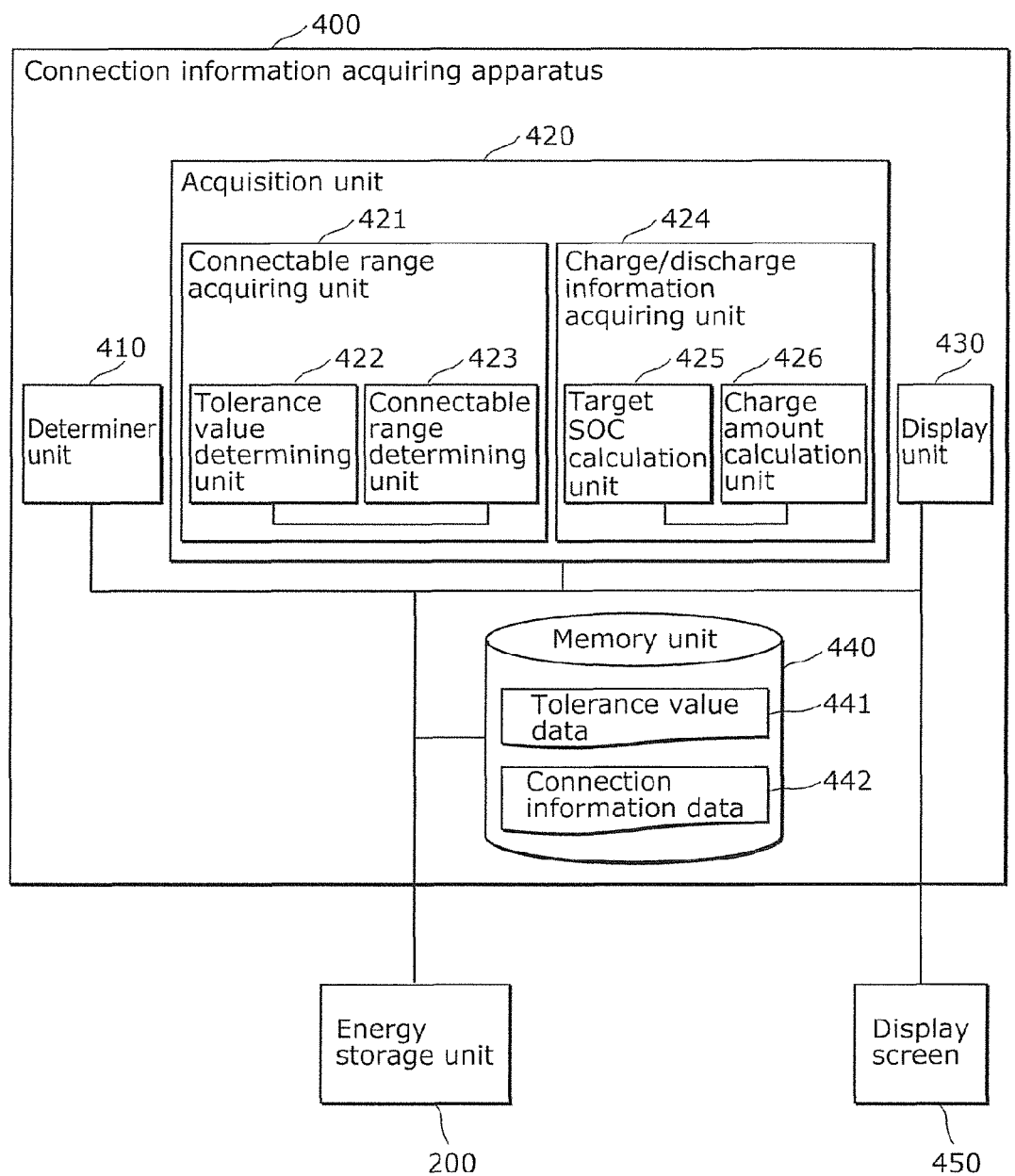
FIG. 20 is a block diagram showing a functional configuration of a connection information acquiring apparatus according to Embodiment 2 of the present invention.

FIG. 20 is a block diagram illustrating a functional configuration of the connection information acquiring apparatus 400 according to Embodiment 2 of the present invention. FIG. 21 is a diagram showing an example of tolerance value data 441 stored in a memory unit 440 according to Embodiment 2 of the present invention. FIG. 22 is a diagram showing an example of connection information data 442 stored in the memory unit 440 according to Embodiment 2 of the present invention.

The connection information acquiring apparatus 400 is an apparatus that acquires information for connecting energy storage units 200 in parallel. As shown in the diagram, the connection information acquiring apparatus 400 includes a determiner unit 410, an acquisition unit 420, a display unit 430, and a memory unit 440. The memory unit 440 stores therein tolerance value data 441 and connection information data 442. That is, the connection information acquiring apparatus 400 is configured to include the determiner unit 410 in addition to the structural elements of the connection information acquiring apparatus 100 according to Embodiment 1 described above.

The determiner unit 410 determines a magnitude relationship between the voltage of a first connected energy storage unit group and the voltage of an unconnected energy storage unit group. As used herein, the first connected energy storage unit group refers to a group of energy storage units 200 that are connected in parallel among a plurality of energy storage units 200, and the unconnected energy storage unit group refers to a group of energy storage units 200 that are not included in the first connected energy storage unit group among the plurality of energy storage units 200. The plurality of energy storage units 200 are, for example, a plurality of energy storage units 200 included in the connected energy storage unit group of Embodiment 1.

The acquisition unit 420 acquires information for connecting the first connected energy storage unit group and the energy storage units included in the unconnected energy storage unit group based on the result of determination performed by the determiner unit 410. The acquisition unit 420 includes a connectable range acquiring unit 421 and a charge/discharge information acquiring unit 424.

The connectable range acquiring unit 421 acquires a connectable range that is a range of energy storage units 200 that can be connected in parallel among a plurality of energy storage units 200. That is, the connectable range acquiring unit 421 acquires the connectable range by acquiring information for connecting the first connected energy storage unit group and the energy storage units included in the unconnected energy storage unit group based on the result of determination performed by the determiner unit 410. To be specific, the connectable range acquiring unit 421 acquires, as the connectable range, a range of energy storage units 200 in which the current flowing on the assumption that the energy storage units 200 included in the plurality of energy storage units 200 are connected in parallel has a value less than or equal to a tolerance value.

Also, when a second connected energy storage unit group in which the energy storage units 200 in the connectable range are connected in parallel has been charged or discharged, the connectable range acquiring unit 421 acquires, as the connectable range, a range of energy storage units 200 that can be connected in parallel and includes the charged or discharged second connected energy storage unit group among the plurality of energy storage units 200. Also, the connectable range acquiring unit 421 writes the acquired connectable range (including information indicating that parallel connection is not possible, which will be described later) into the connection information data 442 as shown in FIG. 22, and outputs the acquired connectable range to the display unit 430.

The charge/discharge information acquiring unit 424 acquires information for charging or discharging a second connected energy storage unit group in which the energy storage units 200 in the connectable range are connected in parallel such that the energy storage units 200 outside the connectable range can be connected in parallel to the second connected energy storage unit group. That is, the charge/discharge information acquiring unit 424 acquires information for charging or discharging the second connected energy storage unit group such that the energy storage units outside the connectable range can be connected in parallel to the second connected energy storage unit group, the second connected energy storage unit group being composed of the energy storage units 200 in the connectable range that are connected in parallel and being defined as the connected energy storage unit group.

To be specific, the charge/discharge information acquiring unit 424 acquires information for charging or discharging the second connected energy storage unit group such that the voltage of the second connected energy storage unit group falls within a voltage range allowed for parallel connection of the energy storage units 200 outside the connectable range to the second connected energy storage unit group. Also, the charge/discharge information acquiring unit 424 writes the acquired information for charging the second connected energy storage unit group (target SOC and the amount of charge, which will be described later) into the connection information data 442, and outputs the acquired information to the display unit 430.

The connectable range acquiring unit 421 includes a tolerance value determining unit 422 and a connectable range determining unit 423, and the charge/discharge information acquiring unit 424 includes a target SOC calculation unit 425 and a charge amount calculation unit 426.

First, processing will be described that is performed in the case where the determiner unit 410 determines that the voltage of the unconnected energy storage unit group is higher than the voltage of the first connected energy storage unit group. If the determiner unit 410 determines that the voltage of the unconnected energy storage unit group is higher than the voltage of the first connected energy storage unit group, the connectable range determining unit 423 acquires a connectable range that is a range of energy storage units that can be connected in parallel and includes the first connected energy storage unit group.

To be specific, the tolerance value determining unit 422 determines whether or not the current flowing from a first highest voltage energy storage unit has a value less than or equal to a third tolerance value, on the assumption that the energy storage units 200 included in a first low voltage energy storage unit group are connected in parallel by assuming that they have the same voltage as the voltage of the first connected energy storage unit group, and that the first low voltage energy storage unit group and the first highest voltage energy storage unit are connected in parallel. As used herein, the first highest voltage energy storage unit refers to an energy storage unit 200 having the highest voltage among a plurality of energy storage units 200, and the first low voltage energy storage unit group refers to a group of energy storage units 200 in the plurality of energy storage units 200 other than the first highest voltage energy storage unit.

The third tolerance value refers to the tolerance value for the cross current (discharge current) flowing out of the energy storage units 200. The third tolerance value is stored in the tolerance value data 441 as shown in FIG. 21, and the tolerance value determining unit 422 determines whether or not the current flowing from the first highest voltage energy storage unit has a value less than or equal to the third tolerance value by acquiring the third tolerance value from the tolerance value data 441.

If the tolerance value determining unit 422 determines that the current flowing from the first highest voltage energy storage unit has a value greater than the third tolerance value, then it determines whether or not the current flowing from a second highest voltage energy storage unit has a value less than or equal to the third tolerance value on the assumption that the energy storage units 200 included in a second low voltage energy storage unit group are connected in parallel by assuming that the energy storage units 200 included in the second low voltage energy storage unit group have a voltage equal to the voltage of the first connected energy storage unit group, and that the second low voltage energy storage unit group and the second highest voltage energy storage unit is connected in parallel. As used herein, the second highest voltage energy storage unit refers to an energy storage unit 200 having the highest voltage in the first low voltage energy storage unit group, and the second low voltage energy storage unit group refers to a group of energy storage units 200 in the first low voltage energy storage unit group other than the second highest voltage energy storage unit.

If the tolerance value determining unit 422 determines that the current flowing from the second highest voltage energy storage unit has a value greater than the third tolerance value, then it updates the first low voltage energy storage unit group by defining the second low voltage energy storage unit group as the first low voltage energy storage unit group, updates the second highest voltage energy storage unit with an energy storage unit 200 having the highest voltage in the first low voltage energy storage unit group, and determines whether or not the current flowing from the second highest voltage energy storage unit has a value less than or equal to the third tolerance value.

If the tolerance value determining unit 422 determines that the current flowing from the first highest voltage energy storage unit has a value less than or equal to the third tolerance value, the connectable range determining unit 423 designates a plurality of energy storage units 200 being composed of the first highest voltage energy storage unit and the first low voltage energy storage unit group, as the connectable range.

If the tolerance value determining unit 422 determines that the current flowing from the second highest voltage energy storage unit has a value less than or equal to the third tolerance value, the connectable range determining unit 423 designates the first low voltage energy storage unit group as the connectable range.

Also, if the voltage of the second connected energy storage unit group after being charged is higher than a voltage at which connection to an outlying lowest voltage energy storage unit can be made, the connectable range determining unit 423 acquires information indicating that the outlying lowest voltage energy storage unit cannot be connected to the second connected energy storage unit group. As used herein, the outlying lowest voltage energy storage unit refers to an energy storage unit having the lowest voltage among the energy storage units 200 outside the connectable range.

The target SOC calculation unit 425 determines whether or not the energy storage units 200 in the connectable range are connected in parallel. If the target SOC calculation unit 425 determines that the energy storage units 200 are connected in parallel, it acquires the state of charge (SOC) of the second connected energy storage unit group and the SOC of the outlying lowest voltage energy storage unit. Then, the target SOC calculation unit 425 calculates a target SOC such that the target SOC is less than or equal to the SOC of the outlying lowest voltage energy storage unit and is greater than or equal to the lowest value for the SOC allowed for parallel connection of the outlying lowest voltage energy storage unit to the second connected energy storage unit group, the target SOC being the target value for the SOC of the second connected energy storage unit group. Then, the target SOC calculation unit 425 writes the calculated target SOC into the connection information data 442 as shown in FIG. 22.

The charge amount calculation unit 426 calculates the amount of charge for charging the second connected energy storage unit group such that the SOC of the second connected energy storage unit group matches the target SOC. To be specific, the charge amount calculation unit 426 reads out the target SOC from the connection information data 442 stored in the memory unit 440, and calculates the amount of charge. Then, the charge amount calculation unit 426 writes the calculated amount of charge into the connection information data 442 as shown in FIG. 22.

Next is a description of processing performed in the case where the determiner unit 410 determines that the voltage of the unconnected energy storage unit group is lower than the voltage of the first connected energy storage unit group.

In this case, the tolerance value determining unit 422 determines whether or not the current flowing into a first lowest voltage energy storage unit has a value less than or equal to a first tolerance value on the assumption that the energy storage units 200 included in a first high voltage energy storage unit group are connected in parallel by assuming that the energy storage units 200 included in the first high voltage energy storage unit group have a voltage equal to the voltage of the first connected energy storage unit group, and that the first high voltage energy storage unit group and the first lowest voltage energy storage unit are connected in parallel. As used herein, the first lowest voltage energy storage unit refers to an energy storage unit 200 having the lowest voltage among the plurality of energy storage units 200, and the first high voltage energy storage unit group refers to a group of energy storage units 200 other than the first lowest voltage energy storage unit.

The first tolerance value is the tolerance value for the cross current (charge current) flowing into the energy storage units 200. The first tolerance value is also stored in the tolerance value data 441 as shown in FIG. 21, and the tolerance value determining unit 422 determines whether or not the current flowing into the first lowest voltage energy storage unit has a value less than or equal to the first tolerance by acquiring the first tolerance value from the tolerance value data 441.

If the tolerance value determining unit 422 determines that the current flowing into the first lowest voltage energy storage unit has a value less than or equal to the first tolerance value, the connectable range determining unit 423 designates a plurality of energy storage units 200 being composed of the first high voltage energy storage unit group and the first lowest voltage energy storage unit, as the connectable range. The connectable range acquiring unit 421 thereby acquires, as the connectable range, information indicating that the plurality of energy storage units 200 can be connected in parallel.

If, on the other hand, the tolerance value determining unit 422 determines that the current flowing into the first lowest voltage energy storage unit has a value greater than the first tolerance value, the connectable range determining unit 423 determines that the energy storage units included in the unconnected energy storage unit group cannot be connected to the first connected energy storage unit group. The connectable range acquiring unit 421 thereby acquires information indicating that the parallel connection is not possible.

Next is a description of processing performed in the case where the determiner unit 410 determines that the voltage of the first connected energy storage unit group is between the voltage of the second lowest voltage energy storage unit having the lowest voltage and the voltage of the highest voltage energy storage unit having the highest voltage that are included in the unconnected energy storage unit group.

In this case, the tolerance value determining unit 422 determines whether or not the current flowing into the second lowest voltage energy storage unit has a value less than or equal to a second tolerance value on the assumption that the energy storage units 200 included in a second high voltage energy storage unit group are connected in parallel by assuming that the energy storage units 200 included in the second high voltage energy storage unit group have a voltage equal to the voltage of the highest voltage energy storage unit, and that the second high voltage energy storage unit group and the second lowest voltage energy storage unit are connected in parallel. As used herein, the second high voltage energy storage unit group refers to a group of energy storage units 200 in the plurality of energy storage units 200 other than the second lowest voltage energy storage unit.

The second tolerance value is the tolerance value for the cross current (charge current) flowing into the energy storage units 200. The second tolerance value is also stored in the tolerance value data 441 as shown in FIG. 21, and the tolerance value determining unit 422 determines whether or not the current flowing into the second lowest voltage energy storage unit has a value less than or equal to the second tolerance value by acquiring the second tolerance value from the tolerance value data 441. The second tolerance value may be the same value as the first tolerance value, or may be a different value.

If the tolerance value determining unit 422 determines that the current flowing into the second lowest voltage energy storage unit has a value less than or equal to the second tolerance value, the connectable range determining unit 423 designates a plurality of energy storage units 200 being composed of the second high voltage energy storage unit group and the second lowest voltage energy storage unit, as the connectable range. The connectable range acquiring unit 421 thereby acquires the connectable range as information indicating that the plurality of energy storage units 200 can be connected in parallel.

If, on the other hand, the tolerance value determining unit 422 determines that the current flowing into the second lowest voltage energy storage unit has a value greater than the second tolerance value, the connectable range determining unit 423 determines that the energy storage units included in the unconnected energy storage unit group cannot be connected to the first connected energy storage unit group. The connectable range acquiring unit 421 thereby acquires information indicating that the parallel connection is not possible.

The display unit 430 causes the display screen 450 to display information for connecting a plurality of energy storage units 200 in parallel. Here, the display screen 450 may be, for example, a cathode-ray tube (CRT), a liquid crystal display (LCD), a touch panel, or the like.

To be specific, the display unit 430 causes the display screen 450 to display, as the information for connecting in parallel the energy storage units 200 in the connectable range, the connectable range acquired by the connectable range acquiring unit 421. Also, the display unit 430 causes the display screen 450 to display information for charging the second connected energy storage unit group as the information for connecting in parallel the energy storage units 200 outside the connectable range to the second connected energy storage unit group. For example, the display unit 430 causes the display screen 450 to display a message for prompting the user to perform charging.

In the tolerance value data 441, first tolerance values, second tolerance values (charge current tolerance values), and third tolerance values (discharge current tolerance values) are stored in advance according to the type of energy storage units 200. The data stored in the connection information data 442 is not limited to the above-described data. For example, respective voltage values of the energy storage units 200, the SOC of the second connected energy storage unit group and the SOC of the outlying lowest voltage energy storage unit that are acquired by the target SOC calculation unit 425, and the like may be stored. Alternatively, respective resistance values of the energy storage units 200 may be stored in advance. By using the data as described above, the connectable range acquiring unit 421 acquires the connectable range, and the charge/discharge information acquiring unit 424 acquires the information for charging or discharging the energy storage units 200.

Next is a description of processing for acquiring information for connecting energy storage units 200 in parallel performed by the connection information acquiring apparatus 400.

Figure 23:
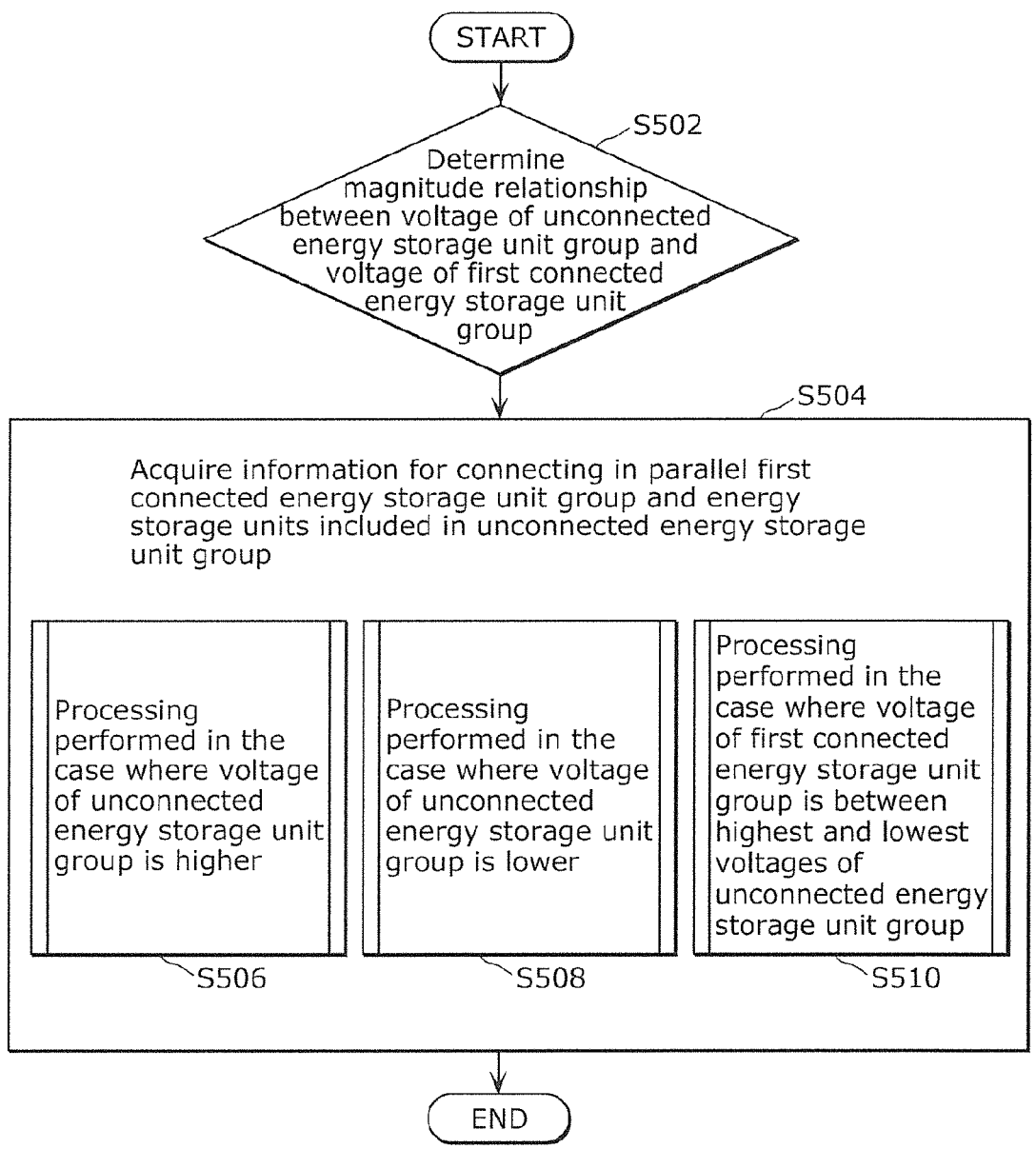
FIG. 23 is a flowchart illustrating an example of processing for acquiring information for connecting energy storage units in parallel performed by the connection information acquiring according to Embodiment 2 of the present invention.

FIG. 23 is a flowchart illustrating an example of processing for acquiring information for connecting energy storage units 200 in parallel performed by the connection information acquiring apparatus 400 according to Embodiment 2 of the present invention. It is assumed here that none of the energy storage units 200 is charged or discharged when the connection information acquiring apparatus 400 acquires the information.

As shown in the diagram, first, the determiner unit 410 determines a magnitude relationship between the voltage of the unconnected energy storage unit group and the voltage of the first connected energy storage unit group (S502).

Then, the acquisition unit 420 acquires information for connecting the energy storage units included in the first connected energy storage unit group and the energy storage units included in the unconnected energy storage unit group based on the result of determination performed by the determiner unit 410 (S504).

To be specific, if the determiner unit 410 determines that the voltage of the unconnected energy storage unit group is higher than the voltage of the first connected energy storage unit group, the acquisition unit 420 performs processing that is performed in the case where the voltage of the unconnected energy storage unit group is higher (S506). The processing that is performed in the case where the voltage of the unconnected energy storage unit group is higher performed by the acquisition unit 420 will be described later in detail.

If the determiner unit 410 determines that the voltage of the unconnected energy storage unit group is lower than the voltage of the first connected energy storage unit group, the acquisition unit 420 performs processing that is performed in the case where the voltage of the unconnected energy storage unit group is lower (S508). The processing that is performed in the case where the voltage of the unconnected energy storage unit group is lower performed by the acquisition unit 420 will be described later in detail.

If the determiner unit 410 determines that the voltage of the first connected energy storage unit group is between voltage of a second lowest voltage energy storage unit having the lowest voltage and voltage of a highest voltage energy storage unit having the highest voltage in the unconnected energy storage unit group, the acquisition unit 420 performs processing that is performed in the case where the voltage of the first connected energy storage unit group is between the highest and lowest voltages of the unconnected energy storage unit group (S510). The processing that is performed in the case where the voltage of the first connected energy storage unit group is between the highest and lowest voltages of the unconnected energy storage unit group performed by the acquisition unit 420 will be described later in detail.

The processing for acquiring information for connecting energy storage units 200 in parallel performed by the connection information acquiring apparatus 400 thereby ends.

Next is a description of the processing performed by the acquisition unit 420 in the case where the voltage of the unconnected energy storage unit group is higher (S506 in FIG. 23).

Figure 24:
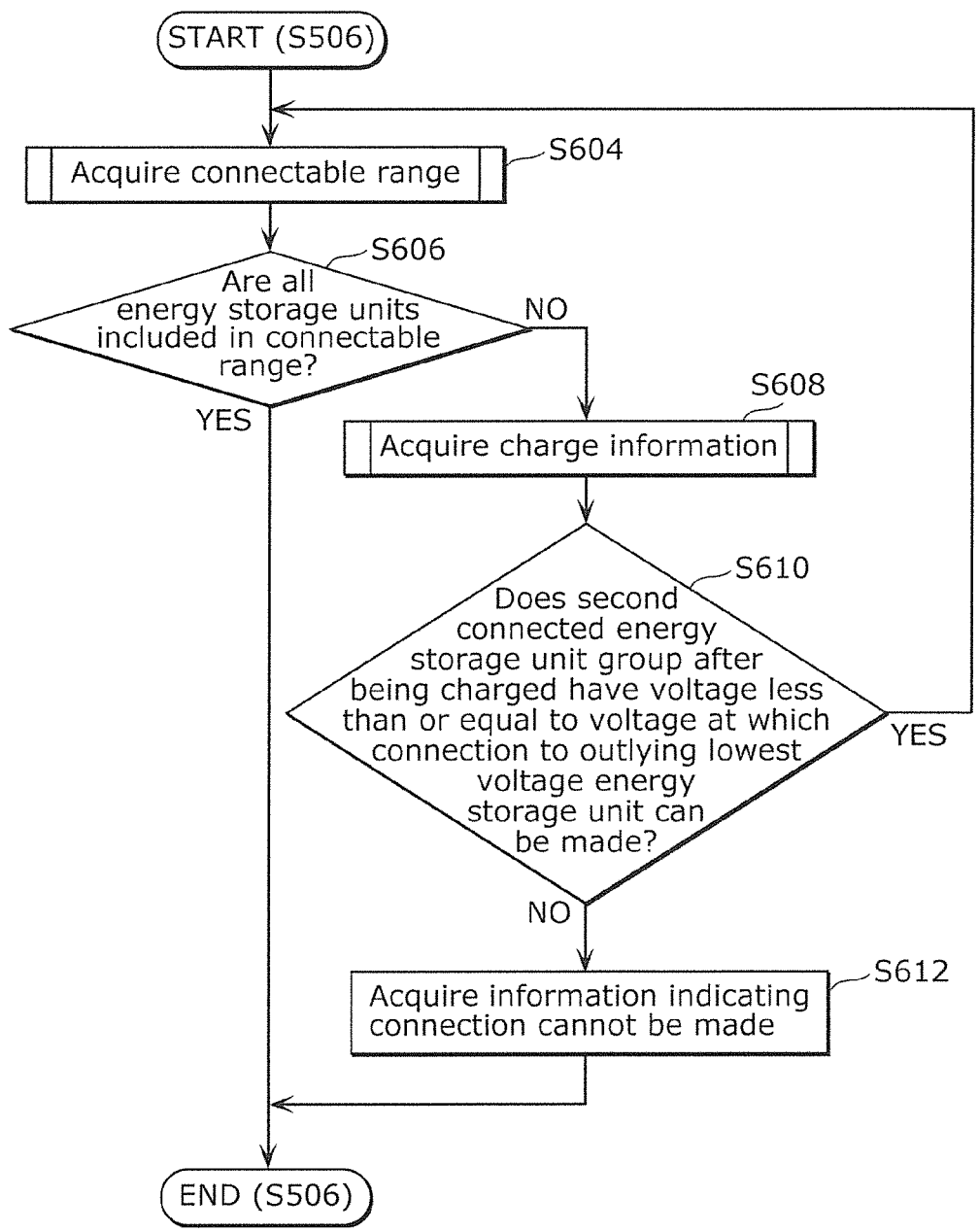
FIG. 24 is a flowchart illustrating an example of processing performed by an acquisition unit according to Embodiment 2 of the present invention in the case where the voltage of an unconnected energy storage unit group is higher.
Figure 25:
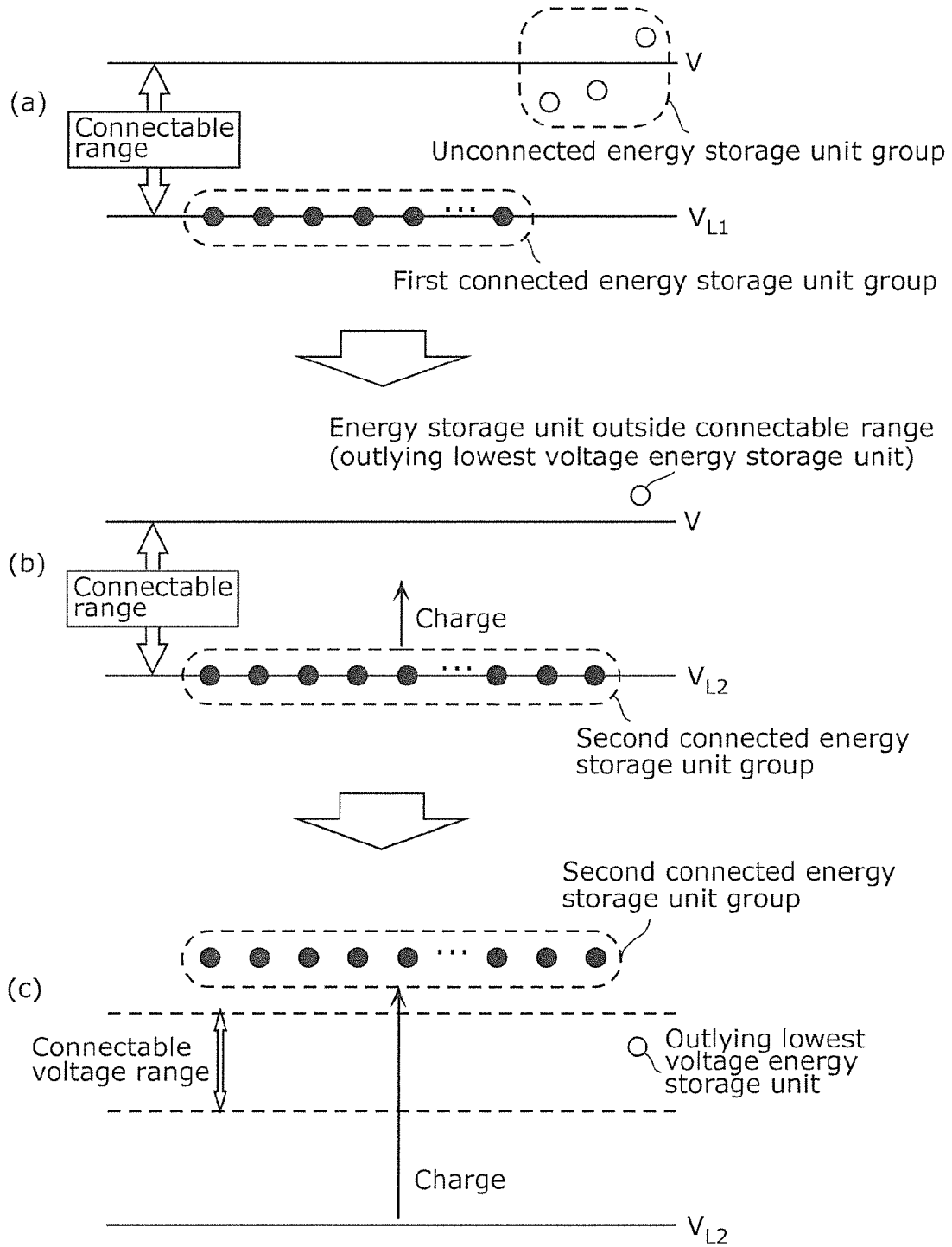
FIGS. 25a-c are diagrams illustrating the processing performed by the acquisition unit according to Embodiment 2 of the present invention in the case where the voltage of the unconnected energy storage unit group is higher.

FIG. 24 is a flowchart illustrating an example of the processing performed by the acquisition unit 420 according to Embodiment 2 of the present invention in the case where the voltage of the unconnected energy storage unit group is higher. FIG. 25 is a diagram illustrating the processing performed by the acquisition unit 420 according to Embodiment 2 of the present invention in the case where the voltage of the unconnected energy storage unit group is higher.

As shown in FIG. 24, first, the connectable range acquiring unit 421 acquires a connectable range that is a range of energy storage units 200 that can be connected in parallel and includes the first connected energy storage unit group (S604).

To be specific, as shown in (a) of FIG. 25, the connectable range acquiring unit 421 sorts the energy storage units 200 in the order of increasing voltage so as to acquire a connectable range that is a range of energy storage units 200 that can be connected in parallel and are selected from the first connected energy storage unit group in the order of increasing voltage. As used herein, the connectable range refers to a range of energy storage units 200 that can be connected in parallel without charging the energy storage units 200. The processing for acquiring the connectable range performed by the connectable range acquiring unit 421 will be described later in detail.

Returning to FIG. 24, next, the connectable range acquiring unit 421 determines whether or not all energy storage units 200 are included in the connectable range (S606). If the connectable range acquiring unit 421 determines that all energy storage units 200 are included in the connectable range (YES in S606), the processing ends.

If, on the other hand, the connectable range acquiring unit 421 determines not all energy storage units 200 are included in the connectable range (NO in S606), the charge/discharge information acquiring unit 424 acquires information for charging a second connected energy storage unit group in which the energy storage units 200 in the connectable range are connected in parallel (S608).

To be specific, as shown in (b) of FIG. 25, the charge/discharge information acquiring unit 424 acquires information for charging the second connected energy storage unit group such that the energy storage units 200 outside the connectable range can be connected in parallel to the second connected energy storage unit group. That is, the charge/discharge information acquiring unit 424 acquires information for charging the second connected energy storage unit group such that the voltage of the second connected energy storage unit group falls within a connectable voltage range allowed for parallel connection of the outlying lowest voltage energy storage unit to the second connected energy storage unit group. The processing for acquiring the information for charging the energy storage units 200 performed by the charge/discharge information acquiring unit 424 will be described later in detail.

Returning to FIG. 24, next, when the second connected energy storage unit group has been charged, the connectable range acquiring unit 421 determines whether or not the voltage of the second connected energy storage unit group after being charged is less than or equal to a voltage at which connection to the outlying lowest voltage energy storage unit can be made (S610).

Then, if the connectable range acquiring unit 421 determines that the voltage of the second connected energy storage unit group after being charged is higher than a voltage at which connection to the outlying lowest voltage energy storage unit can be made (NO in S610), the connectable range acquiring unit 421 acquires information indicating that the outlying lowest voltage energy storage unit cannot be connected to the second connected energy storage unit group (S612).

To be specific, as shown in (c) of FIG. 25, if the voltage of the second connected energy storage unit group after being charged exceeds a connectable voltage range in which connection to the outlying lowest voltage energy storage unit can be made, the connectable range determining unit 423 determines that the outlying lowest voltage energy storage unit cannot be connected to the second connected energy storage unit group, and acquires unconnectable information. This is because the energy storage units 200 are configured, taking into consideration the influence on the load, so as to be incapable of discharging electricity from the energy storage units 200 to the load while the energy storage units 200 are connected in parallel. Then, the connectable range determining unit 423 outputs the unconnectable information to the display unit 430, and the display unit 430 causes the display screen 450 to display a message indicating that connection cannot be made. The processing thereby ends.

In the case where the energy storage units 200 are capable of discharging electricity when they are connected in parallel by installing a dummy load, the second connected energy storage unit group after being charged may be discharged. In this case, the charge/discharge information acquiring unit 424 acquires information for discharging the second connected energy storage unit group such that the voltage of the second connected energy storage unit group falls within a connectable voltage range allowed for parallel connection of the outlying lowest voltage energy storage unit to the second connected energy storage unit group. Then, when the second connected energy storage unit group has been discharged, the connectable range acquiring unit 421 determines whether or not the voltage of the second connected energy storage unit group after being discharged is less than or equal to a voltage at which connection to the outlying lowest voltage energy storage unit can be made.

Returning to FIG. 24, if the connectable range acquiring unit 421 determines that the voltage of the second connected energy storage unit group after being charged is less than or equal to a voltage at which connection to the outlying lowest voltage energy storage unit can be made (YES in S610), the connectable range acquiring unit 421 acquires, as the connectable range, a range of energy storage units 200 that can be connected in parallel and includes the second connected energy storage unit group after being charged (or after being discharged) among the plurality of energy storage units 200 (S604). In this way, the above processing (S604 to S612) is repeatedly performed.

The processing for acquiring information for connecting energy storage units 200 in parallel performed by the connection information acquiring apparatus 400 thereby ends.

Next is a description of the processing for acquiring a connectable range performed by the connectable range acquiring unit 421 (S604 in FIG. 24).

Figure 26:
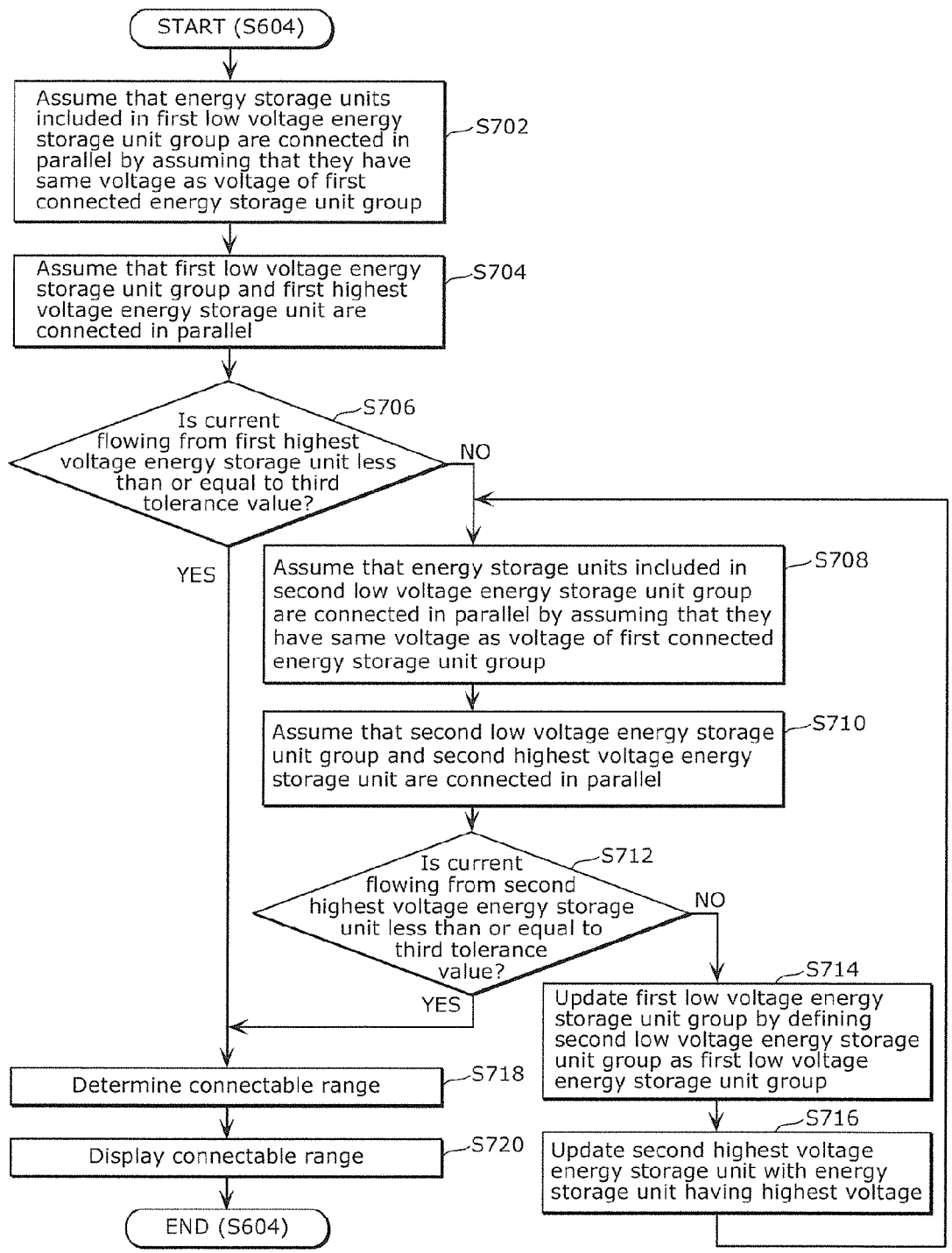
FIG. 26 is a flowchart illustrating an example of processing for acquiring a connectable range performed by a connectable range acquiring unit according to Embodiment 2 of the present invention.
Figure 27:
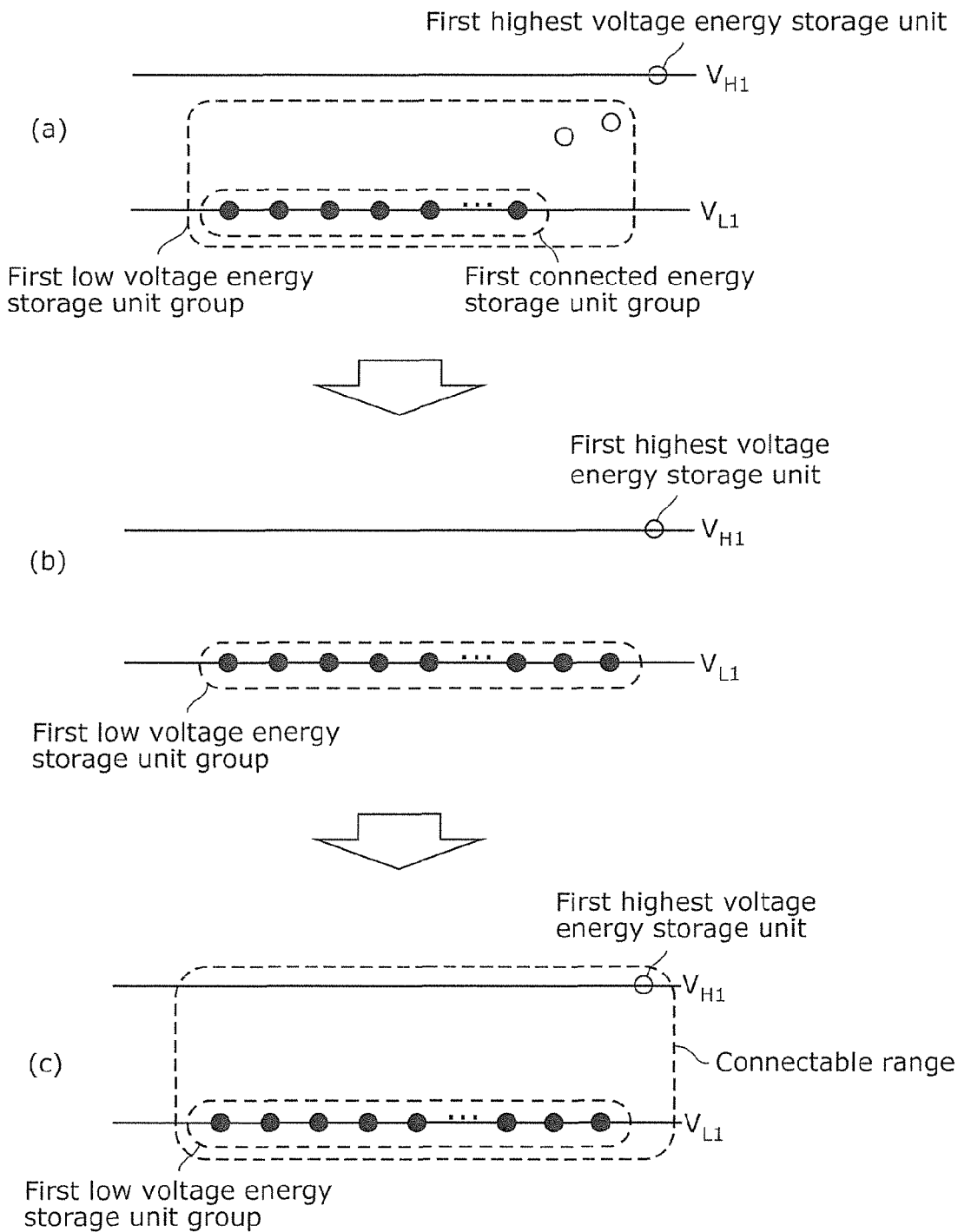
FIGS. 27a-c are diagrams illustrating the processing for acquiring a connectable range performed by the connectable range acquiring unit according to Embodiment 2 of the present invention.
Figure 28:
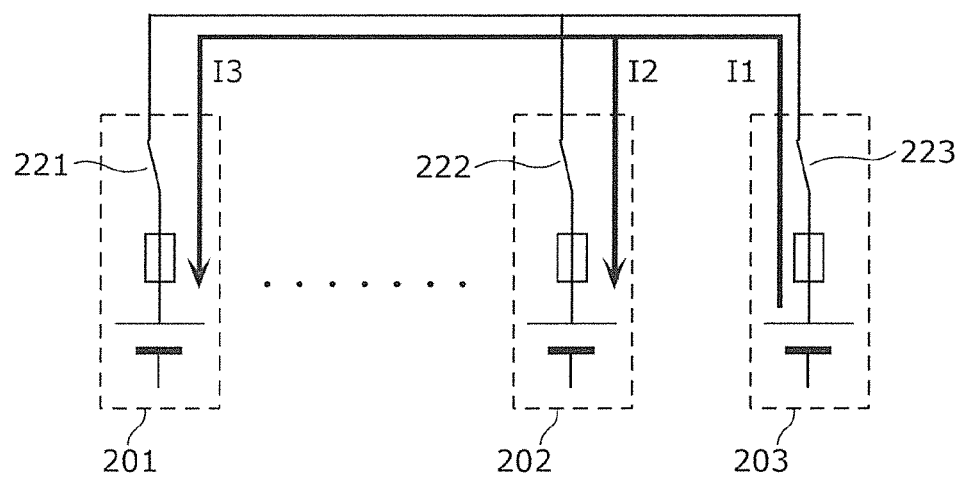
FIG. 28 is a diagram illustrating the processing for acquiring a connectable range performed by the connectable range acquiring unit according to Embodiment 2 of the present invention.
Figure 29:
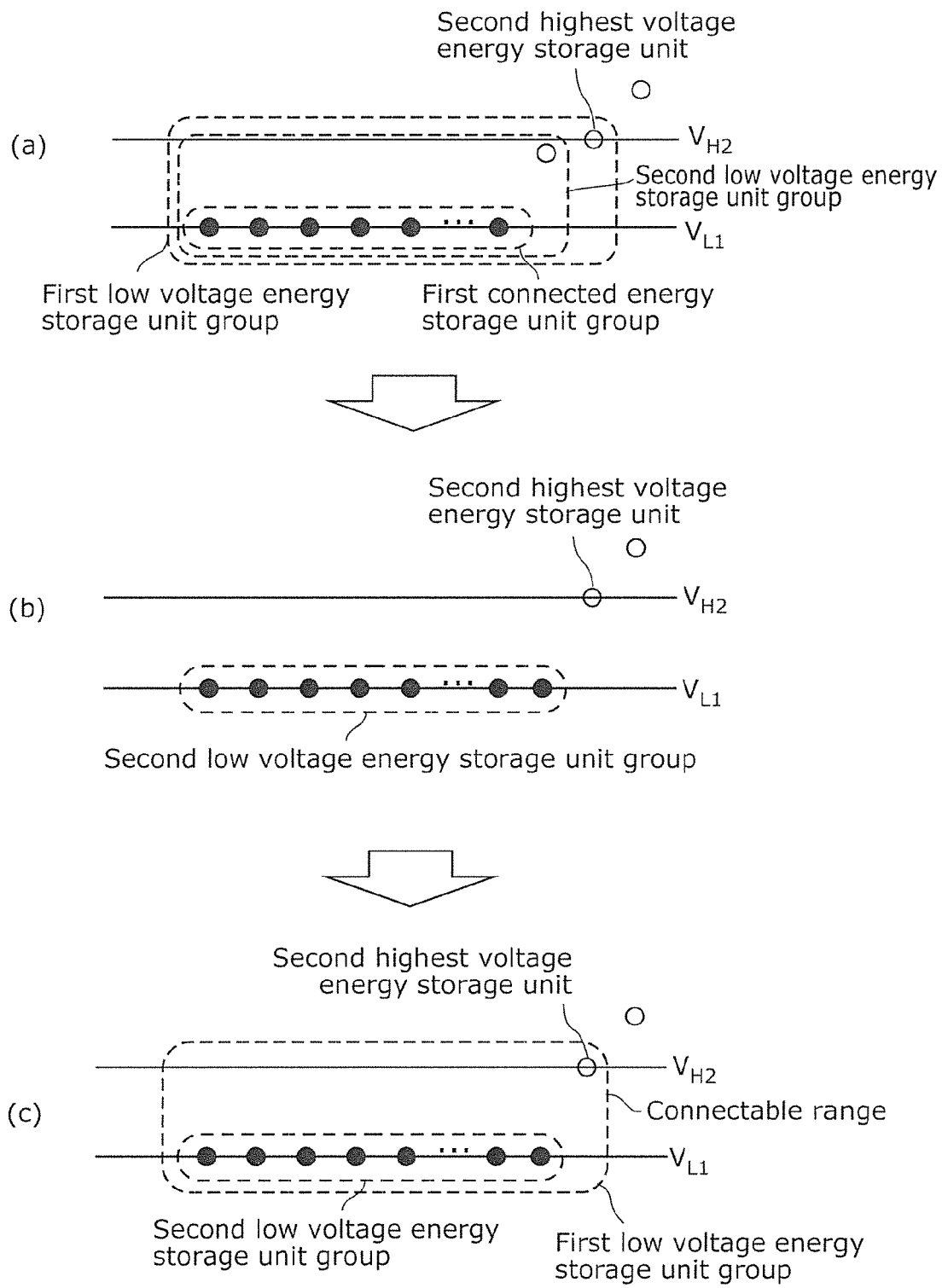
FIGS. 29a-c are diagrams illustrating the processing for acquiring a connectable range performed by the connectable range acquiring unit according to Embodiment 2 of the present invention.

FIG. 26 is a flowchart illustrating an example of processing for acquiring a connectable range performed by the connectable range acquiring unit 421 according to Embodiment 2 of the present invention. FIGS. 27 to 29 are diagrams illustrating the processing for acquiring a connectable range performed by the connectable range acquiring unit 421 according to Embodiment 2 of the present invention.

As shown in FIG. 26, first, the tolerance value determining unit 422 makes an assumption that the energy storage units 200 included in the first low voltage energy storage unit group have a voltage equal to the voltage of the first connected energy storage unit group (S702).

To be specific, as shown in (a) of FIG. 27, an energy storage unit having the highest voltage among a plurality of energy storage units 200 is defined as a first highest voltage energy storage unit, and the energy storage units 200 in the plurality of energy storage units 200 other than the first highest voltage energy storage unit are defined as a first low voltage energy storage unit group. Then, as shown in (b) of FIG. 27, the tolerance value determining unit 422 makes an assumption that all energy storage units 200 included in the first low voltage energy storage unit group are connected in parallel by assuming that they have a voltage $V_{L1}$ that is the voltage of the first connected energy storage unit group.

Returning to FIG. 26, the tolerance value determining unit 422 further makes an assumption that the first low voltage energy storage unit group and the first highest voltage energy storage unit are connected in parallel (S704).

Then, the tolerance value determining unit 422 determines whether or not the current flowing from the first highest voltage energy storage unit (discharge current) has a value less than or equal to the third tolerance value (S706). The reason that it is preferable to compare the discharge current with the third tolerance value will now be described with reference to FIG. 28.

As shown in FIG. 28, in the case where an energy storage unit 203 having a voltage higher than the voltages of a plurality of energy storage units 201 to 202 is connected to the energy storage units 201 to 202 as a result of a breaker 223 being turned on, a cross current I1 flows from the energy storage unit 203 into the energy storage units 201 to 202. In this case, the cross current I1 flowing out of the energy storage unit 203 is equal to a total (I2+ . . . +I3) of the cross current flowing into the energy storage units 201 to 202. Accordingly, it is preferable to compare the cross current (discharge current) I1 having a greater value with the third tolerance value that is the tolerance value for discharge current so as to determine whether or not the energy storage units can be connected.

Also, the tolerance value determining unit 422 calculates the discharge current (cross current) by using, for example, the following Equation 3:

$$\text{Discharge current } I_A = (V_H - V_{L1}) / \{(N+1)/N \times R\} \times k \quad \text{(Equation 3)},$$

where $V_H$ represents the voltage of the first highest voltage energy storage unit, $V_{L1}$ represents the voltage of the first connected energy storage unit group, N represents the number of energy storage units 200 included in the first low voltage energy storage unit group, R represents the DC resistance of the energy storage units 200, and k represents a safety factor.

In Equation 3 given above, it is assumed that the energy storage units 200 are composed of an electromotive force and a resistance of batteries, all energy storage units 200 have a resistance of the same value, and the interconnect resistance is zero. Also, the discharge current $I_A$ increases as the value of R gets smaller, and therefore, in terms of safety, it is preferable that R is, for example, the DC resistance of energy storage units in a brand-new condition at 45° C., which take the smallest DC resistance value. Also, the present inventors have found that the actually measured values are greater than the calculated values by 20%, and therefore k is preferably, for example, 1.2.

Also, because the interconnect resistance is assumed to be zero, when all energy storage units 200 include the same number of batteries (cells), the discharge current $I_A$ can be calculated by using the battery resistance of the batteries as R, the average cell voltage of the batteries included in the first highest voltage energy storage unit as $V_H$, and the average cell voltage of the batteries included in the first connected energy storage unit group as $V_{L1}$.

Returning to FIG. 26, next, if the tolerance value determining unit 422 determines that the current flowing from the first highest voltage energy storage unit (discharge current $I_A$ described above) has a value less than or equal to the third tolerance value (YES in S706), the connectable range determining unit 423 designates a plurality of energy storage units 200 being composed of the first highest voltage energy storage unit and the first low voltage energy storage unit group, as the connectable range (S718).

To be specific, as shown in (c) of FIG. 27, the connectable range determining unit 423 determines that the first highest voltage energy storage unit can be connected to the first low voltage energy storage unit group, and then designates a range including the first highest voltage energy storage unit and the first low voltage energy storage unit group as the connectable range.

Returning to FIG. 26, if the tolerance value determining unit 422 determines that the current flowing from the first highest voltage energy storage unit (discharge current $I_A$ described above) has a value greater than the third tolerance value (NO in S706), the tolerance value determining unit 422 makes an assumption that the energy storage units 200 included in a second low voltage energy storage unit group are connected in parallel by assuming that they have the same voltage as the voltage of the first connected energy storage unit group (S708).

To be specific, as shown in (a) of FIG. 29, an energy storage unit having the highest voltage in the first low voltage energy storage unit group is defined as a second highest voltage energy storage unit, and the energy storage units 200 in the first low voltage energy storage unit group other than the second highest voltage energy storage unit are defined as a second low voltage energy storage unit group. Then, as shown in (b) of FIG. 29, the tolerance value determining unit 422 makes an assumption that all energy storage units 200 included in the second low voltage energy storage unit group are connected in parallel by assuming that they have a voltage $V_{L1}$ that is the voltage of the first connected energy storage unit group.

Returning to FIG. 26, the tolerance value determining unit 422 further makes an assumption that the second low voltage energy storage unit group and the second highest voltage energy storage unit are connected in parallel (S710).

Then, the tolerance value determining unit 422 determines whether or not the current flowing from the second highest voltage energy storage unit has a value less than or equal to the third tolerance value (S712). The tolerance value determining unit 422 can calculate the current flowing from the second highest voltage energy storage unit by using the same method as the method for calculating the current flowing from the first highest voltage energy storage unit (discharge current $I_A$ described above) (Equation 3 given above).

If the tolerance value determining unit 422 determines that the current flowing from the second highest voltage energy storage unit has a value greater than the third tolerance value (NO in S712), the tolerance value determining unit 422 updates the first low voltage energy storage unit group by defining the second low voltage energy storage unit group as the first low voltage energy storage unit group (S714). That is, the tolerance value determining unit 422 defines again the first low voltage energy storage unit group by defining a group of energy storage units obtained by removing the second highest voltage energy storage unit from the first low voltage energy storage unit group as the first low voltage energy storage unit group.

Also, the tolerance value determining unit 422 updates the second highest voltage energy storage unit with an energy storage units 200 having the highest voltage in the first low voltage energy storage unit group (S716). That is, the tolerance value determining unit 422 defines again the second highest voltage energy storage unit by defining an energy storage unit 200 having the highest voltage in the first low voltage energy storage unit group as the second highest voltage energy storage unit.

Then, the tolerance value determining unit 422 defines again the second highest voltage energy storage unit by defining an energy storage unit having the highest voltage in the updated first low voltage energy storage unit group as the second highest voltage energy storage unit, and also defines again the second low voltage energy storage unit group by defining a group of energy storage units in the first low voltage energy storage unit group other than the second highest voltage energy storage unit as the second low voltage energy storage unit group. Then, the tolerance value determining unit 422 makes an assumption that the energy storage units 200 included in the second low voltage energy storage unit group are connected in parallel by assuming that the they have the same voltage as the voltage of the first connected energy storage unit group (S708), and also makes an assumption that the second low voltage energy storage unit group and the second highest voltage energy storage unit are connected in parallel (S710), and then determines whether or not the current flowing from the second highest voltage energy storage unit has a value less than or equal to the third tolerance value (S712). In this way, the above processing (S708 to S716) is repeatedly performed.

Then, if the tolerance value determining unit 422 determines that the current flowing from the second highest voltage energy storage unit has a value less than or equal to the third tolerance value (YES in S712), the connectable range determining unit 423 determines the first low voltage energy storage unit group as the connectable range (S718).

To be specific, as shown in (c) of FIG. 29, the connectable range determining unit 423 determines that the second highest voltage energy storage unit can be connected to the second low voltage energy storage unit group, and designates the first low voltage energy storage unit group being composed of the second highest voltage energy storage unit and the second low voltage energy storage unit group as the connectable range. Then, the connectable range determining unit 423 outputs the determined connectable range to the display unit 430.

Returning to FIG. 26, next, the display unit 430 causes the display screen 450 to display the connectable range as the information for connecting energy storage units 200 in the connectable range in parallel (S720). For example, the display unit 430 causes the display screen 450 to display guidance, such as sequentially displaying energy storage units 200 to be connected, so that the user can connect the energy storage units 200 in the connectable range. An energy storage unit 200 to be connected can be connected in parallel to another energy storage unit 200 by the user turning on the breaker 220 of the energy storage unit 200 to be connected in accordance with the guidance.

The processing for acquiring a connectable range performed by the connectable range acquiring unit 421 (S604 in FIG. 24) thereby ends.

Next is a description of the processing for acquiring information for charging energy storage units 200 performed by the charge/discharge information acquiring unit 424 (S608 in FIG. 24).

Figure 30:
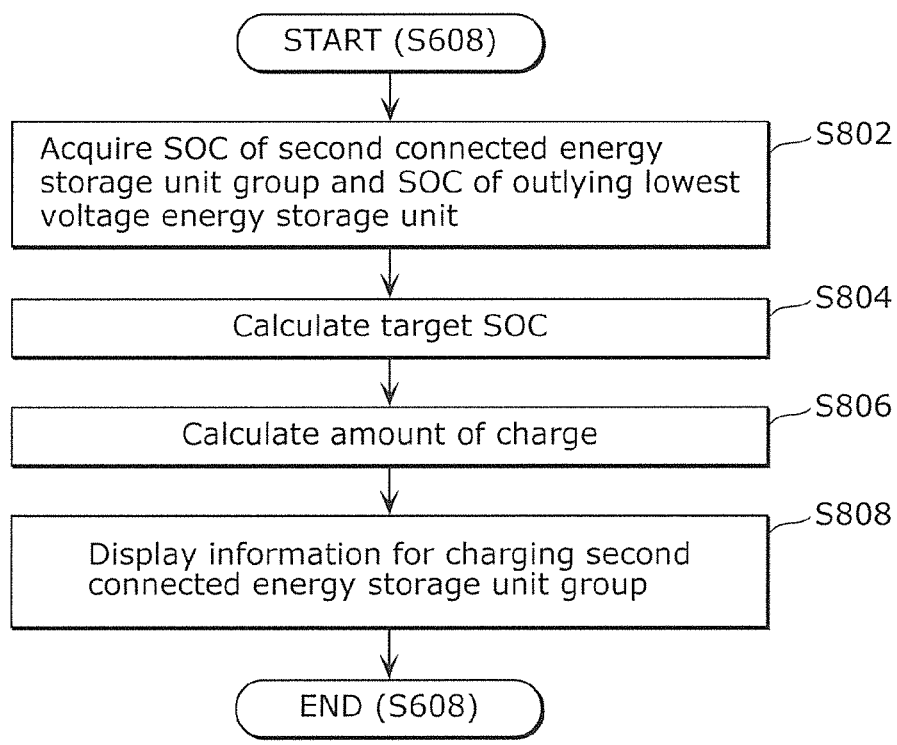
FIG. 30 is a flowchart illustrating an example of processing for acquiring information for charging energy storage units performed by a charge/discharge information acquiring unit according to Embodiment 2 of the present invention.
Figure 31:
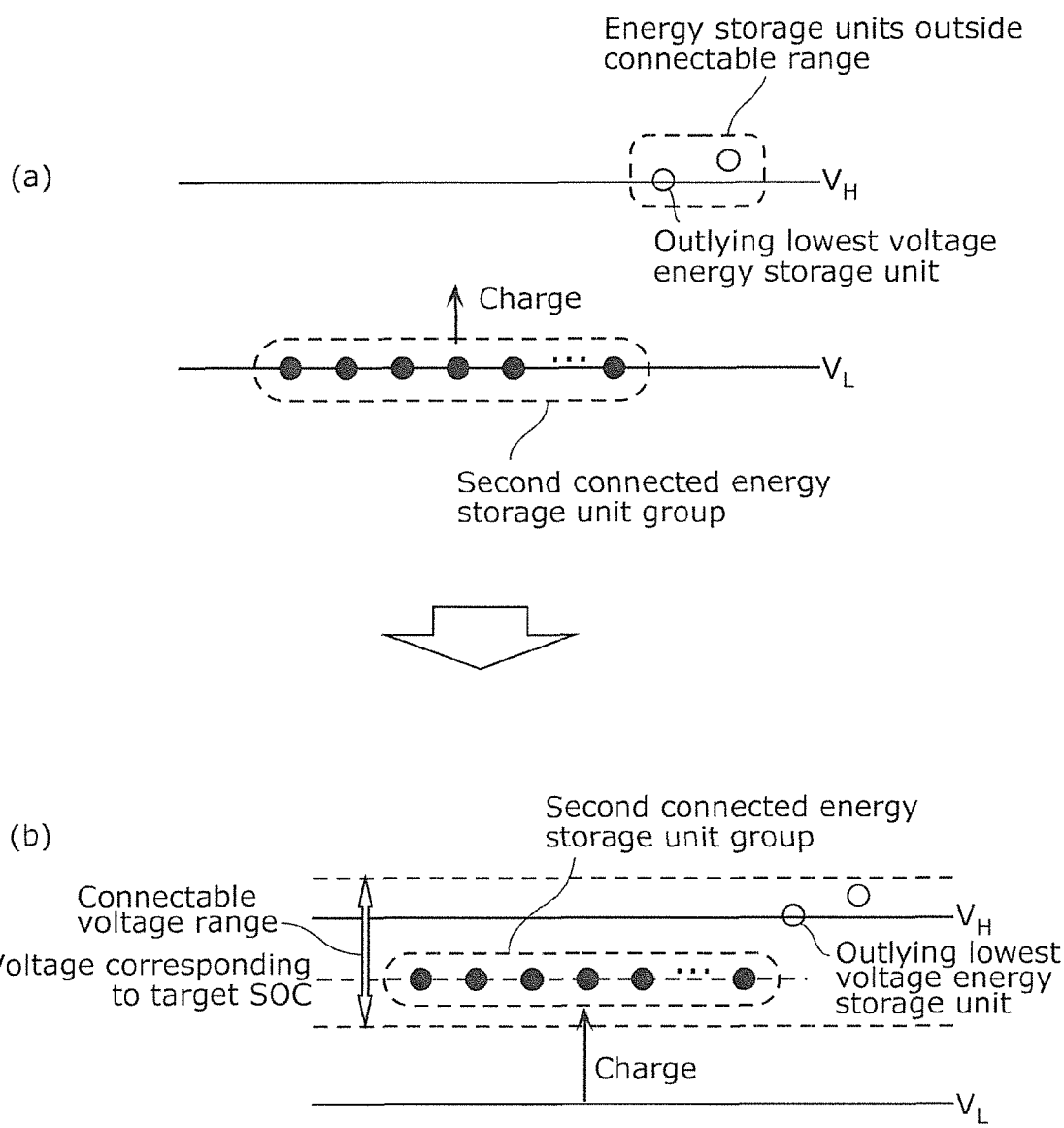
FIGS. 31a-b are diagrams illustrating the processing for acquiring information for charging energy storage units performed by the charge/discharge information acquiring unit according to Embodiment 2 of the present invention.

FIG. 30 is a flowchart illustrating an example of processing for acquiring information for charging energy storage units 200 performed by the charge/discharge information acquiring unit 424 according to Embodiment 2 of the present invention. FIG. 31 is a diagram illustrating the processing for acquiring information for charging energy storage units 200 performed by the charge/discharge information acquiring unit 424 according to Embodiment 2 of the present invention.

As shown in FIG. 30, first, the target SOC calculation unit 425 determines whether or not the energy storage units 200 in the connectable range are connected in parallel. If the target SOC calculation unit 425 determines that the energy storage units 200 are connected in parallel, then it acquires the SOC of the second connected energy storage unit group and the SOC of the outlying lowest voltage energy storage unit (S802).

It is assumed here that the second connected energy storage unit group has been formed by the user turning on the breakers 220 of the energy storage units 200 in the connectable range so as to connect in parallel the energy storage units 200 in the connectable range. Then, the target SOC calculation unit 425 determines whether or not the breakers 220 of the energy storage units 200 in the connectable range have been turned on. If the target SOC calculation unit 425 determines that the breakers 220 have been turned on, then it acquires the SOC of the second connected energy storage unit group and the SOC of the outlying lowest voltage energy storage unit. The target SOC calculation unit 425 determines whether or not the breakers 220 have been turned on by acquiring information indicating that the breakers 220 have been turned on from the energy storage units 200 or from input of the user.

Then, the target SOC calculation unit 425 calculates a target SOC that is the target value for the SOC of the second connected energy storage unit group (S804). Here, if the SOC of the second connected energy storage unit group is excessively higher than the SOC of the outlying lowest voltage energy storage unit, the outlying lowest voltage energy storage unit cannot be connected in parallel to the second connected energy storage unit group. This is because the energy storage units 200 are configured, taking into consideration the influence on the load, so as to be incapable of discharging electricity from the energy storage units 200 to the load when the energy storage units 200 are connected in parallel. For this reason, it is preferable that the SOC of the second connected energy storage unit group is less than or equal to the SOC of the outlying lowest voltage energy storage unit.

Accordingly, as shown in FIG. 31, the target SOC calculation unit 425 calculates the target SOC such that the target SOC is less than or equal to the SOC of the outlying lowest voltage energy storage unit and is greater than or equal to the lowest value for the SOC allowed for parallel connection of the second connected energy storage unit group to the outlying lowest voltage energy storage unit.

To be specific, the target SOC calculation unit 425 calculates the target SOC by using, for example, the following Equation 4:

$$\text{Target SOC} = \text{SOC}(L) + \{\text{SOC}(H) - \text{SOC}(L)\} \times d \quad \text{(Equation 4)},$$

where SOC (L) represents the SOC of the second connected energy storage unit group, SOC (H) represents the SOC of the outlying lowest voltage energy storage unit, and d represents a charge amount reduction factor. Note that d is the value determined, taking into consideration changes and errors of the actual capacity of batteries that are caused by deterioration, so as to prevent the second connected energy storage unit group from being overcharged, and can be a constant set to an installation-specific optimal value ranging from 0.5 to 1.0.

Returning to FIG. 30, next, the charge amount calculation unit 426 calculates the amount of charge for charging the second connected energy storage unit group such that the SOC of the second connected energy storage unit group matches the target SOC (S806). Then, the charge amount calculation unit 426 outputs information for charging the second connected energy storage unit group to the display unit 430 based on the calculated amount of charge.

Then, the display unit 430 causes the display screen 450 to display information for charging the second connected energy storage unit group (S808). That is, the display unit 430 causes the display screen 450 to display, as the information for connecting the energy storage units 200 outside the connectable range in parallel to the second connected energy storage unit group, a message for prompting the user to perform charging. For example, the display unit 430 causes the display screen 450 to display a message informing a start of charging, a message informing a stop of charging, or a message instructing the user to wait for the voltage to settle after charging is stopped. The user performs charging of the energy storage units 200 included in the second connected energy storage unit group in accordance with the guidance.

The processing for acquiring information for charging energy storage units 200 performed by the charge/discharge information acquiring unit 424 (S608 in FIG. 24) thereby ends.

Next is a description of the processing performed by the acquisition unit 420 in the case where the voltage of the unconnected energy storage unit group is lower (S508 in FIG. 23).

Figure 32:
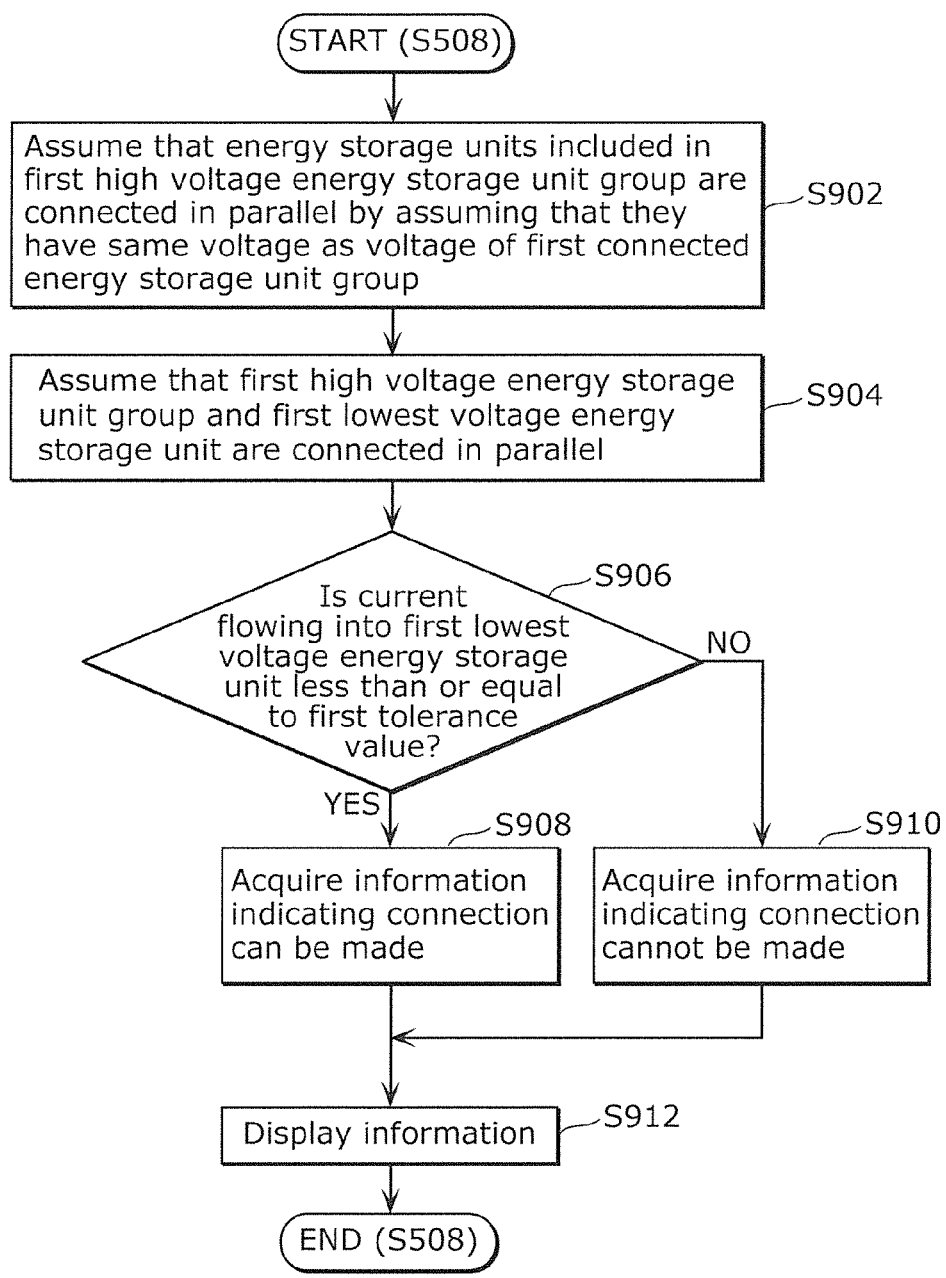
FIG. 32 is a flowchart showing an example of processing performed by an acquisition unit according to Embodiment 2 of the present invention in the case where the voltage of an unconnected energy storage unit group is lower.

FIG. 32 is a flowchart illustrating an example of processing performed by the acquisition unit 420 according to Embodiment 2 of the present invention in the case where the voltage of the unconnected energy storage unit group is lower. Also, FIGS. 33 and 34 are diagrams illustrating the processing performed by the acquisition unit 420 according to Embodiment 2 of the present invention in the case where the voltage of the unconnected energy storage unit group is lower.

As shown in FIG. 32, first, the tolerance value determining unit 422 makes an assumption that the energy storage units 200 included in the first high voltage energy storage unit group are connected in parallel by assuming that they have the same voltage as the voltage of the first connected energy storage unit group (S902).

Figure 33:
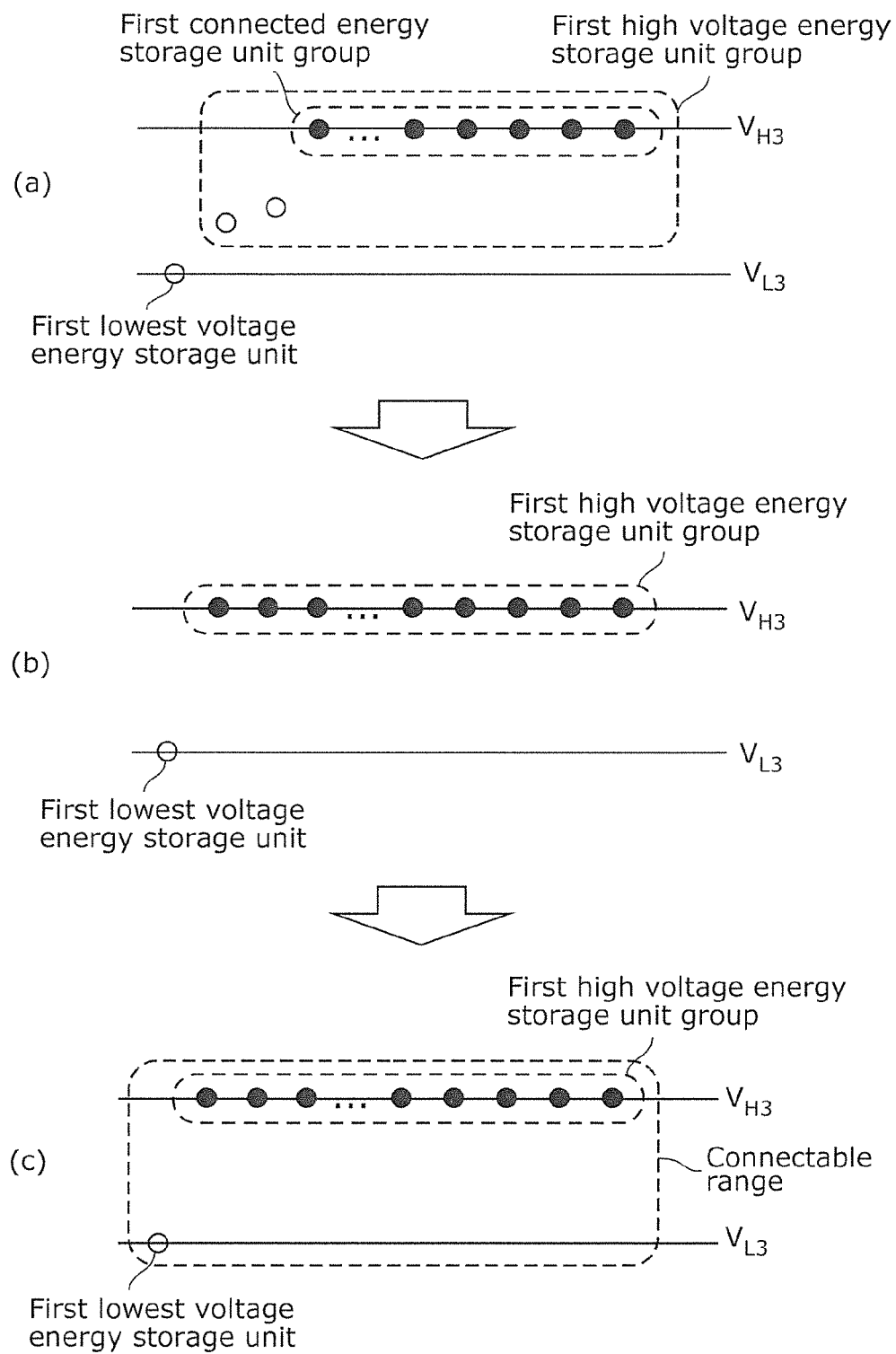
FIGS. 33a-c are diagrams illustrating the processing performed by the acquisition unit according to Embodiment 2 of the present invention in the case where the voltage of the unconnected energy storage unit group is lower.
Figure 34:
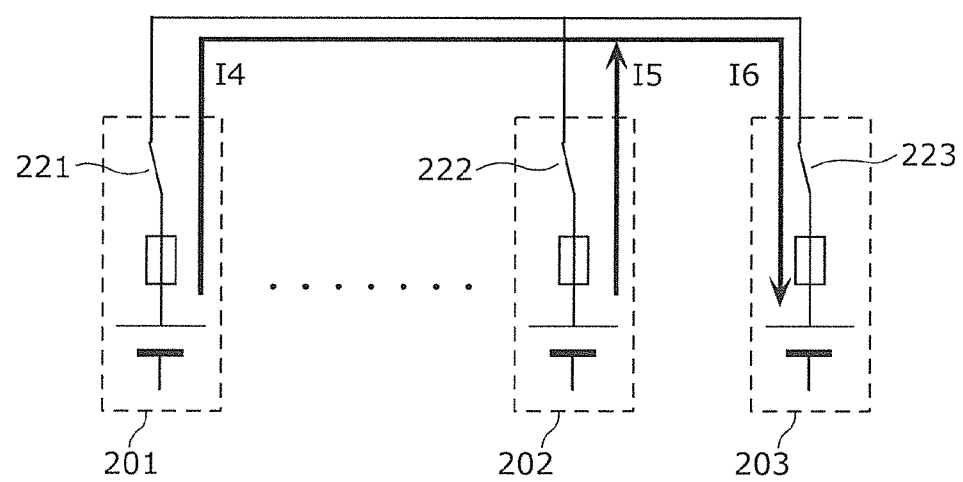
FIG. 34 is a diagram illustrating the processing performed by the acquisition unit according to Embodiment 2 of the present invention in the case where the voltage of the unconnected energy storage unit group is lower.

To be specific, as shown in (a) of FIG. 33, an energy storage unit having the lowest voltage among the plurality of energy storage units 200 is defined as a first lowest voltage energy storage unit, and the energy storage units 200 in the plurality of energy storage units 200 other than the first lowest voltage energy storage unit are defined as a first high voltage energy storage unit group. Then, as shown in (b) of FIG. 33, the tolerance value determining unit 422 makes an assumption that all energy storage units 200 included in the first high voltage energy storage unit group are connected in parallel by assuming that they have a voltage $V_{H3}$ that is the voltage of the first connected energy storage unit group.

Returning to FIG. 26, furthermore, the tolerance value determining unit 422 makes an assumption that the first high voltage energy storage unit group and the first lowest voltage energy storage unit are connected in parallel (S904).

Then, the tolerance value determining unit 422 determines whether or not the current flowing into the first lowest voltage energy storage unit (charge current) has a value less than or equal to the first tolerance value (S906). The reason that it is preferable to compare the charge current with the first tolerance value, which is a tolerance value for charge current, will now be described with reference to FIG. 34.

As shown in FIG. 34, in the case where an energy storage unit 203 having a voltage lower than the voltages of a plurality of energy storage units 201 to 202 is connected to the energy storage units 201 to 202 as a result of a breaker 223 being turned on, a cross current I6 flows from the energy storage units 201 to 202 to the energy storage unit 203. In this case, the cross current I6 flowing into the energy storage unit 203 is equal to a total (I4+ . . . +I5) of the cross current flowing out of the energy storage units 201 to 202. Accordingly, it is preferable to compare the cross current (charge current) I6 having a greater value with the first tolerance value that is the tolerance value for charge current so as to determine whether or not the energy storage units can be connected.

Also, the tolerance value determining unit 422 calculates the charge current (cross current) by using, for example, the following Equation 5:

Charge current $I_B = (V_{H3} - V_{L3})/\{(N+1)/N \times R\} \times k$ (Equation 5), where $V_{H3}$ represents the voltage of the first connected energy storage unit group, $V_{L3}$ represents the voltage of the first lowest voltage energy storage unit, N represents the number of energy storage units 200 included in the first high voltage energy storage unit group, R represents the DC resistance of the energy storage units 200, and k represents a safety factor.

The preconditions and the values of R and k in Equation 5 are the same as those of Equation 3 given above, and thus a detailed description thereof is omitted here. Note, however, that the value on the charge side is positive in Equation 5 whereas in Equation 3, the value on the discharge side is positive.

Returning to FIG. 26, next, if the tolerance value determining unit 422 determines that the current flowing into the first lowest voltage energy storage unit (charge current $I_g$ described above) has a value less than or equal to the first tolerance value (YES in S906), the connectable range determining unit 423 designates a plurality of energy storage units 200 being composed of the first high voltage energy storage unit group and the first lowest voltage energy storage unit, as the connectable range. The connectable range acquiring unit 421 thereby acquires the connectable range as information indicating that the plurality of energy storage units 200 can be connected in parallel (S908).

To be specific, as shown in (c) of FIG. 33, the connectable range determining unit 423 determines that the first lowest voltage energy storage unit can be connected to the first high voltage energy storage unit group, and designates a range including the first lowest voltage energy storage unit and the first high voltage energy storage unit group as the connectable range.

Returning to FIG. 26, if the tolerance value determining unit 422 determines that the current flowing into the first lowest voltage energy storage unit (charge current $I_B$ described above) has a value greater than the first tolerance value (NO in S906), the connectable range determining unit 423 determines that the energy storage units included in the unconnected energy storage unit group cannot be connected in parallel to the first connected energy storage unit group.

The connectable range acquiring unit 421 thereby acquires information indicating that the parallel connection is not possible (S910). Then, the connectable range acquiring unit 421 outputs the acquired connectable range (including the information indicating that parallel connection is not possible) to the display unit 430.

Next, the display unit 430 causes the display screen 450 to display the connectable range as information for connecting the energy storage units 200 in the connectable range in parallel (S912). Details of the process for causing the display screen 450 to display the connectable range performed by the display unit 430 are as described above.

The processing performed by the acquisition unit 420 in the case where the voltage of the unconnected energy storage unit group is lower (S508 in FIG. 23) thereby ends.

Next is a description of the processing performed by the acquisition unit 420 in the case where the voltage of the first connected energy storage unit group is between the highest and lowest voltages of the unconnected energy storage unit group (S510 in FIG. 23).

Figure 35:
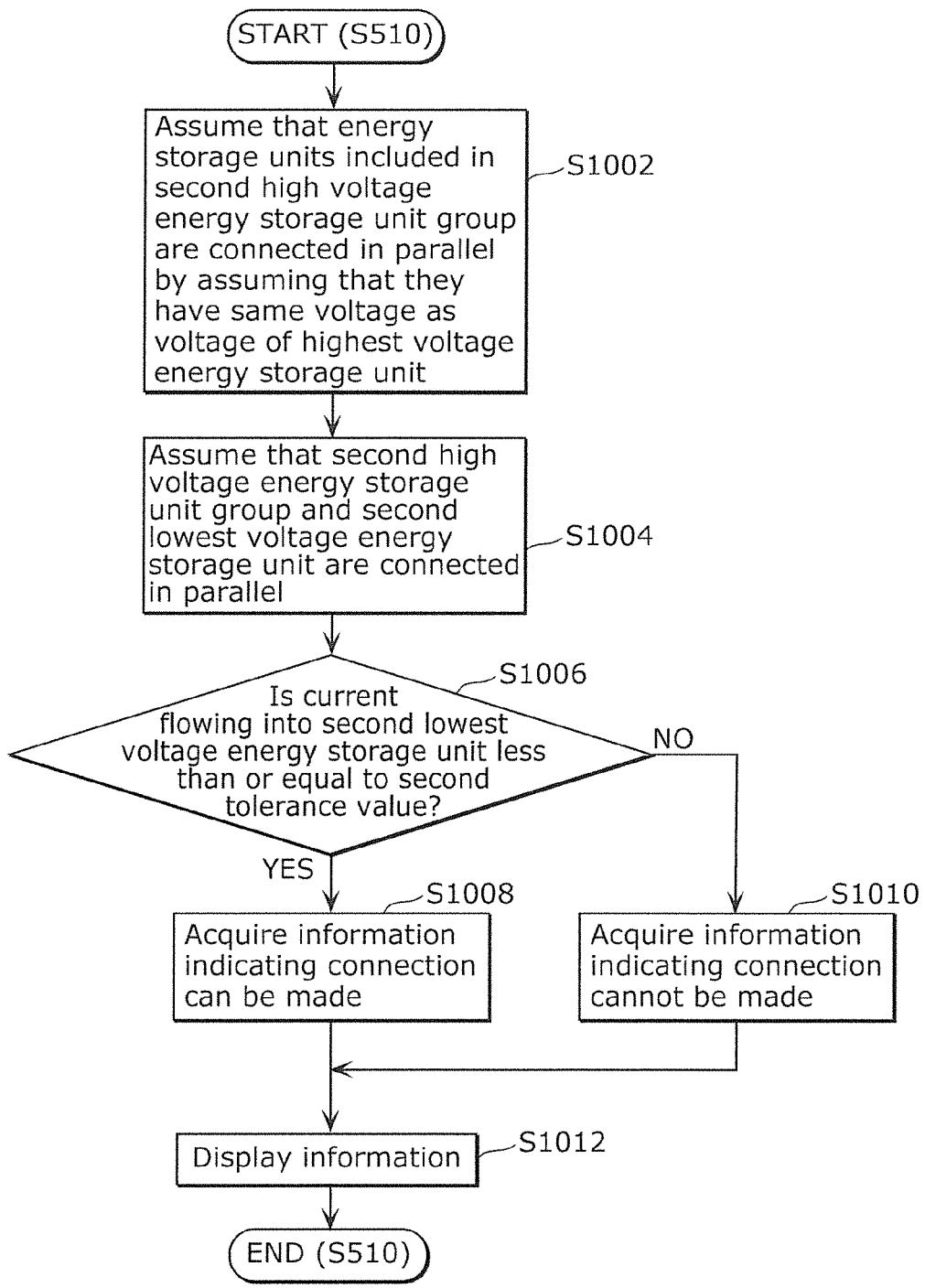
FIG. 35 is a flowchart illustrating an example of processing performed by the acquisition unit according to Embodiment 2 of the present invention in the case where the voltage of a first connected energy storage unit group is between the highest and lowest voltages of the unconnected energy storage unit group.
Figure 36:
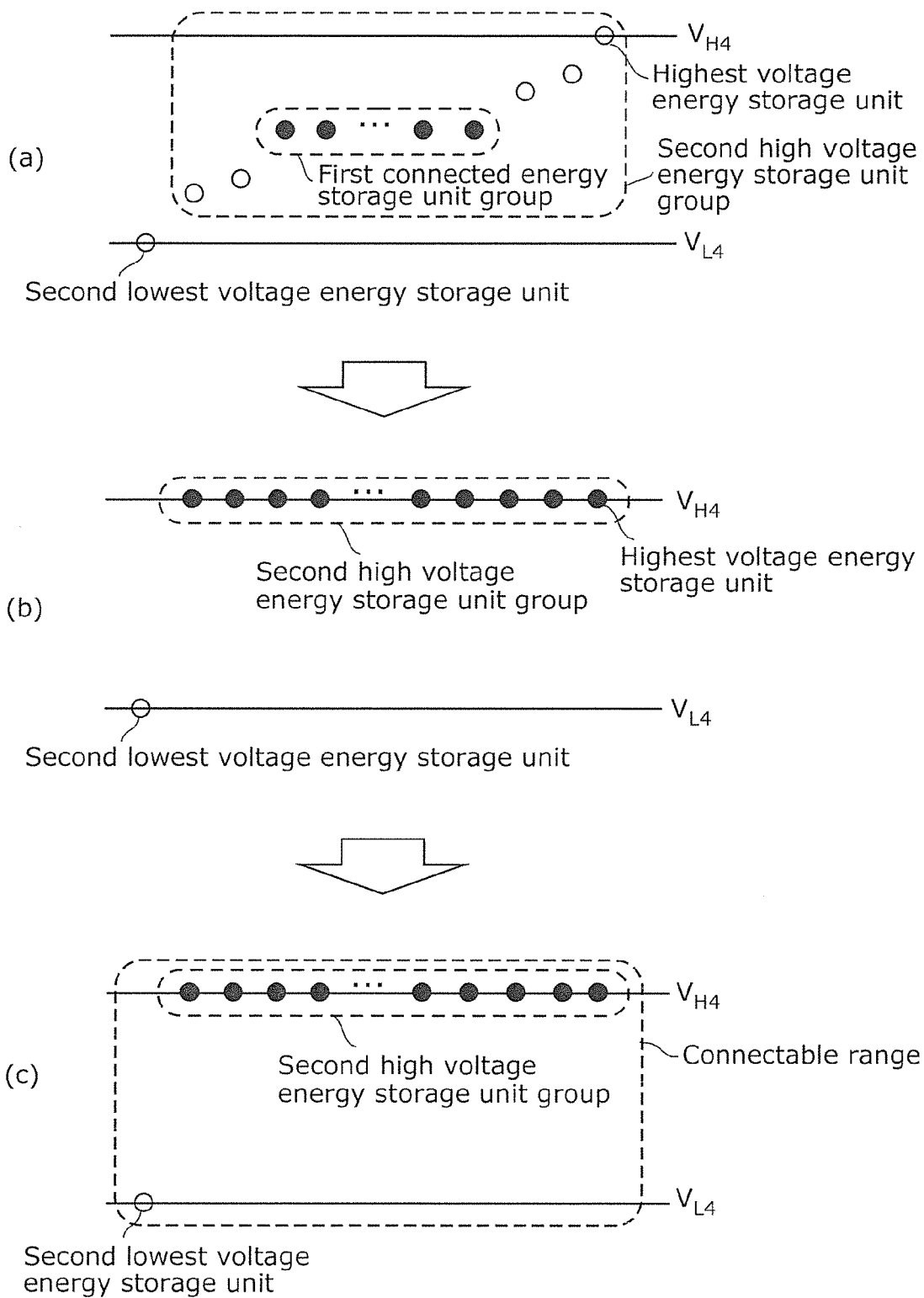
FIGS. 36a-c are diagrams illustrating the processing performed by the acquisition unit according to Embodiment 2 of the present invention in the case where the voltage of a first connected energy storage unit group is between the highest and lowest voltages of the unconnected energy storage unit group.

FIG. 35 is a flowchart illustrating processing performed by the acquisition unit 420 in the case where the voltage of the first connected energy storage unit group is between the highest and lowest voltages of the unconnected energy storage unit group according to Embodiment 2 of the present invention. FIG. 36 is a diagram illustrating the processing performed by the acquisition unit 420 in the case where the voltage of the first connected energy storage unit group is between the highest and lowest voltages of the unconnected energy storage unit group according to Embodiment 2 of the present invention.

As shown in FIG. 35, first, the tolerance value determining unit 422 makes an assumption that the energy storage units 200 included in the second high voltage energy storage unit group are connected in parallel by assuming that they have the same voltage as the voltage of the highest voltage energy storage unit (S1002).

To be specific, as shown in (a) of FIG. 36, an energy storage unit having the lowest voltage among the plurality of energy storage units 200 is defined as a second lowest voltage energy storage unit, and the energy storage units 200 in the plurality of energy storage units 200 other than the second lowest voltage energy storage unit are defined as a second high voltage energy storage unit group. Then, as shown in (b) of FIG. 36, the tolerance value determining unit 422 makes an assumption that all energy storage units 200 included in the second high voltage energy storage unit group are connected in parallel by assuming that they have a voltage $V_{H4}$ that is the voltage of the highest voltage energy storage unit.

Returning to FIG. 35, furthermore, the tolerance value determining unit 422 makes an assumption that the second high voltage energy storage unit group and the second lowest voltage energy storage unit are connected in parallel (S1004).

Then, the tolerance value determining unit 422 determines whether or not the current flowing into the second lowest voltage energy storage unit (charge current) has a value less than or equal to the second tolerance value (S1006). The reason that it is preferable to compare the charge current with the second tolerance value, which is a tolerance value for charge current, is as described above with reference to FIG. 34. Also, the tolerance value determining unit 422 can calculate the charge current (cross current) with the use of, for example, Equation 5.

Next, if the tolerance value determining unit 422 determines that the current flowing into the second lowest voltage energy storage unit has a value less than or equal to the second tolerance value (YES in S1006), the connectable range determining unit 423 designates a plurality of energy storage units 200 being composed of the second high voltage energy storage unit group and the second lowest voltage energy storage unit, as the connectable range. The connectable range acquiring unit 421 thereby acquires the connectable range as information indicating that the plurality of energy storage units 200 can be connected in parallel (S1008).

To be specific, as shown in (c) of FIG. 36, the connectable range determining unit 423 determines that the second lowest voltage energy storage unit can be connected to the second high voltage energy storage unit group, and designates a range including the second lowest voltage energy storage unit and the second high voltage energy storage unit group as the connectable range.

Returning to FIG. 35, if the tolerance value determining unit 422 determines that the current flowing into the second lowest voltage energy storage unit has a value greater than the second tolerance value (NO in S1006), the connectable range determining unit 423 determines that the energy storage units included in the unconnected energy storage unit group cannot be connected in parallel to the first connected energy storage unit group. The connectable range acquiring unit 421 thereby acquires information indicating that the parallel connection is not possible (S1010). Then, the connectable range acquiring unit 421 outputs the acquired connectable range (including the information indicating that parallel connection is not possible) to the display unit 430.

Next, the display unit 430 causes the display screen 450 to display the connectable range as information for connecting in parallel the energy storage units 200 in the connectable range (S1012). Details of the processing for causing the display screen 450 to display the connectable range performed by the display unit 430 are as described above.

The processing performed by the acquisition unit 420 in the case where the voltage of the first connected energy storage unit group is between the highest and lowest voltages of the unconnected energy storage unit group (S510 in FIG. 23) thereby ends.

As described above, with the connection information acquiring apparatus 400 according to Embodiment 2 of the present invention, by determining the magnitude relationship between the voltage of the unconnected energy storage unit group and the voltage of the first connected energy storage unit group, information for preventing an excessive amount of cross current from flowing when the first connected energy storage unit group and the energy storage units 200 included in the unconnected energy storage unit group are connected in parallel can be acquired. Accordingly, it is possible to, by using the information, prevent an excessive amount of cross current from flowing when a plurality of energy storage units 200 are connected in parallel.

Also, the connection information acquiring apparatus 400 acquires a connectable range in which parallel connection is possible without performing charge or discharge if it is determined that the voltage of the unconnected energy storage unit group is higher than the voltage of the first connected energy storage unit group. Accordingly, by connecting a plurality of energy storage units 200 in the connectable range in parallel, it is possible to prevent an excessive amount of cross current from flowing through the energy storage units.

Also, the connection information acquiring apparatus 400 acquires information for charging the second connected energy storage unit group such that another energy storage unit can be connected in parallel to the second connected energy storage unit group. Accordingly, by charging the second connected energy storage unit group by using the information, it is possible to prevent an excessive amount of cross current from flowing when a plurality of energy storage units 200 are connected in parallel.

Also, the connectable range acquiring unit 421 acquires the connectable range again after the second connected energy storage unit group has been charged, and it is therefore possible to further acquire information for preventing an excessive amount of cross current from flowing when a plurality of energy storage units 200 are connected in parallel.

Also, when the energy storage units 200 included in the first high voltage energy storage unit group are connected in parallel by assuming that they have the same voltage as the voltage of the first connected energy storage unit group, and the first high voltage energy storage unit group and the first lowest voltage energy storage unit are connected in parallel, the cross current flowing between the first high voltage energy storage unit group and the first lowest voltage energy storage unit takes the greatest value. Also, the current flowing into the first lowest voltage energy storage unit takes a greater value than the current flowing from each of the energy storage units 200 included in the first high voltage energy storage unit group. Accordingly, the connectable range acquiring unit 421 can acquire the connectable range by, if it determines that the current flowing into the first lowest voltage energy storage unit has a value less than or equal to the first tolerance value, acquiring information indicating that the energy storage units can be connected in parallel.

Also, in the case where the current flowing into the first lowest voltage energy storage unit has a value greater than the first tolerance value, if the first connected energy storage unit group and the energy storage units 200 included in the unconnected energy storage unit group are connected in parallel, an excessive amount of cross current flows between the energy storage units when they are connected in parallel. For this reason, the acquisition unit 420 can perform processing such as alerting the user not to connect the first connected energy storage unit group and the energy storage units 200 included in the unconnected energy storage unit group by acquiring information indicating that they cannot be connected in parallel.

Also, when the energy storage units 200 included in the second high voltage energy storage unit group are connected in parallel by assuming that they have the same voltage as the voltage of the highest voltage energy storage unit, and the second high voltage energy storage unit group and the second lowest voltage energy storage unit are connected in parallel, the cross current flowing between the second high voltage energy storage unit group and the second lowest voltage energy storage unit takes the greatest value. Also, the current flowing into the second lowest voltage energy storage unit takes a greater value than the current flowing from each of the energy storage units 200 included in the second high voltage energy storage unit group. Accordingly, the acquisition unit 420 can acquire the connectable range by, if it determines that the current flowing into the second lowest voltage energy storage unit has a value less than or equal to the second tolerance value, acquiring information indicating that the energy storage units can be connected in parallel.

Also, in the case where the current flowing into the second lowest voltage energy storage unit has a value greater than the second tolerance value, if the first connected energy storage unit group and the energy storage units 200 included in the unconnected energy storage unit group are connected in parallel, an excessive amount of cross current flows between the energy storage units when they are connected in parallel. For this reason, the acquisition unit 420 can perform processing such as alerting the user not to connect the first connected energy storage unit group and the energy storage units 200 included in the unconnected energy storage unit group by acquiring information indicating that they cannot be connected in parallel.

Variation of Embodiment 2

A variation of Embodiment 2 will be described next. In Embodiment 2 described above, the connectable range acquiring unit 421 is configured to designate and acquire the connectable range by determining whether or not the current flowing between the energy storage units 200 has a value less than or equal to a tolerance value. However, in the present variation, the connectable range acquiring unit 421 is configured to designate and acquire the connectable range by determining whether or not the potential difference between energy storage units 200 is less than or equal to a tolerance value.

Figure 37:
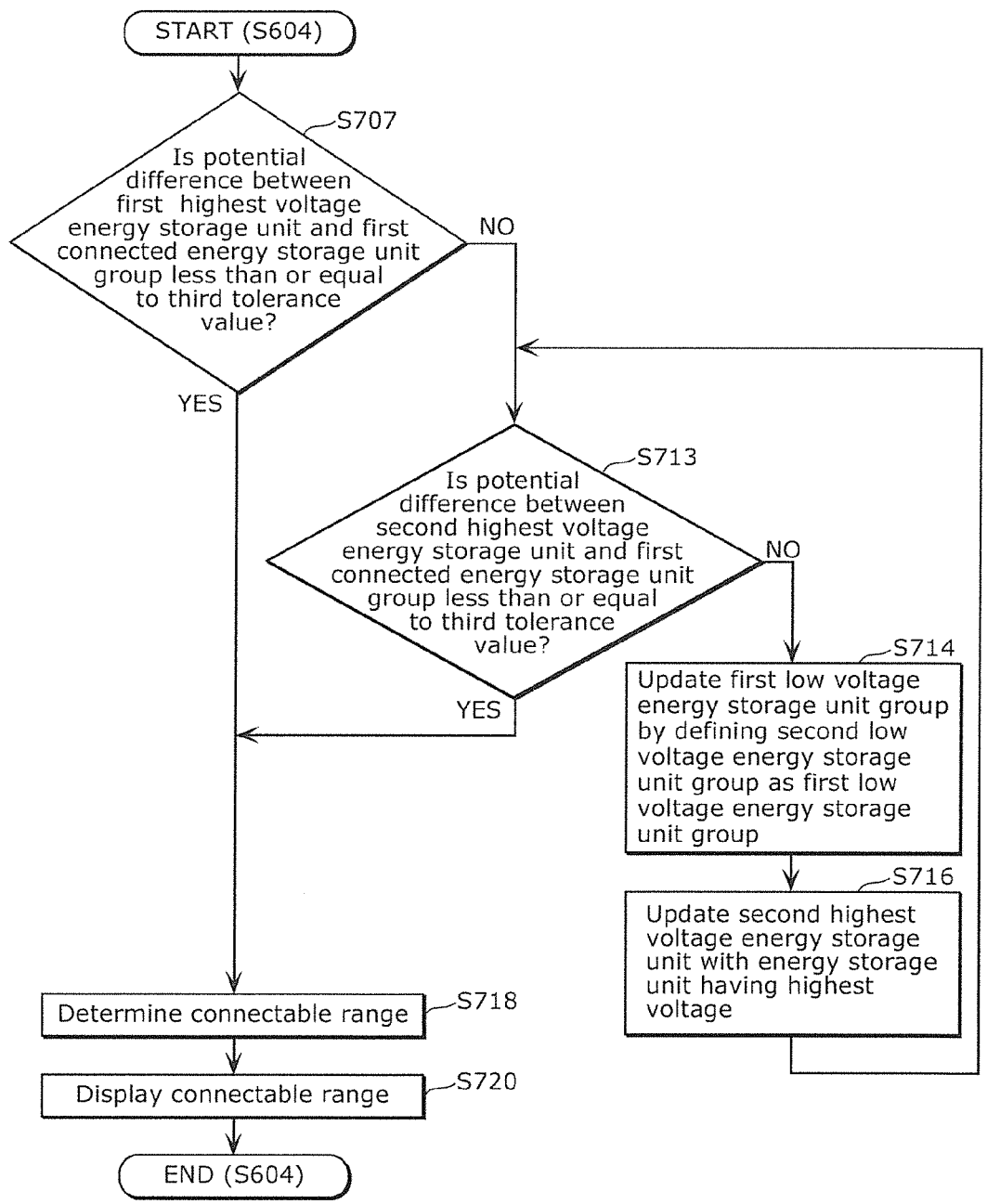
FIG. 37 is a flowchart illustrating an example of processing for acquiring a connectable range performed by a connectable range acquiring unit according to a variation of Embodiment 2 of the present invention.
Figure 38:
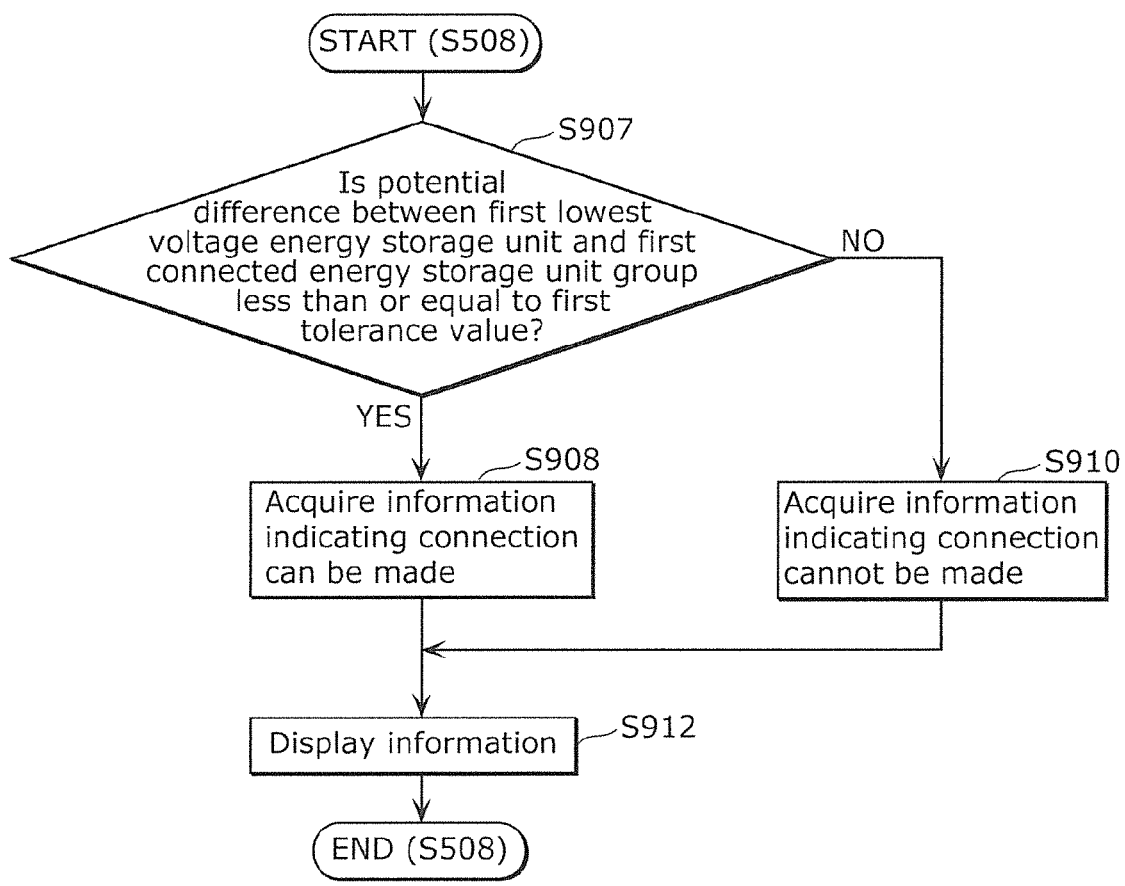
FIG. 38 is a flowchart illustrating an example of processing performed by an acquisition unit according to a variation of Embodiment 2 of the present invention in the case where the voltage of an unconnected energy storage unit group is lower.
Figure 39:
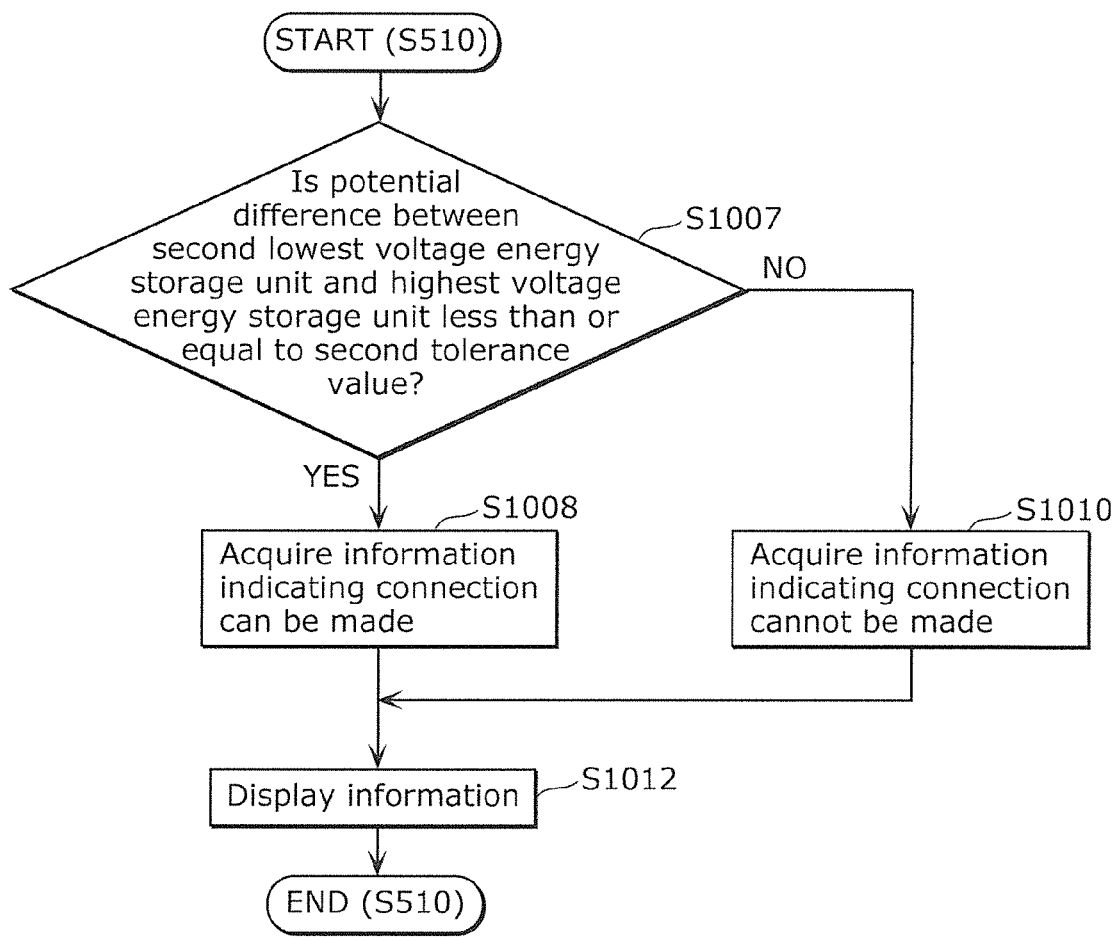
FIG. 39 is a flowchart illustrating an example of processing performed by the acquisition unit according to the variation of Embodiment 2 of the present invention in the case where the voltage of a first connected energy storage unit group is between the highest and lowest voltages of the unconnected energy storage unit group.

In the present variation, instead of the processing of Embodiment 2 shown in FIGS. 26, 32 and 35, processing shown in FIGS. 37, 38 and 39 is performed. FIG. 37 is a flowchart illustrating an example of processing for acquiring a connectable range performed by a connectable range acquiring unit 421 according to the variation of Embodiment 2 of the present invention (S604 in FIG. 24). FIG. 38 is a flowchart illustrating an example of processing performed by an acquisition unit 420 according to the variation of Embodiment 2 of the present invention in the case where the voltage of the unconnected energy storage unit group is lower (S508 in FIG. 23). FIG. 39 is a flowchart illustrating an example of processing performed by the acquisition unit 420 according to the variation of Embodiment 2 of the present invention in the case where the voltage of the first connected energy storage unit group is between the highest and lowest voltages of the unconnected energy storage unit group (S510 in FIG. 23).

As shown in these diagrams, the connectable range acquiring unit 421 acquires a range of energy storage units 200 in which the potential difference between the plurality of energy storage units 200 is less than or equal to a tolerance value as the connectable range. The following description is given focusing on processing that is different from the processing of Embodiment 2 shown in FIGS. 26, 32 and 35.

First, in the case where the determiner unit 410 determines that the voltage of the unconnected energy storage unit group is higher than the voltage of the first connected energy storage unit group, as shown in FIG. 37, the connectable range acquiring unit 421 determines whether or not the potential difference between the first highest voltage energy storage unit and the first connected energy storage unit group is less than or equal to a third tolerance value (S707).

The third tolerance value as used in the present variation refers to the tolerance value for the potential difference between two energy storage units 200. The third tolerance value is stored in the tolerance value data 441 as shown in FIG. 21, and the connectable range acquiring unit 421 determines whether or not the potential difference between the first highest voltage energy storage unit and the first connected energy storage unit group is less than or equal to the third tolerance value by acquiring the third tolerance value from the tolerance value data 441.

Then, if the connectable range acquiring unit 421 determines that the potential difference between the first highest voltage energy storage unit and the first connected energy storage unit group is less than or equal to the third tolerance value (YES in S707), then it designates a plurality of energy storage units 200 being composed of the first highest voltage energy storage unit and the first low voltage energy storage unit group, as the connectable range (S718).

If, on the other hand, the connectable range acquiring unit 421 determines that the potential difference between the first highest voltage energy storage unit and the first connected energy storage unit group is greater than the third tolerance value (NO in S707), then it determines whether or not the potential difference between the second highest voltage energy storage unit and the first connected energy storage unit group is less than or equal to the third tolerance value (S713).

Then, if the connectable range acquiring unit 421 determines that the potential difference between the second highest voltage energy storage unit and the first connected energy storage unit group is less than or equal to the third tolerance value (YES in S713), then it designates the first low voltage energy storage unit group as the connectable range (S718).

If, on the other hand, the connectable range acquiring unit 421 determines that the potential difference between the second highest voltage energy storage unit and the first connected energy storage unit group is greater than the third tolerance value (NO in S713), then it updates the first low voltage energy storage unit group by defining a second low voltage energy storage unit group as the first low voltage energy storage unit group, the second low voltage energy storage unit group being a group of energy storage units in the first low voltage energy storage unit group other than the second highest voltage energy storage unit (S714). Also, the connectable range acquiring unit 421 updates the second highest voltage energy storage unit with an energy storage unit having the highest voltage in the first low voltage energy storage unit group (S716).

Then, the connectable range acquiring unit 421 determines again whether or not the potential difference between the updated second highest voltage energy storage unit and the first connected energy storage unit group is less than or equal to the third tolerance value (S713).

In the case where the determiner unit 410 determines that the voltage of the unconnected energy storage unit group is lower than the voltage of the first connected energy storage unit group, as shown in FIG. 38, the connectable range acquiring unit 421 determines whether or not the potential difference between the first lowest voltage energy storage unit and the first connected energy storage unit group is less than or equal to a first tolerance value (S907).

The first tolerance value as used in the present variation refers to the tolerance value for the potential difference between two energy storage units 200. The first tolerance value is stored in the tolerance value data 441 as shown in FIG. 21, and the connectable range acquiring unit 421 determines whether or not the potential difference between the first lowest voltage energy storage unit and the first connected energy storage unit group is less than or equal to the first tolerance value by acquiring the first tolerance value from the tolerance value data 441.

Then, if the connectable range acquiring unit 421 determines that the potential difference between the first lowest voltage energy storage unit and the first connected energy storage unit group is less than or equal to the first tolerance value (YES in S907), then it acquires information indicating that the plurality of energy storage units 200 can be connected in parallel (S908).

If, on the other hand, the connectable range acquiring unit 421 determines that the potential difference between the first lowest voltage energy storage unit and the first connected energy storage unit group is greater than the first tolerance value (NO in S907), then it acquires information indicating that the energy storage units 200 included in the unconnected energy storage unit group cannot be connected to the first connected energy storage unit group (S910).

In the case where the determiner unit 410 determines that the voltage of the first connected energy storage unit group is between the voltage of the second lowest voltage energy storage unit and the voltage of the highest voltage energy storage unit, as shown in FIG. 39, the connectable range acquiring unit 421 determines whether or not the potential difference between the second lowest voltage energy storage unit and the highest voltage energy storage unit in the plurality of energy storage units 200 is less than or equal to a second tolerance value (S1007).

The second tolerance value as used in the present variation refers to the tolerance value for the potential difference between two energy storage units 200. The second tolerance value is stored in the tolerance value data 441 as shown in FIG. 21, and the connectable range acquiring unit 421 determines whether or not the potential difference between the second lowest voltage energy storage unit and the highest voltage energy storage unit is less than or equal to the second tolerance value by acquiring the second tolerance value from the tolerance value data 441.

Then, if the connectable range acquiring unit 421 determines that the potential difference between the second lowest voltage energy storage unit and the highest voltage energy storage unit is less than or equal to the second tolerance value (YES in S1007), it acquires information indicating that the plurality of energy storage units 200 can be connected in parallel (S1008).

If, on the other hand, the connectable range acquiring unit 421 determines that the potential difference between the second lowest voltage energy storage unit and the highest voltage energy storage unit is greater than the second tolerance value (NO in S1007), it acquires information indicating that the energy storage units 200 included in the unconnected energy storage unit group cannot be connected to the first connected energy storage unit group (S1010).

As described above, with the connection information acquiring apparatus 400 according to the present variation, the same effects as those of Embodiment 2 described above can be obtained. That is, in the case where the voltage of the unconnected energy storage unit group is lower than the voltage of the first connected energy storage unit group, the largest cross current flows when the first lowest voltage energy storage unit, which is the energy storage unit 200 having the lowest voltage among the plurality of energy storage units 200, and the first connected energy storage unit group are connected. For this reason, the connectable range acquiring unit 421 can acquire the connectable range by, if it determines that the potential difference between the first lowest voltage energy storage unit and the first connected energy storage unit group is less than or equal to the first tolerance value, acquiring information indicating that the energy storage units 200 can be connected in parallel.

Also, in the case where the potential difference between the first lowest voltage energy storage unit and the first connected energy storage unit group is greater than the first tolerance value, if the first connected energy storage unit group and the energy storage units 200 included in the unconnected energy storage unit group are connected in parallel without performing charge or discharge, an excessive amount of cross current flows between the energy storage units 200 when they are connected in parallel. For this reason, the connectable range acquiring unit 421 can perform processing such as alerting the user not to connect the first connected energy storage unit group and the energy storage units 200 included in the unconnected energy storage unit group by acquiring information indicating that they cannot be connected in parallel.

In the case where the voltage of the first connected energy storage unit group is between the voltage of the second lowest voltage energy storage unit having the lowest voltage and the voltage of the highest voltage energy storage unit having the highest voltage that are included in the unconnected energy storage unit group, the largest cross current flows when the second lowest voltage energy storage unit and the highest voltage energy storage unit are connected. For this reason, the connectable range acquiring unit 421 can acquire the connectable range by, if it determines that the potential difference between the second lowest voltage energy storage unit and the highest voltage energy storage unit is less than or equal to the second tolerance value, acquiring information indicating that the energy storage units can be connected in parallel.

In the case where the potential difference between the second lowest voltage energy storage unit and the highest voltage energy storage unit is greater than the second tolerance value, if the first connected energy storage unit group and the energy storage units included in the unconnected energy storage unit group are connected in parallel without performing charge or discharge, an excessive amount of cross current flows between the energy storage units 200 when they are connected in parallel. For this reason, the connectable range acquiring unit 421 can perform processing such as alerting the user not to connect the first connected energy storage unit group and the energy storage units included in the unconnected energy storage unit group by acquiring information indicating that they cannot be connected in parallel.

In the foregoing, the connection information acquiring apparatus 400 and the energy storage system according to Embodiment 2 of the present invention and the variation thereof have been described, but the present invention is not limited to the embodiment and the variation thereof. That is, the embodiment and the variation thereof disclosed herein should be considered as illustrative in all aspects and not restrictive. The scope of the present invention is indicated by the appended claims rather than by the foregoing description. All variations and modifications falling within the equivalency range of the appended claims are intended to be embraced therein.

For example, in Embodiment 2 given above, in order to connect energy storage units 200 in parallel, the user turns on the breakers 220 included in the energy storage units 200 to be connected, or the energy storage units 200 to be charged are charged (or the energy storage units 200 to be discharged are discharged). However, a configuration is possible in which a plurality of energy storage units 200 are connected in parallel by the connection information acquiring apparatus 400 automatically turning on the breakers 220 included in the energy storage units 200 or charging the energy storage units 200 to be charged (or discharging the energy storage units 200 to be discharged).

Also, in Embodiment 2 given above, the connection information acquiring apparatus 400 includes a determiner unit 410, an acquisition unit 420, a display unit 430, and a memory unit 440, and the acquisition unit 420 includes a connectable range acquiring unit 421 and a charge/discharge information acquiring unit 424. However, as shown in FIG. 40, it is sufficient that the connection information acquiring apparatus includes at least a determiner unit and an acquisition unit.

Figure 40:
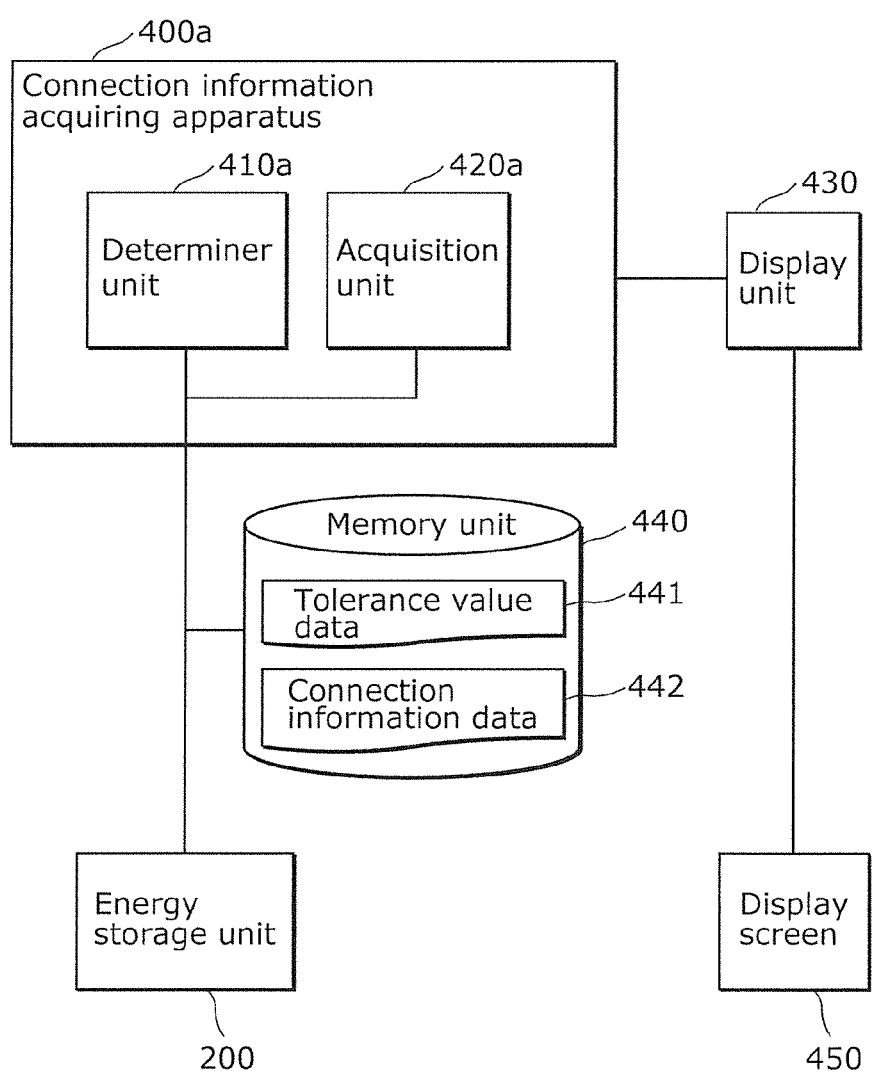
FIG. 40 is a block diagram showing a minimum configuration of the connection information acquiring apparatus according to Embodiment 2 of the present invention.

FIG. 40 is a block diagram showing a minimum configuration of the connection information acquiring apparatus according to Embodiment 2 of the present invention. As shown in the diagram, the connection information acquiring apparatus 400a includes a determiner unit 410a and an acquisition unit 420a that have the same functions as those of Embodiment 2 described above, and acquires information for connecting energy storage units 200 in parallel by exchanging information with a display unit 430 and a memory unit 440 that are provided outside the connection information acquiring apparatus 400a. Also, it is sufficient that the acquisition unit 420a can acquire information for connecting energy storage units 200 in parallel, and thus the acquisition unit 420a does not need to necessarily include a connectable range acquiring unit 421 and a charge/discharge information acquiring unit 424 as in Embodiment 2 described above.

Figure 41:
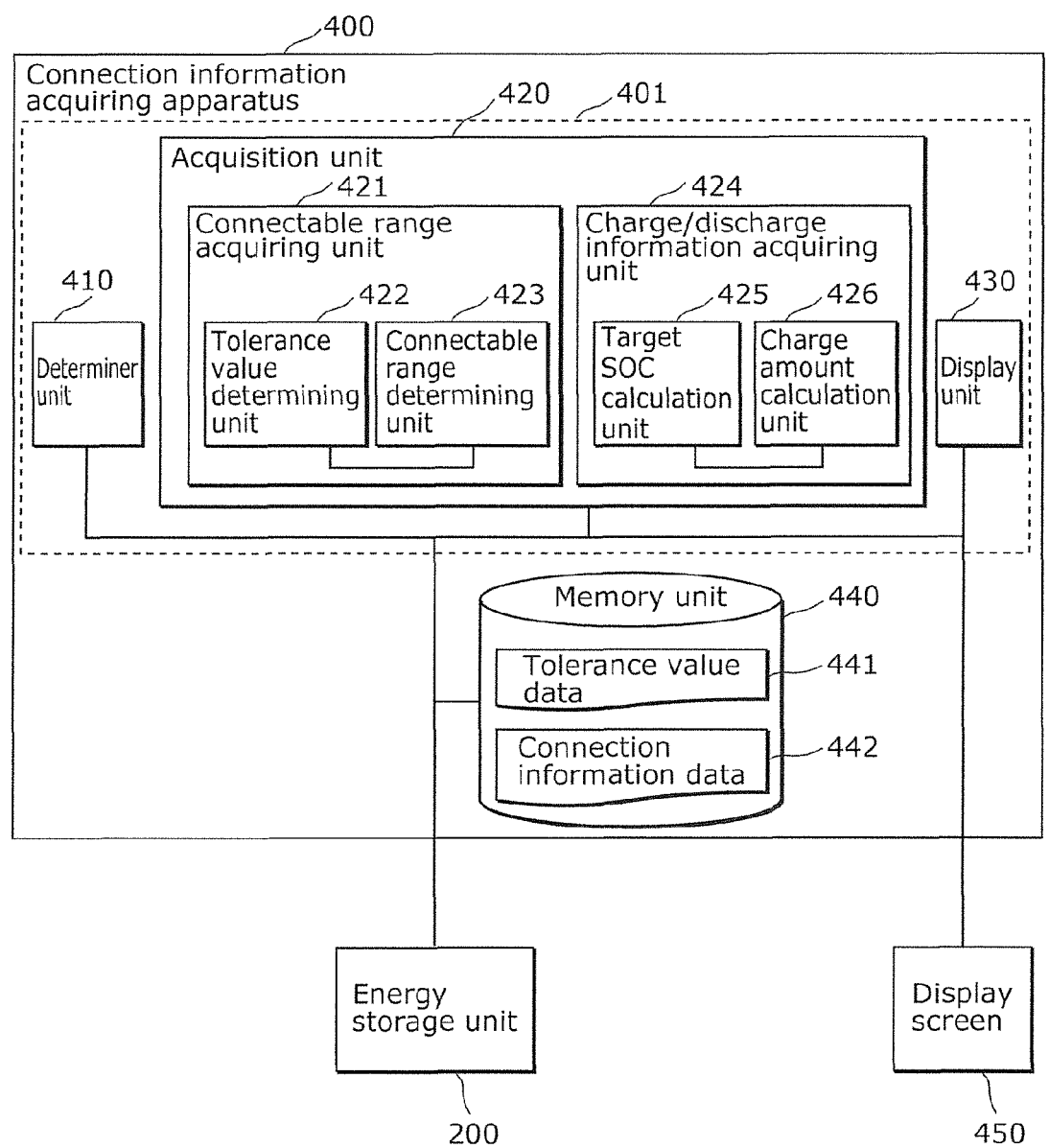
FIG. 41 is a block diagram showing a configuration that implements the connection information acquiring apparatus according to Embodiment 2 of the present invention with the use of an integrated circuit.

The processing units provided in the connection information acquiring apparatus 400 according to Embodiment 2 of the present invention are typically implemented as an LSI (Large Scale Integration) that is an integrated circuit. That is, as shown in FIG. 41, the present invention is implemented as an integrated circuit 401 including a determiner unit 410, an acquisition unit 420, and the like. FIG. 41 is a block diagram showing a configuration that implements the connection information acquiring apparatus 400 according to Embodiment 2 of the present invention with the use of an integrated circuit.

Also, the processing units provided in the integrated circuit 101 of Embodiment 1 or in the integrated circuit 401 of Embodiment 2 may be individual chips, or may be partially or wholly integrated into a single chip. While the above has been discussed using an LSI, the LSI may be called an IC, a system LSI, a super LSI, or an ultra LSI according to the degree of integration.

The method for implementing an integrated circuit is not limited to an LSI, and the integration circuit may be implemented by a dedicated circuit or a general-purpose processor. It is also possible to use an FPGA (Field Programmable Gate Array) that can be programmed after LSI production or a reconfigurable processor that enables reconfiguration of the connection and setting of circuit cells in the LSI.

Furthermore, if a technique for implementing an integrated circuit that can replace LSIs appears by another technique resulting from the progress or derivation of semiconductor technology, the functional blocks may of course be integrated by using that technique. Application of biotechnology or the like is possible.

Also, the present invention can be implemented not only as the connection information acquiring apparatus 100 or 400 as described above, but also as a connection information acquiring method including characteristic processing performed by the connection information acquiring apparatus 100 or 400 in the form of steps.

Furthermore, the present invention may be implemented as a computer program that causes a computer to execute the characteristic processing of the connection information acquiring method, or may be implemented as a computer-readable non-transitory recording medium such as a flexible disk, hard disk, CD-ROM, MO, DVD, DVD-ROM, DVD-RAM, BD (Blu-ray Disc®) or semiconductor memory in which the program is recorded. Needless to say, such a program can be distributed via recording media such as CD-ROMs or transmission media such as the Internet.

The invention claimed is:

1. An energy storage unit connection information acquiring apparatus that acquires information for connecting a plurality of energy storage units in parallel, each energy storage unit including one or more energy storage elements connected in series, the connection information acquiring apparatus comprising:
a connectable range acquiring unit configured to acquire a connectable range by determining the connectable range, the connectable range being a range of energy storage units that can be connected in parallel among the plurality of energy storage units; and
a charge/discharge information acquiring unit configured to acquire information for charging or discharging a connected energy storage unit group such that at least one energy storage unit outside the connectable range can be connected in parallel to the connected energy storage unit group, the connected energy storage unit group being composed of the energy storage units in the connectable range that are connected in parallel.

2. The connection information acquiring apparatus according to claim 1,
wherein the charge/discharge information acquiring unit is configured to:
when the energy storage units included in the connected energy storage unit group have a voltage lower than a voltage of the at least one energy storage unit outside the connectable range, acquire information for charging the connected energy storage unit group such that the at least one energy storage unit outside the connectable range can be connected in parallel to the connected energy storage unit group; and
when the energy storage units included in the connected energy storage unit group have a voltage higher than the voltage of the at least one energy storage unit outside the connectable range, acquire information for discharging the connected energy storage unit group such that the at least one energy storage unit outside the connectable range can be connected in parallel to the connected energy storage unit group.

3. The connection information acquiring apparatus according to claim 1,
wherein the connectable range acquiring unit is configured to acquire, as the connectable range, a range of energy storage units that can be connected in parallel and includes a lowest voltage energy storage unit that is an energy storage unit having a lowest voltage among the plurality of energy storage units, and
the charge/discharge information acquiring unit is configured to acquire information for charging the connected energy storage unit group such that the at least one energy storage unit outside the connectable range can be connected in parallel to the connected energy storage unit group.

4. The connection information acquiring apparatus according to claim 3,
wherein the connectable range acquiring unit includes:
a tolerance value determining unit configured to determine whether or not a potential difference between a first highest voltage energy storage unit and the lowest voltage energy storage unit is less than or equal to a first tolerance value, the first highest voltage energy storage unit being an energy storage unit having a highest voltage among the plurality of energy storage units; and
a connectable range determining unit configured to, when it is determined that the potential difference between the first highest voltage energy storage unit and the lowest voltage energy storage unit is less than or equal to the first tolerance value, determine the plurality of energy storage units as the connectable range.

5. The connection information acquiring apparatus according to claim 4,
wherein the tolerance value determining unit is configured to, when it determines that the potential difference between the first highest voltage energy storage unit and the lowest voltage energy storage unit is greater than the first tolerance value, determine whether or not a potential difference between a second highest voltage energy storage unit and the lowest voltage energy storage unit is less than or equal to the first tolerance value, the second highest voltage energy storage unit being an energy storage unit having the highest voltage in a first low voltage energy storage unit group, and the first low voltage energy storage unit group being composed of energy storage units other than the first highest voltage energy storage unit in the plurality of energy storage units, the connectable range determining unit is configured to, when it is determined that the potential difference between the second highest voltage energy storage unit and the lowest voltage energy storage unit is less than or equal to the first tolerance value, determine the first low voltage energy storage unit group as the connectable range, and the tolerance value determining unit is configured to, when it determines that the potential difference between the second highest voltage energy storage unit and the lowest voltage energy storage unit is greater than the first tolerance value, update the first low voltage energy storage unit group by defining a second low voltage energy storage unit group as the first low voltage energy storage unit group, update the second highest voltage energy storage unit with an energy storage unit having the highest voltage in the first low voltage energy storage unit group, and determine whether or not the potential difference between the second highest voltage energy storage unit and the lowest voltage energy storage unit is less than or equal to the first tolerance value, the second low voltage energy storage unit group being composed of energy storage units other than the second highest voltage energy storage unit in the first low voltage energy storage unit group.

6. The connection information acquiring apparatus according to claim 3, wherein the charge/discharge information acquiring unit is configured to acquire information for charging the connected energy storage unit group such that the voltage of the connected energy storage unit group falls within a voltage range allowed for parallel connection of an outlying lowest voltage energy storage unit to the connected energy storage unit group, the outlying lowest voltage energy storage unit being an energy storage unit having the lowest voltage among the at least one energy storage unit outside the connectable range.

7. The connection information acquiring apparatus according to claim 6, wherein the charge/discharge information acquiring unit includes:

a target SOC calculation unit configured to acquire a state of charge (SOC) of the connected energy storage unit group and an SOC of the outlying lowest voltage energy storage unit, and calculate a target SOC such that the target SOC is less than or equal to the SOC of the outlying lowest voltage energy storage unit and is greater than or equal to a lowest value for the SOC allowed for parallel connection of the outlying lowest voltage energy storage unit to the connected energy storage unit group, the target SOC being a target value for the SOC of the connected energy storage unit group; and a charge amount calculation unit configured to calculate an amount of charge for charging the connected energy storage unit group such that the SOC of the connected energy storage unit group matches the target SOC.

8. The connection information acquiring apparatus according to claim 6, wherein the connectable range acquiring unit is further configured to, when the voltage of the connected energy storage unit group after being charged is higher than a voltage at which connection to the outlying lowest voltage energy storage unit can be made, acquire information indicating that the outlying lowest voltage energy storage unit cannot be connected to the connected energy storage unit group.

9. The connection information acquiring apparatus according to claim 1, wherein the connectable range acquiring unit is further configured to acquire, as the connectable range, a range of energy storage units that can be connected in parallel and includes the connected energy storage unit group after being charged or discharged among the plurality of energy storage units.

10. The connection information acquiring apparatus according to claim 1, wherein the connectable range acquiring unit is further configured to:

determine whether or not a potential difference between two energy storage units out of the plurality of energy storage units is less than or equal to a second tolerance value, the second tolerance value being the potential difference between the two energy storage units when a current flowing from one of the two energy storage units into the other energy storage unit is allowable on an assumption that the two energy storage units are connected in parallel; and when it determines that the potential difference between the two energy storage units is less than or equal to the second tolerance value, determine that the two energy storage units can be connected in parallel.

11. The connection information acquiring apparatus according to claim 1, further comprising a determiner unit configured to determine a magnitude relationship between a voltage of a first connected energy storage unit group and a voltage of an unconnected energy storage unit group, the first connected energy storage unit group being composed of energy storage units that are connected in parallel among a plurality of energy storage units included in the connected energy storage unit group, and the unconnected energy storage unit group being composed of energy storage units that are not included in the first connected energy storage unit group, wherein the connectable range acquiring unit is configured to acquire the connectable range by acquiring information for connecting in parallel the first connected energy storage unit group and the energy storage units included in the unconnected energy storage unit group based on a result of determination performed by the determiner unit.

12. The connection information acquiring apparatus according to claim 11, wherein the connectable range acquiring unit is configured to, when the determiner unit determines that the voltage of the unconnected energy storage unit group is higher than the voltage of the first connected energy storage unit group, acquire a range of energy storage units that can be connected in parallel and includes the first connected energy storage unit group as the connectable range.

13. The connection information acquiring apparatus according to claim 12, wherein the charge/discharge information acquiring unit is configured to acquire information for charging a second connected energy storage unit group such that at least one energy storage unit outside the connectable range can be connected in parallel to the second connected energy storage unit group, the second connected energy storage unit group being composed of energy storage units in the connectable range that are connected in parallel, and being defined as the connected energy storage unit group.

14. The connection information acquiring apparatus according to claim 13,
wherein the connectable range acquiring unit is further configured to acquire, as the connectable range, a range of energy storage units that can be connected in parallel and includes the second connected energy storage unit group after being charged among the plurality of energy storage units.

15. The connection information acquiring apparatus according to claim 11,
wherein the connectable range acquiring unit is configured to:
when the determiner unit determines that the voltage of the unconnected energy storage unit group is lower than the voltage of the first connected energy storage unit group, determine whether or not a potential difference between a first lowest voltage energy storage unit and the first connected energy storage unit group is less than or equal to a first tolerance value, the first lowest voltage energy storage unit being an energy storage unit having a lowest voltage among the plurality of energy storage units; and
when it determines that the potential difference between the first lowest voltage energy storage unit and the first connected energy storage unit group is less than or equal to the first tolerance value,
acquire information indicating that the plurality of energy storage units can be connected in parallel.

16. The connection information acquiring apparatus according to claim 15,
wherein the connectable range acquiring unit is further configured to, when it determines that the potential difference between the first lowest voltage energy storage unit and the first connected energy storage unit group is greater than the first tolerance value, acquire information indicating that the energy storage units included in the unconnected energy storage unit group cannot be connected to the first connected energy storage unit group.

17. The connection information acquiring apparatus according to claim 11,
wherein the connectable range acquiring unit is configured to:
when the determiner unit determines that the voltage of the first connected energy storage unit group is between a voltage of a second lowest voltage energy storage unit having a lowest voltage and a voltage of a highest voltage energy storage unit having a highest voltage that are included in the unconnected energy storage unit group, determine whether or not a potential difference between the second lowest voltage energy storage unit and the highest voltage energy storage unit in the plurality of energy storage unit is less than or equal to a second tolerance value; and
when it determines that the potential difference between the second lowest voltage energy storage unit and the highest voltage energy storage unit is less than or equal to the second tolerance value,
acquire information indicating that the plurality of energy storage units can be connected in parallel.

18. The connection information acquiring apparatus according to claim 17,
wherein the connectable range acquiring unit is further configured to, when it determines that the potential difference between the second lowest voltage energy storage unit and the highest voltage energy storage unit is greater than the second tolerance value, acquire information indicating that the energy storage units included in the unconnected energy storage unit group cannot be connected to the first connected energy storage unit group.

19. An energy storage unit connection information acquiring apparatus that acquires information for connecting a plurality of energy storage units in parallel, each energy storage unit including one or more energy storage elements connected in series, the connection information acquiring apparatus comprising:
a connectable range acquiring unit configured to acquire a connectable range by determining the connectable range, the connectable range being a range of energy storage units that can be connected in parallel among the plurality of energy storage units; and
a charge/discharge information acquiring unit configured to acquire information for charging or discharging a connected energy storage unit group such that at least one energy storage unit outside the connectable range can be connected in parallel to the connected energy storage unit group, the connected energy storage unit group being composed of the energy storage units in the connectable range that are connected in parallel,
wherein the connectable range acquiring unit is configured to acquire, as the connectable range, a range of energy storage units in which a potential difference between the plurality of energy storage units is less than or equal to a tolerance value,
the charge/discharge information acquiring unit is configured to acquire information for charging or discharging the connected energy storage unit group such that a voltage of the connected energy storage unit group falls within a voltage range allowed for parallel connection of the at least one energy storage unit outside the connectable range to the connected energy storage unit group, and
the connectable range acquiring unit is further configured to acquire, as the connectable range, a range of energy storage units that can be connected in parallel and includes the connected energy storage unit group after being charged or discharged among the plurality of energy storage units.

* * * * *